United States Patent
Jung et al.

(10) Patent No.: US 9,559,310 B2
(45) Date of Patent: Jan. 31, 2017

(54) COMPOUND WITH ELECTRON INJECTION AND/OR ELECTRON TRANSPORT CAPABILITIES AND ORGANIC LIGHT-EMITTING DEVICE INCLUDING THE SAME

(71) Applicant: Samsung Display Co., Ltd., Yongin (KR)

(72) Inventors: Hye-Jin Jung, Yongin (KR); Seok-Hwan Hwang, Yongin (KR); Young-Kook Kim, Yongin (KR); Jin-O Lim, Yongin (KR); Sang-Hyun Han, Yongin (KR); Eun-Jae Jeong, Yongin (KR); Soo-Yon Kim, Yongin (KR); Jun-Ha Park, Yongin (KR); Eun-Young Lee, Yongin (KR); Chang-Ho Lee, Yongin (KR); Jong-Hyuk Lee, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 224 days.

(21) Appl. No.: 13/924,483

(22) Filed: Jun. 21, 2013

(65) Prior Publication Data

US 2014/0014925 A1 Jan. 16, 2014

(30) Foreign Application Priority Data

Jul. 11, 2012 (KR) .................. 10-2012-0075745
Feb. 18, 2013 (KR) .................. 10-2013-0016979

(51) Int. Cl.
*H01L 51/50* (2006.01)
*H01L 51/00* (2006.01)

(52) U.S. Cl.
CPC ....... *H01L 51/0054* (2013.01); *H01L 51/0071* (2013.01); *H01L 51/0072* (2013.01); *H01L 51/0073* (2013.01); *H01L 51/0074* (2013.01); *H01L 51/0058* (2013.01); *H01L 51/0062* (2013.01); *H01L 51/0067* (2013.01); *H01L 51/5072* (2013.01)

(58) Field of Classification Search
CPC ............. H01L 51/0054; H01L 51/0067; H01L 51/0071
See application file for complete search history.

(56) References Cited

U.S. PATENT DOCUMENTS

| | | | |
|---|---|---|---|
| 5,635,308 A | 6/1997 | Inoue et al. | |
| 5,972,247 A | 10/1999 | Shi et al. | |
| 6,465,115 B2 | 10/2002 | Shi et al. | |
| 6,596,415 B2 | 7/2003 | Shi et al. | |
| 7,833,635 B2 * | 11/2010 | Park et al. | 428/690 |
| 7,854,999 B2 | 12/2010 | Park et al. | |
| 7,875,367 B2 | 1/2011 | Park et al. | |
| 7,919,654 B2 * | 4/2011 | Park et al. | 564/426 |
| 2007/0290610 A1 * | 12/2007 | Park | C07C 211/54 313/504 |

FOREIGN PATENT DOCUMENTS

| | | |
|---|---|---|
| JP | 8-12600 A | 1/1996 |
| JP | 10-017860 A | 1/1998 |
| JP | 11-087067 A | 3/1999 |
| JP | 2000-003782 A | 1/2000 |
| KR | 10-2007-0119470 A | 12/2007 |
| KR | 10-2008-0030260 A | 4/2008 |
| KR | 10-2008-0036483 A | 4/2008 |
| KR | 10-2008-0039057 A | 4/2008 |
| KR | 10-2008-0079095 A | 5/2008 |
| KR | 10-2010-0026373 A | 3/2010 |

OTHER PUBLICATIONS

Zaragoza Dorwald, Side Reactions in Organic Synthesis, 2005, WILEY-VCH Verlag GmbH & Co. KGaA, Weinheim, Preface. p. IX.*
Song et al, Tetrahedron Letters, Novel Cyclopenta[def]phenanthrene Based Blue Emitting Oligomers for OLEDs, 2008, 49, pp. 3582-3587.*
Johansson et al., "Solid-State Amplified Spontaneous Emission in Some Spiro-Type Molecules: A New Concept for the Design of Solid-State Lasing Molecules," Adv. Mater. 1998 *10*, No. 14, 1136-1141.
Tao et al., "Sharp green electroluminescence from 1*H*-pyrazolo[3,4-*b*]quinoline-based light-emitting diodes," *Appl. Phys. Lett.*, Sep. 11, 2000, vol. 77, No. 11, 1575-1576.

* cited by examiner

*Primary Examiner* — Paul A Zucker
(74) *Attorney, Agent, or Firm* — Knobbe, Martens, Olson & Bear LLP

(57) ABSTRACT

A compound represented by Formula 1 below and an organic light-emitting device including the compound are provided:

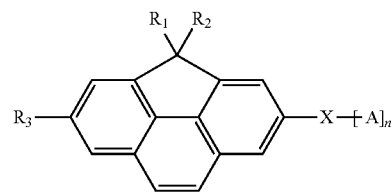

Formula 1

Substituents in Formula 1 are the same as defined in the specification.

20 Claims, 2 Drawing Sheets

COMPOUND WITH ELECTRON INJECTION AND/OR ELECTRON TRANSPORT CAPABILITIES AND ORGANIC LIGHT-EMITTING DEVICE INCLUDING THE SAME

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

This application claims the benefit of Korean Patent Application No. 10-2012-0075745, filed on Jul. 11, 2012, and Korean Patent Application No. 10-2013-0016979, filed on Feb. 18, 2013, in the Korean Intellectual Property Office, the disclosures of which are incorporated herein by reference.

BACKGROUND

Field

One or more embodiments relate to a compound for organic light-emitting devices, and an organic light-emitting device including the compound.

Description of the Related Technology

Organic light-emitting devices (OLEDs), which are self-emitting devices, have advantages such as wide viewing angles, excellent contrast, quick response, high brightness, excellent driving voltage characteristics, and can provide multicolored images.

A typical OLED has a structure including a substrate, and an anode, a hole transport layer (HTL), an emission layer (EML), an electron transport layer (ETL), and a cathode which are sequentially stacked on the substrate. In this regard, the HTL, the EML, and the ETL are organic thin films formed of organic compounds.

An operating principle of an OLED having the above-described structure is as follows.

When a voltage is applied between the anode and the cathode, holes injected from the anode move to the EML via the HTL, and electrons injected from the cathode move to the EML via the ETL. The holes and electrons recombine in the EML to generate excitons. When the excitons drop from an excited state to a ground state, light is emitted.

Conventional light-emitting devices using an organic unimolecular material for an electron transport layer have a short lifetime, poor storage durability, and low reliability. These drawbacks are caused from physical, chemical, photochemical, or electrochemical changes of the organic material, and oxidation, delamination, and poor durability of the anode.

SUMMARY

One or more embodiments include a novel compound for an organic light-emitting device with improved characteristics, and a high-efficiency, low-voltage, high-luminance, and long-lifetime organic light-emitting device including the compound. The novel compound has improved electrical characteristics, good charge transporting capabilities, improved emission capability, and a high glass transition temperatures (Tg) enough to prevent crystallization. The novel compound is suitable as an electron transporting material for fluorescent or phosphorescent device of any color, or as a red, green, blue, or white light-emitting material with higher emission efficiency and longer lifetime as compared with existing host materials. The novel compound also has appropriate color coordinates.

Additional aspects will be set forth in part in the description which follows and, in part, will be apparent from the description, or may be learned by practice of the presented embodiments.

According to one or more embodiments, there is provided a compound with electron injection and/or electron transport capabilities, the compound being represented by Formula 1 below:

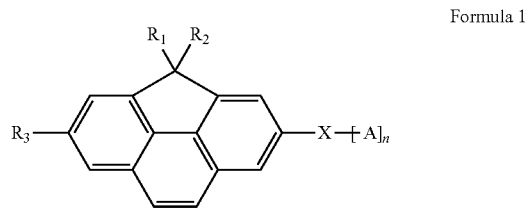

Formula 1 wherein, in Formula 1, $R_1$ and $R_2$ are each independently a halogen group, a cyano group, a substituted or unsubstituted C1-C60 alkyl group, a substituted or unsubstituted C6-C60 aryl group, or a substituted or unsubstituted C3-C60 heteroaryl group;

$R_3$ is a substituted or unsubstituted C6-C60 aryl group, or a substituted or unsubstituted C3-C60 heteroaryl group;

X is a single bond or a substituted or unsubstituted C3-C10 arylene group; and

A is a substituted or unsubstituted C3-C60 heteroaryl group, or a substituted or unsubstituted C6-C60 condensed polycyclic group including N, O, or S; and n is an integer from 1 to 7.

According to one or more embodiments, an organic light-emitting device includes: a first electrode; a second electrode; and an organic layer disposed between the first electrode and the second electrode, the organic layer including the compound of Formula 1 above.

According to one or more embodiments, a flat panel display device includes the above-defined organic light-emitting device, wherein the first electrode of the organic light-emitting device is electrically connected to a source electrode or a drain electrode of a thin-film transistor.

BRIEF DESCRIPTION OF THE DRAWINGS

These and/or other aspects will become apparent and more readily appreciated from the following description of the embodiments, taken in conjunction with the accompanying drawing of which.

DETAILED DESCRIPTION

Figure 1:
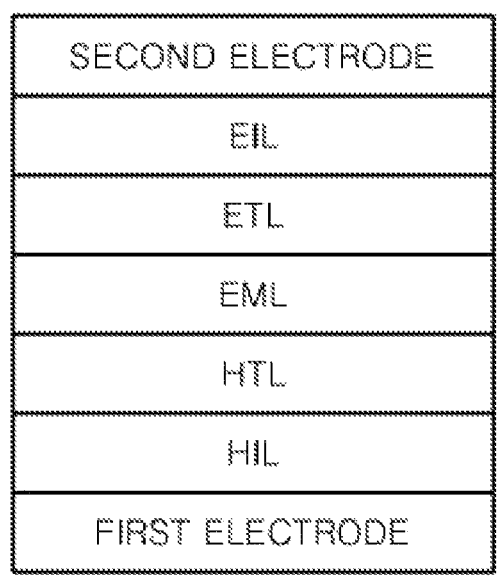
FIG. 1 is a schematic view of a structure of an organic light-emitting device according to an embodiment.

Reference will now be made in detail to embodiments, examples of which are illustrated in the accompanying drawings, wherein like reference numerals refer to the like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

According to an embodiment, there is provided a compound represented by Formula 1 below:

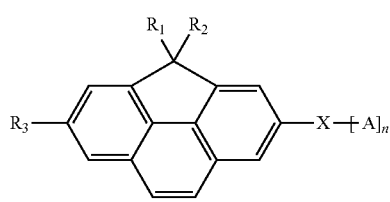

Formula 1

In Formula 1, $R_1$ and $R_2$ are each independently a halogen group, a cyano group, a substituted or unsubstituted $C_1$-$C_{60}$ alkyl group, a substituted or unsubstituted $C_6$-$C_{60}$ aryl group, or a substituted or unsubstituted $C_3$-$C_{60}$ heteroaryl group;

$R_3$ is a substituted or unsubstituted $C_6$-$C_{60}$ aryl group, or a substituted or unsubstituted $C_3$-$C_{60}$ heteroaryl group;

X is a single bond or a substituted or unsubstituted $C_3$-$C_{10}$ arylene group; and A is a substituted or unsubstituted $C_3$-$C_{60}$ heteroaryl group, or a substituted or unsubstituted $C_6$-$C_{60}$ condensed polycyclic group including N, O, or S; and n is an integer from 1 to 7.

With regard to the substituent A in Formula 1, at least one hydrogen atom in the unsubstituted heteroaryl group or the unsubstituted condensed polycyclic group including N, O, or S may be substituted with, for example, substituents for an alkyl group, which will be described later, a substituent (for example, m-terphenyl group) including a plurality of aryl groups and/or heteroaryl groups linked via a single bond, or a 4,4'-(1,3-phenylene)dipyridine group. The substituents for the heteroaryl group or condensed polycyclic group are not limited thereto.

In some embodiments, the compound of Formula 1 may provide a lower driving voltage and a higher efficiency than existing electron injecting or transporting materials. Thus, an organic light-emitting device manufactured using the compound of Formula 1 may have improved lifetime characteristics and a higher power efficiency with reduced power consumption.

In the compound of Formula 1, the substituents $R_3$ and X are arranged in a straight line, which leads to a longer conjugation length, and consequently a high molecular dipole moment. This high dipole moment enables the compound of Formula 1 having both electron transport and/or electron injection capabilities to more rapidly transport electrons, and thus lower a driving voltage of an organic light-emitting device.

The substituents of the compound of Formula 1 now will be described in greater detail.

In some embodiments, X in Formula 1 may be a single bond or phenylene.

In some embodiments, $R_1$ and $R_2$ in Formula 1 may be linked to form a spiro-type.

In some other embodiments, $R_1$ and $R_2$ in Formula 1 may each independently be a methyl group, a phenyl group, or a pyridyl group.

In some other embodiments, $R_3$ in Formula 1 may be one of the groups represented by Formulae 2a to 2f.

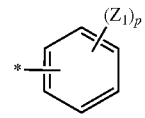

2a

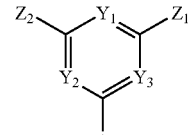

2b

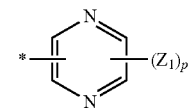

2c

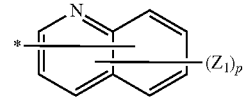

2d

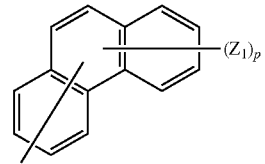

2e

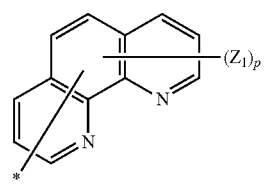

2f

In Formulae 2a to 2f, $Y_1$, $Y_2$, and $Y_3$ are each independently a linker represented by —N= or —C($R_{20}$)=;

$Z_1$, $Z_2$, and $R_{20}$ are each independently a hydrogen atom, a deuterium atom, a substituted or unsubstituted $C_1$-$C_{20}$ alkyl group, a substituted or unsubstituted $C_6$-$C_{20}$ aryl group, a substituted or unsubstituted $C_3$-$C_{20}$ heteroaryl group, a substituted or unsubstituted $C_6$-$C_{20}$ condensed polycyclic group, an amine group substituted with a $C_6$-$C_{20}$ aryl group or a $C3$-$C_{20}$ heteroaryl group, a halogen group, a cyano group, a nitro group, a hydroxy group, or a carboxy group;

p is an integer from 1 to 9; and

* indicates a binding site.

In some other embodiments, A in Formula 1 may be one of the groups represented by Formulae 3a to 3l:

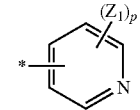

3a

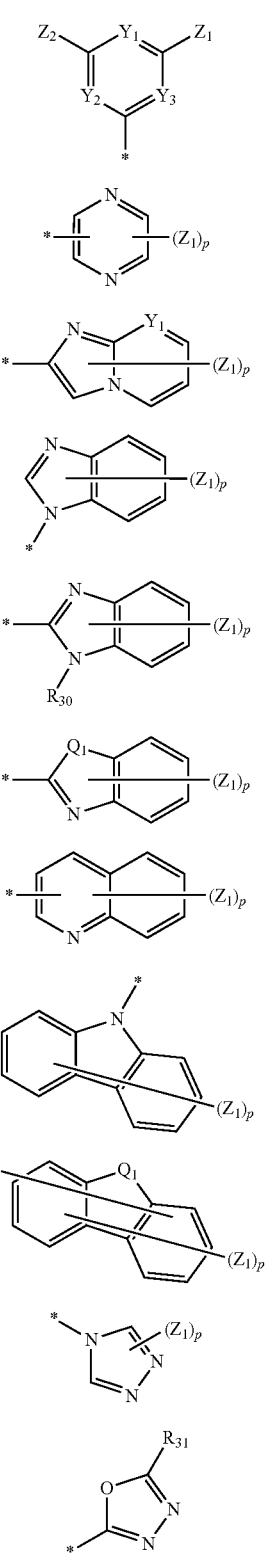

In Formulae 3a to 3l,

Y$_1$, Y$_2$, and Y$_3$ are each independently a linker represented by —N= or —C(R$_{20}$)=;

Z$_1$, Z$_2$, R$_{20}$, R$_{30}$, and R$_{31}$ are each independently, a hydrogen atom, a deuterium atom, a substituted or unsubstituted C$_1$-C$_{10}$ alkyl group, a substituted or unsubstituted C$_6$-C$_{20}$ aryl group, a substituted or unsubstituted C$_3$-C$_{20}$ heteroaryl group, a substituted or unsubstituted C$_6$-C$_{20}$ condensed polycyclic group, a halogen group, a cyano group, a nitro group, a hydroxy group, or a carboxy group;

Q$_1$ is S or O;

p is an integer from 1 to 7; and

* indicates a binding site.

Hereinafter, substituents described with reference to the formulae will now be described in detail. In this regard, the numbers of carbons in substituents are presented only for illustrative purposes and do not limit the characteristics of the substituents The unsubstituted C$_1$-C$_{60}$ alkyl group used herein may be linear or branched. Examples of the alkyl group may include, but are not limited to, a methyl group, an ethyl group, a propyl group, an isobutyl group, a sec-butyl group, a pentyl group, an iso-amyl group, a hexyl group, a heptyl group, an octyl group, a nonanyl group, and a dodecyl group. At least one hydrogen atom of the alkyl group may be substituted with a deuterium atom, a halogen atom, a hydroxyl group, a nitro group, a cyano group, an amino group, an amidino group, hydrazine, hydrazone, a carboxyl group or a salt thereof, a sulfonic acid group or a salt thereof, a phosphoric acid group or a salt thereof, a C$_1$-C$_{10}$ alkyl group, a C$_1$-C$_{10}$ alkoxy group, a C$_2$-C$_{10}$ alkenyl group, a C$_2$-C$_{10}$ alkynyl group, a C$_6$-C$_{16}$ aryl group, or a C$_4$-C$_{16}$ heteroaryl group.

The unsubstituted C$_2$-C$_{60}$ alkenyl group indicates an unsaturated alkyl groups having at least one carbon-carbon double bond in the center or at a terminal of the alkyl group. Examples of the alkenyl group are an ethenyl group, a propenyl group, a butenyl group, and the like. At least one hydrogen atom in the unsubstituted alkenyl group may be substituted with a substituent described above in conjunction with the alkyl group.

The unsubstituted C$_2$-C$_{60}$ alkynyl group indicates an alkyl group having at least one carbon-carbon triple bond in the center or at a terminal of the alkyl group. Non-limiting examples of the unsubstituted C$_2$-C$_{20}$ alkynyl group are acetylene, propylene, phenylacetylene, naphthylacetylene, isopropylacetylene, t-butylacetylene, and diphenylacetylene. At least one hydrogen atom in the alkynyl group may be substituted with a substituent described above in conjunction with the alkyl group.

The unsubstituted C$_3$-C$_{60}$ cycloalkyl group indicates a C$_3$-C$_{60}$ cyclic alkyl group wherein at least one hydrogen atom in the cycloalkyl group may be substituted with a substituent described above in conduction with the C$_1$-C$_{60}$ alkyl group.

The unsubstituted C$_1$-C$_{60}$ alkoxy group indicates a group having a structure of —OA, wherein A is an unsubstituted C$_1$-C$_{60}$ alkyl group as described above. Non-limiting examples of the unsubstituted C$_1$-C$_{60}$ alkoxy group are a methoxy group, an ethoxy group, a propoxy group, an isopropyloxy group, a butoxy group, and a pentoxy group. At least one hydrogen atom of the alkoxy group may be substituted with a substituent such as those described above in conjunction with the alkyl group.

The unsubstituted C$_6$-C$_{60}$ aryl group indicates a carbocyclic aromatic system containing at least one ring. At least two rings may be fused to each other or linked to each other by a single bond. The term 'aryl' refers to an aromatic system, such as phenyl, naphthyl, or anthracenyl. At least one hydrogen atom in the aryl group may be substituted with a substituent described above in conjunction with the unsubstituted C$_1$-C$_{60}$ alkyl group.

Non-limiting examples of the substituted or unsubstituted $C_6$-$C_{60}$ aryl group are a phenyl group, a $C_1$-$C_{10}$ alkylphenyl group (for example, ethylphenyl group), a halophenyl group (for example, o-, m-, and p-fluorophenyl group, dichlorophenyl group), a cyanophenyl group, dicyanophenyl group, a trifluoromethoxyphenyl group, a biphenyl group, a halobiphenyl group, a cyanobiphenyl group, a $C_1$-$C_{10}$ alkyl biphenyl group, a $C_1$-$C_{10}$ alkoxybiphenyl group, a o-, m-, and p-toryl group, an o-, m-, and p-cumenyl group, a mesityl group, a phenoxyphenyl group, a (α,α-dimethylbenzene) phenyl group, a (N,N'-dimethyl)aminophenyl group, a (N,N'-diphenyl)aminophenyl group, a pentalenyl group, an indenyl group, a naphthyl group, a halonaphthyl group (for example, fluoronaphthyl group), a $C_1$-$C_{10}$ alkylnaphthyl group (for example, methylnaphthyl group), a $C_1$-$C_{10}$ alkoxynaphthyl group (for example, methoxynaphthyl group), a cyanonaphthyl group, an anthracenyl group, an azulenyl group, a heptalenyl group, an acenaphthylenyl group, a phenalenyl group, a fluorenyl group, an anthraquinolyl group, a methylanthryl group, a phenanthryl group, a triphenylene group, a pyrenyl group, a chrycenyl group, an ethyl-chrysenyl group, a picenyl group, a perylenyl group, a chloroperylenyl group, a pentaphenyl group, a pentacenyl group, a tetraphenylenyl group, a hexaphenyl group, a hexacenyl group, a rubicenyl group, a coronelyl group, a trinaphthylenyl group, a heptaphenyl group, a heptacenyl group, a pyranthrenyl group, and an ovalenyl group.

The unsubstituted $C_3$-$C_{60}$ heteroaryl group used herein includes one, two or three hetero atoms selected from N, O, P and S. At least two rings may be fused to each other or linked to each other by a single bond. Non-limiting examples of the unsubstituted $C_4$-$C_{60}$ heteroaryl group are a pyrazolyl group, an imidazolyl group, an oxazolyl group, a thiazolyl group, a triazolyl group, a tetrazolyl group, an oxadiazolyl group, a pyridinyl group, a pyridazinyl group, a pyrimidinyl group, a triazinyl group, a carbazol group, an indol group, a quinolyl group, an isoquinolyl group, and a dibenzothiophene group. In addition, at least one hydrogen atom in the heteroaryl group may be substituted with a substituent described above in conjunction with the unsubstituted $C_1$-$C_{60}$ alkyl group.

The unsubstituted $C_6$-$C_{60}$ aryloxy group is a group represented by —$OA_1$, wherein $A_1$ may be a $C_6$-$C_{60}$ aryl group. An example of the aryloxy group is a phenoxy group. At least one hydrogen atom in the aryloxy group may be substituted with a substituent described above in conjunction with the unsubstituted $C_1$-$C_{60}$ alkyl group.

The unsubstituted $C_6$-$C_{60}$ arylthio group is a group represented by —$SA_1$, wherein $A_1$ may be a $C_6$-$C_{60}$ aryl group. Non-limiting examples of the arylthio group are a benzenethio group and a naphthylthio group. At least one hydrogen atom in the arylthio group may be substituted with a substituent described above in conjunction with the unsubstituted $C_1$-$C_{60}$ alkyl group.

The unsubstituted $C_6$-$C_{60}$ condensed polycyclic group used herein refers to a substituent including at least two rings wherein at least one aromatic ring and/or at least one non-aromatic ring are fused to each other, or refers to a substituent having an unsaturated group in a ring that may not form a conjugate structure. The unsubstituted C6-C60 condensed polycyclic group is distinct from an aryl group or a heteroaryl group in terms of being non-aromatic.

A condensed polycyclic group including N, O, or S used herein refers to a substituent including N, O, or S and at least two rings wherein at least one aromatic ring and/or at least one non-aromatic ring are fused to each other, or refers to a substituent including N, O, or S and having an unsaturated group in a ring that may not form a conjugate structure. The unsubstituted C6-C60 condensed polycyclic group refers to a non-aromatic compound.

In addition, at least one hydrogen atom in the condensed polycyclic group or in the condensed polycyclic group including N, O, or S may be substituted with any substituents described in conjunction with the unsubstituted $C_1$-$C_{60}$ alkyl group.

Non-limiting examples of the compound represented by Formula 1 are Compounds 1 to 70 represented by the following formulae.

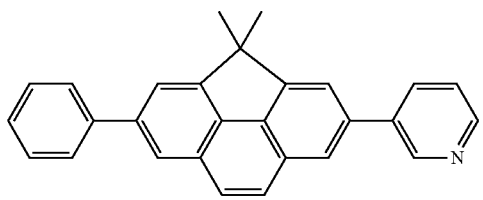

1

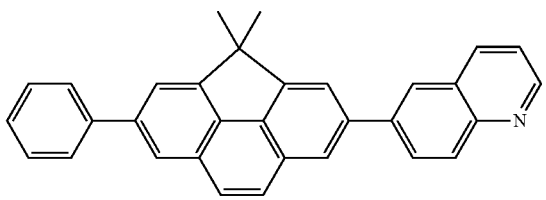

2

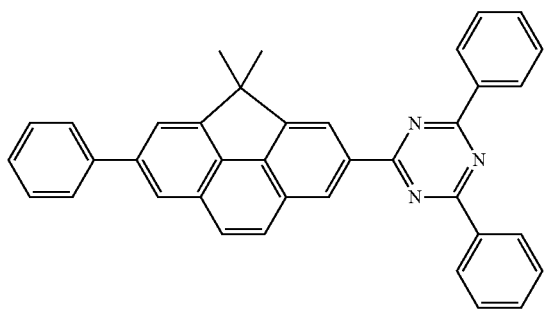

3

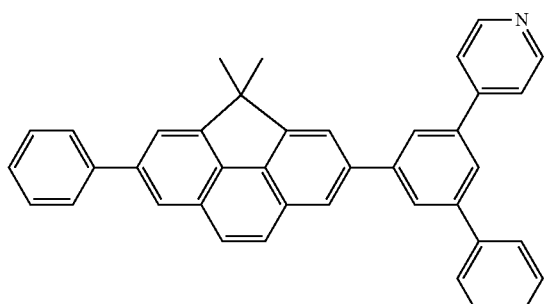

4

-continued
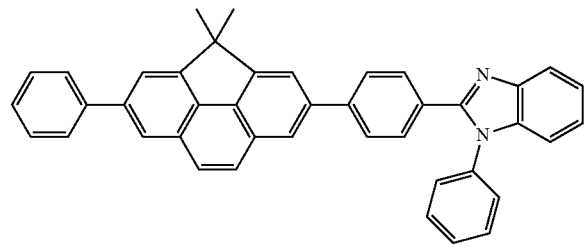
5
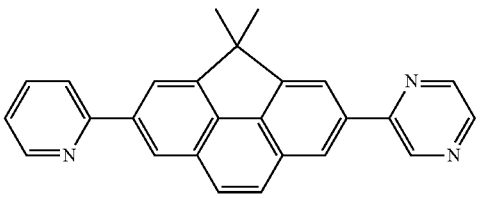
6
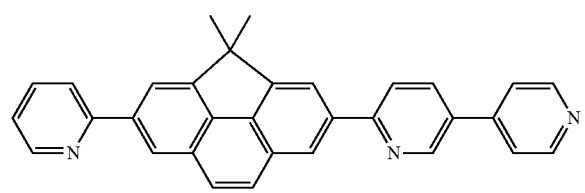
7
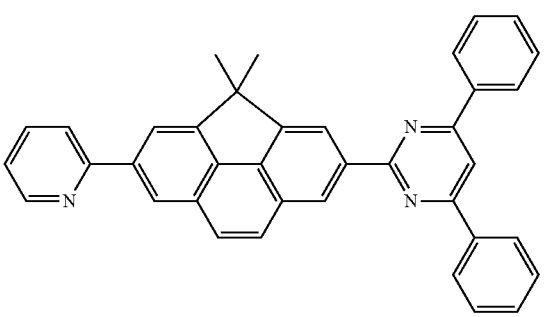
8
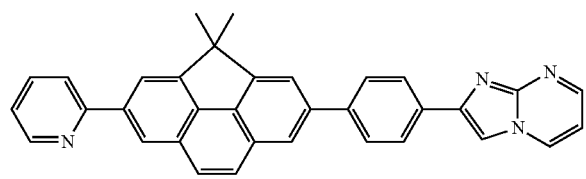
9
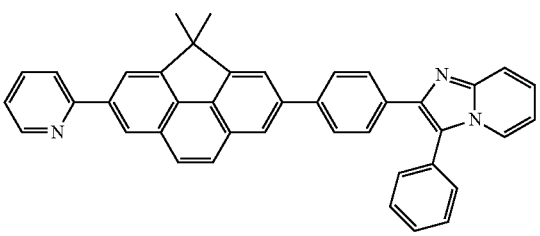
10
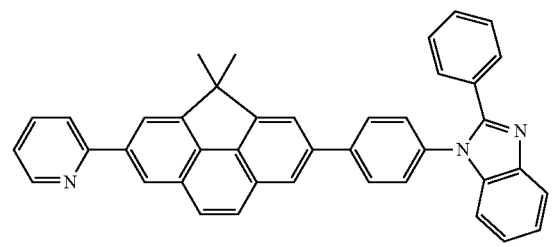
11
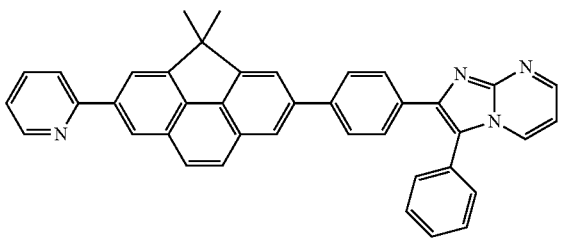
12
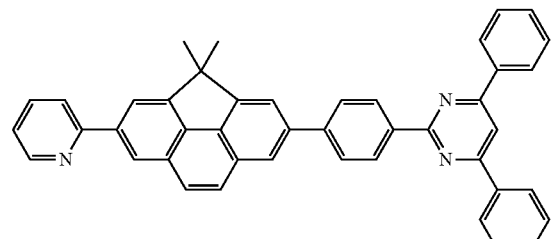
13
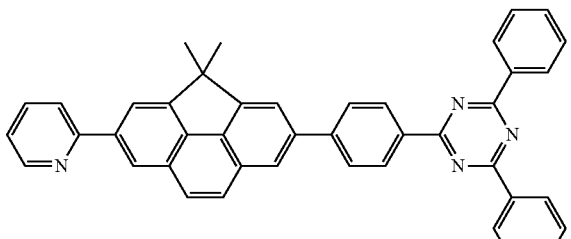
14
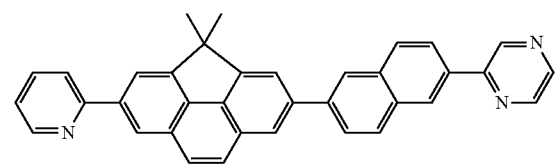
15
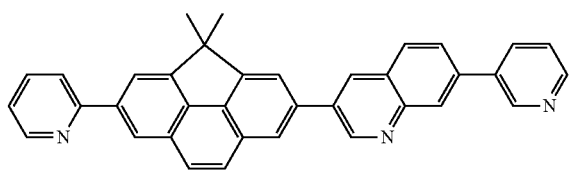
16

-continued
17
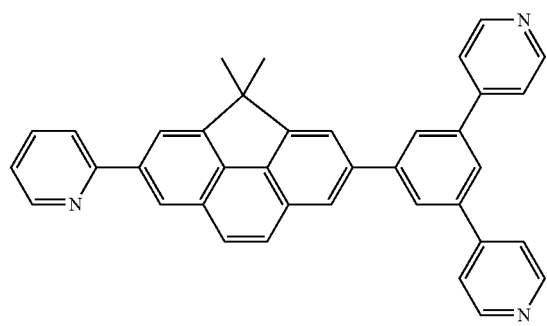
18
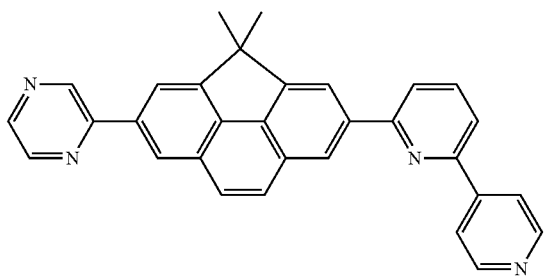
19
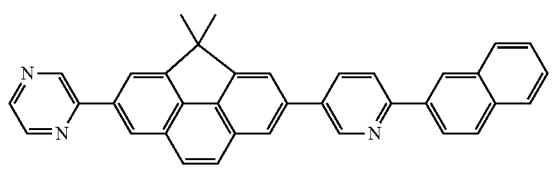
20
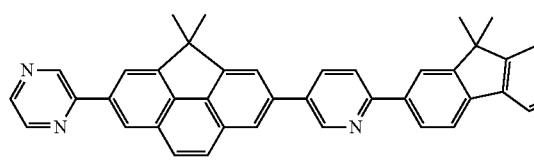
21
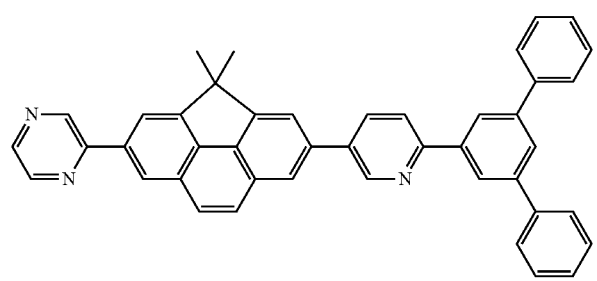
22
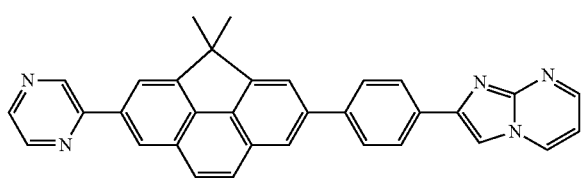
23
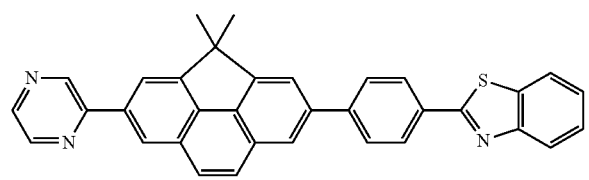
24
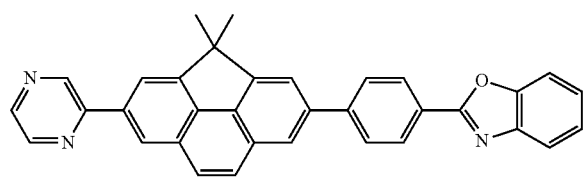
25
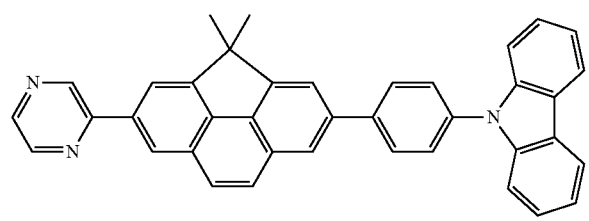
26
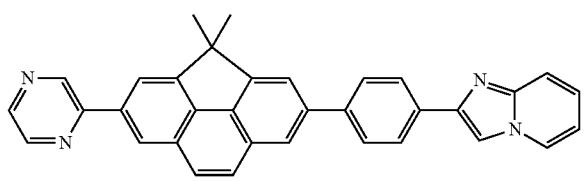
27
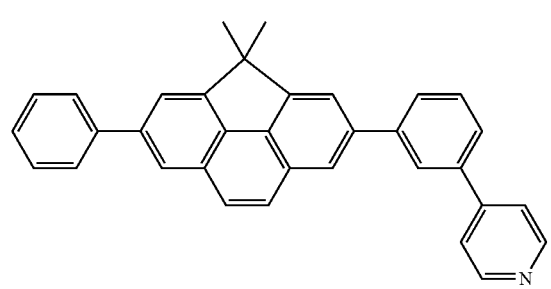
28
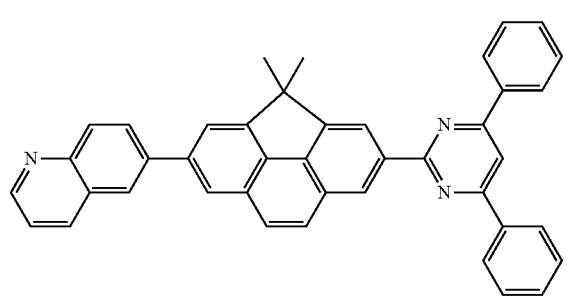

-continued
29
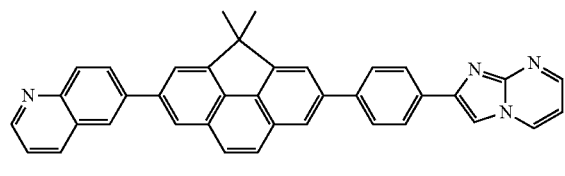
30
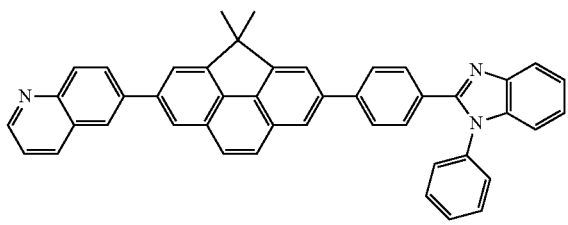
31
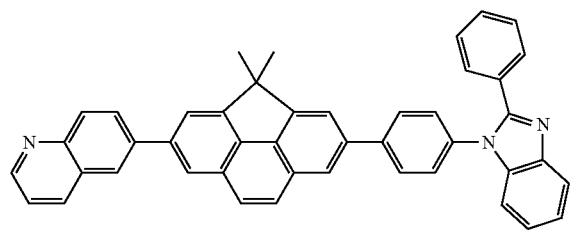
32
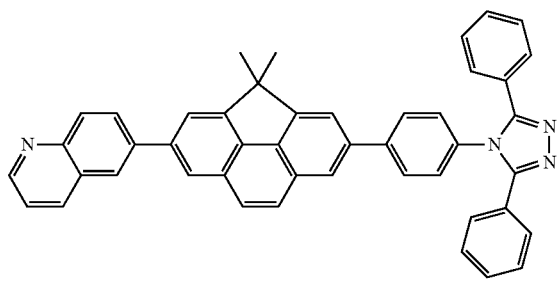
33
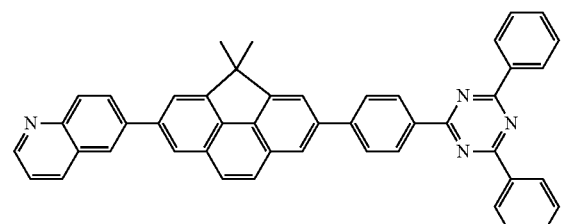
34
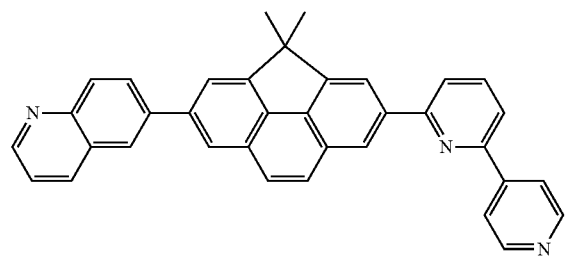
35
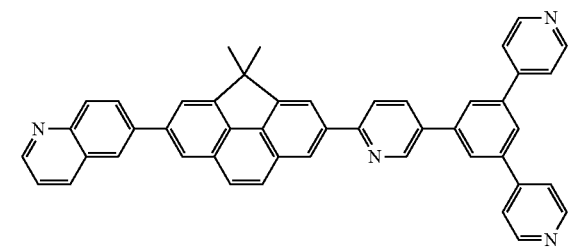
36
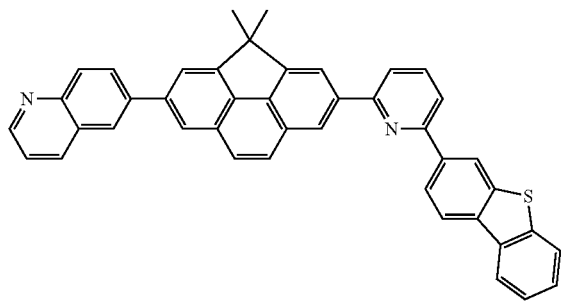
37
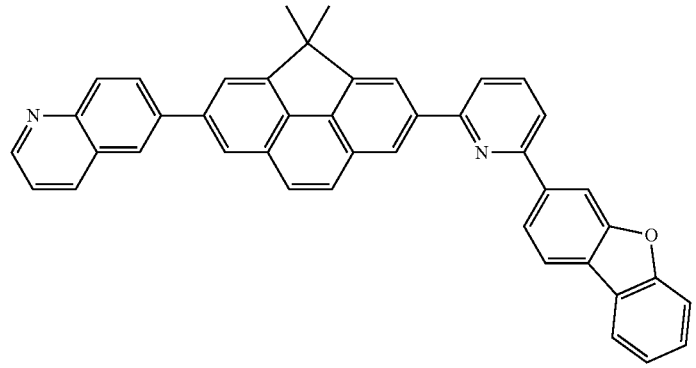

-continued
38
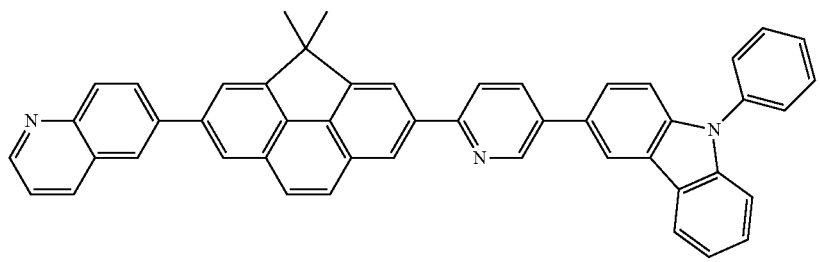
39
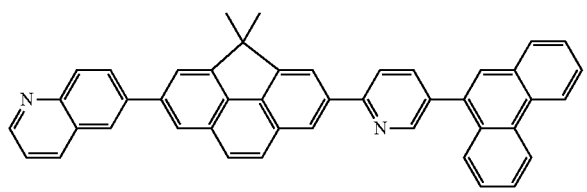
40
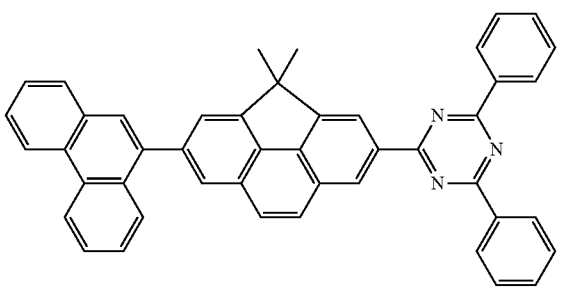
41
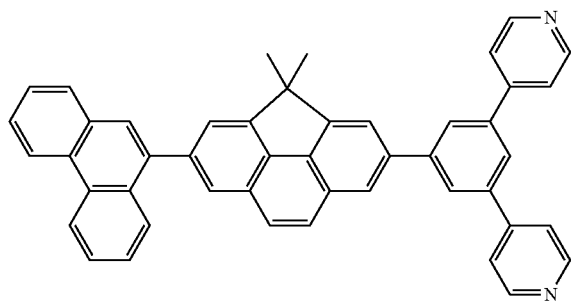
42
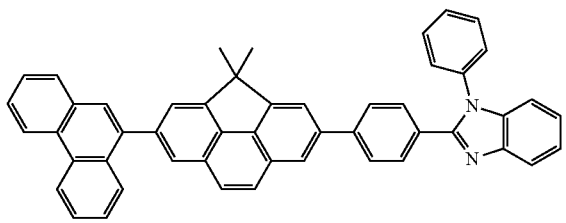
43
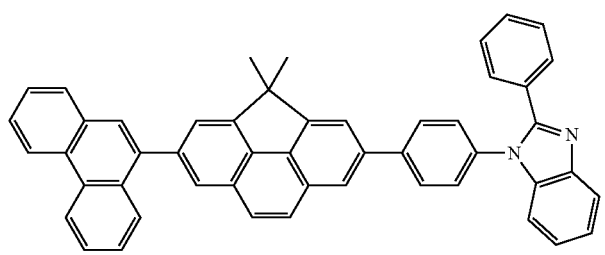
44
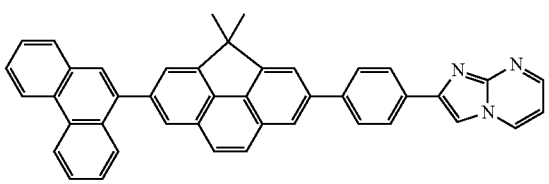
45
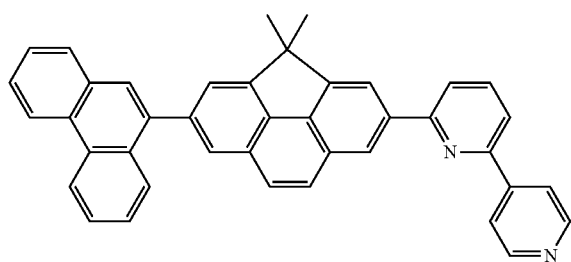
46
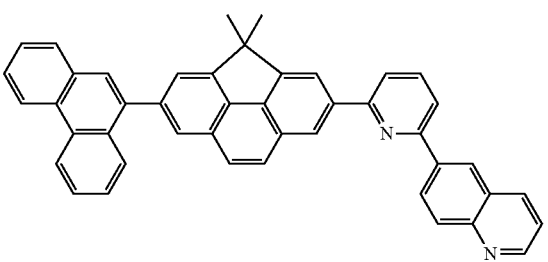

-continued
47
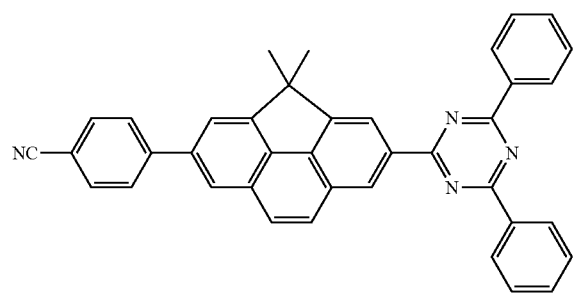
48
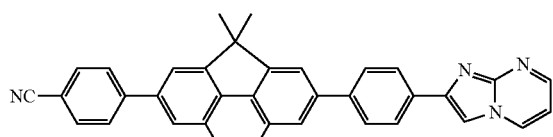
49
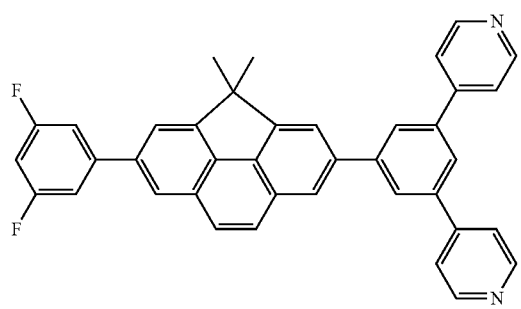
50
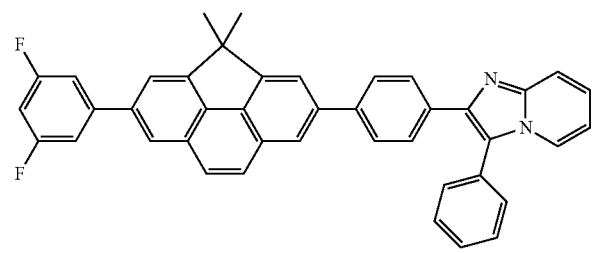
51
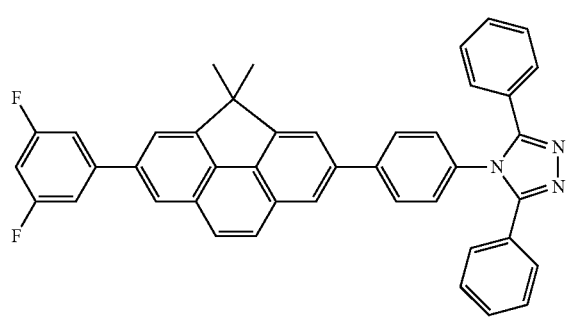
52
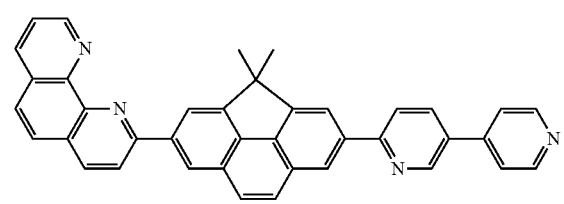
53
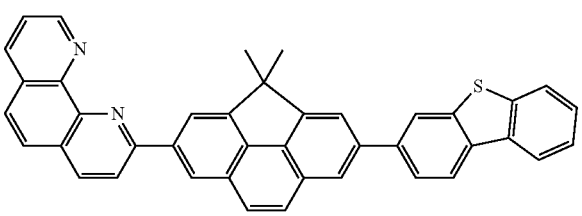
54
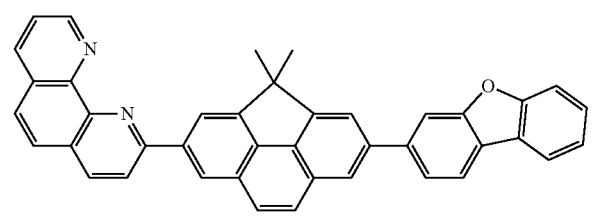
55
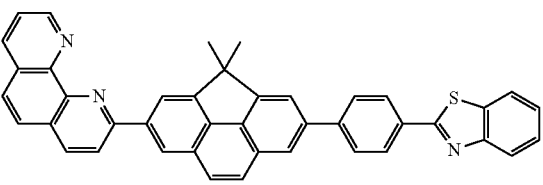
56
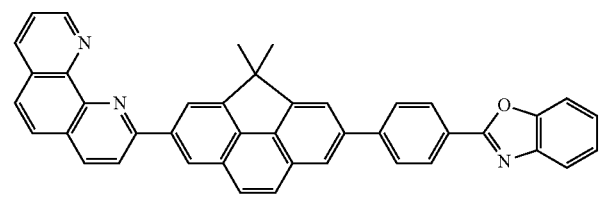

-continued
57
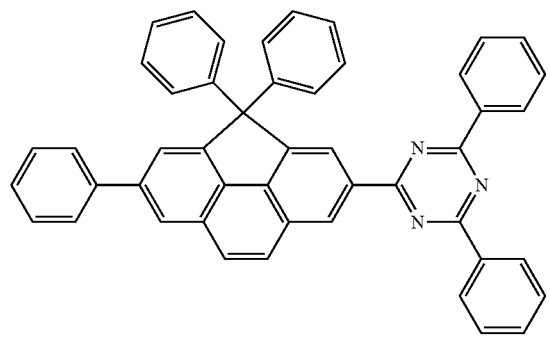
58
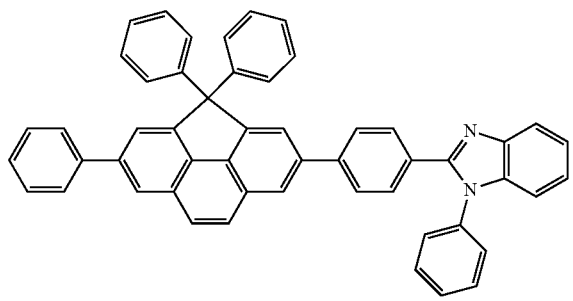
59
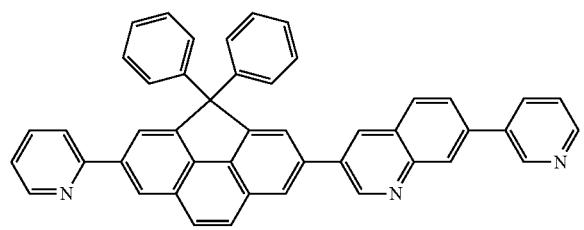
60
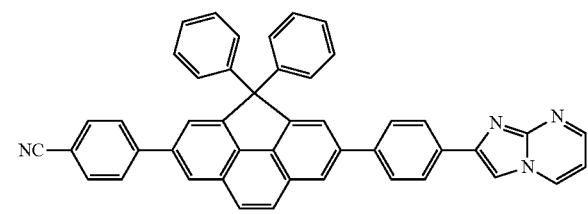
61
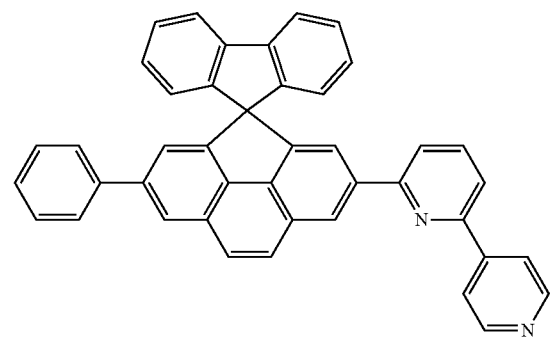
62
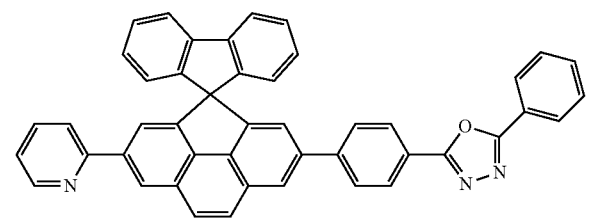
63
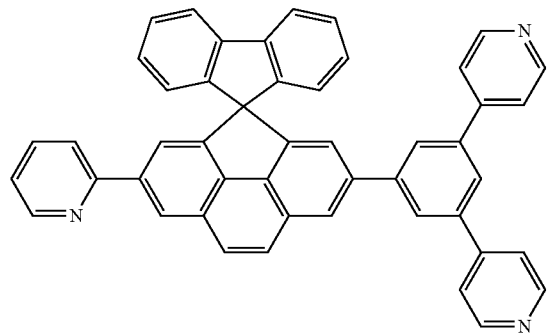
64
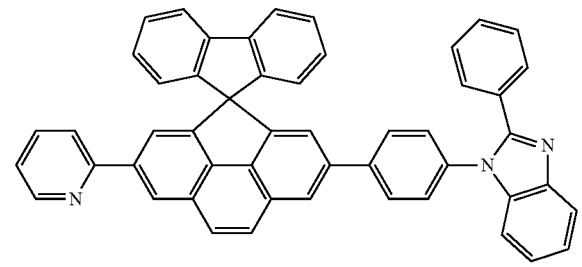

65

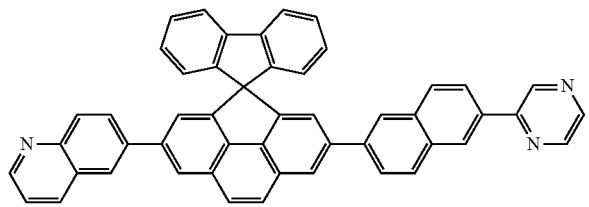

66

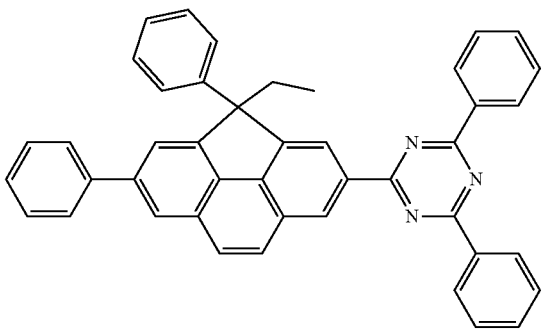

67

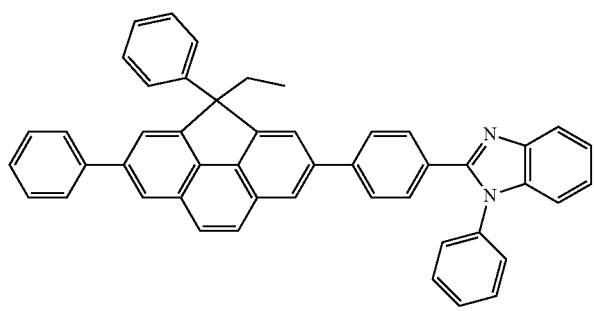

68

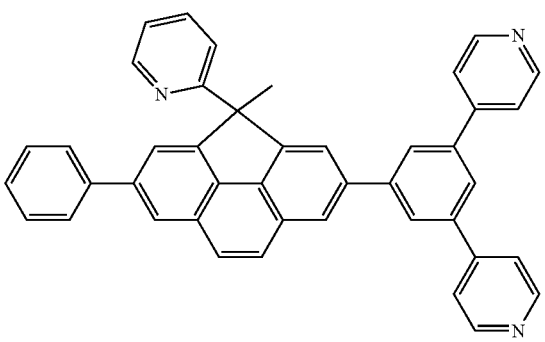

69

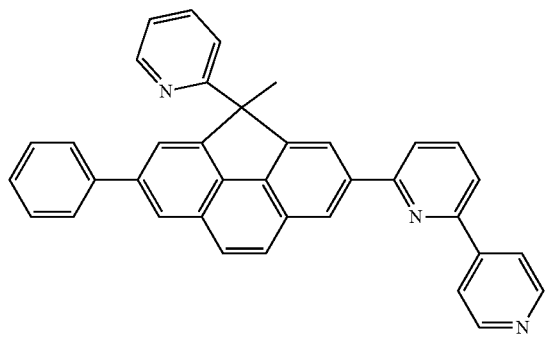

70

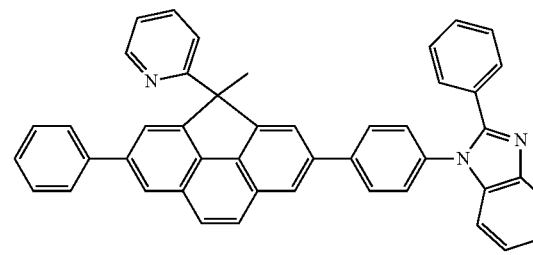

According to another embodiment, an organic light-emitting device includes a first electrode, a second electrode, and an organic film disposed between the first electrode and the second electrode, wherein the organic film includes the compound of Formula 1 described above.

The organic layer may include at least one layer selected from among a hole injection layer, a hole transport layer, a functional layer having both hole injection and hole transport capabilities (hereinafter, "H-functional layer"), a buffer layer, an electron blocking layer, an emission layer, a hole blocking layer, an electron transport layer, an electron injection layer, and a functional layer having both electron injection and electron transport capabilities (hereinafter, "E-functional layer").

In some embodiments, the organic light-emitting device may include an electron injection layer, an electron transport layer, a functional layer having both hole injection and transport capabilities, an emission layer, a hole injection layer, a hole transport layer, or a functional layer having both hole injection and transport capabilities, wherein the electron injection layer, the electron transport layer, or the functional layer having both electron injection and electron transport capabilities may include the Formula 1). The emission layer may include an anthracene-based compound, an arylamine-based compound or a styryl-based compound.

In some other embodiments, the organic light-emitting device may include an electron injection layer, an electron transport layer, an emission layer, a hole injection layer, a hole transport layer, or a functional layer having both hole injection and transport capabilities; at least one of a red emission layer, a green emission layer, a blue emission layer, and a white emission layer of the emission layer may include a phosphorescent compound; and at least one of the hole injection layer, the hole transport layer, and the functional layer having both hole injection and hole transport capabilities may include a charge-generating material. In some embodiments, the charge-generating material may be a p-type dopant, and the p-type dopant may be a quinone derivative, a metal oxide or a cyano group-containing compound.

In some embodiments, the organic film may include an electron transport layer, and the electron transport layer may include an electron-transporting organic compound and a meta complex. The metal complex may be a lithium (Li) complex.

The term "organic layer" as used herein refers to a single layer and/or a plurality of layers disposed between the first and second electrodes of the organic light-emitting device.

FIG. 1 is a schematic sectional view of an organic light-emitting device according to an embodiment. Hereinafter, a structure of an organic light-emitting device according to an embodiment and a method of manufacturing the same will now be described with reference to FIG. 1.

A substrate (not shown) may be any substrate that is used in existing organic light emitting devices. In some embodiments the substrate 11 may be a glass substrate or a transparent plastic substrate with strong mechanical strength, thermal stability, transparency, surface smoothness, ease of handling, and water resistance.

The first electrode may be formed by depositing or sputtering a first electrode-forming material on the substrate. When the first electrode is an anode, a material having a high work function may be used as the first electrode-forming material to facilitate hole injection. The first electrode may be a reflective electrode or a transmission electrode. Transparent and conductive materials such as ITO, MO, $SnO_2$, and ZnO may be used to form the first electrode. The first electrode may be formed as a reflective electrode using magnesium (Mg), aluminum (Al), aluminum-lithium (Al—Li), calcium (Ca), magnesium-indium (Mg—In), magnesium-silver (Mg—Ag), or the like.

The first electrode 13 may have a single-layer structure or a multi-layer structure including at least two layers. For example, the first electrode may have a three-layered structure of ITO/Ag/ITO, but is not limited thereto.

An organic layer(s) is disposed on the first electrode.

The organic layer may include a hole injection layer (HIL), a hole transport layer (HTL), a buffer layer (not shown), an emission layer (EML), an electron transport layer (ETL), or an electron injection layer (EIL).

The HIL may be formed on the first electrode by vacuum deposition, spin coating, casting, Langmuir-Blodgett (LB) deposition, or the like.

When the HIL is formed using vacuum deposition, vacuum deposition conditions may vary according to the compound that is used to form the HIL, and the desired structure and thermal properties of the HIL to be formed. For example, vacuum deposition may be performed at a temperature of about 100° C. to about 500° C., a pressure of about $10^{-8}$ torr to about $10^{-3}$ torr, and a deposition rate of about 0.01 to about 100 Å/sec. However, the deposition conditions are not limited thereto.

When the HIL is formed using spin coating, the coating conditions may vary according to the compound that is used to form the HIL, and the desired structure and thermal properties of the HIL to be formed. For example, the coating rate may be in the range of about 2000 rpm to about 5000 rpm, and a temperature at which heat treatment is performed to remove a solvent after coating may be in the range of about 80° C. to about 200° C. However, the coating conditions are not limited thereto.

The HIL may comprise any material that is commonly used to form a HIL. Non-limiting examples of the material that can be used to form the HIL are N,N'-diphenyl-N,N'-bis-[4-(phenyl-m-tolyl-amino)-phenyl]-biphenyl-4,4'-diamine, (DNTPD), a phthalocyanine compound such as copperphthalocyanine, 4,4',4"-tris (3-methylphenylphenylamino) triphenylamine (m-MTDATA), N,N'-di(1-naphthyl)-N,N'-diphenylbenzidine (NPB), TDATA, 2T-NATA, polyaniline/dodecylbenzenesulfonic acid (Pani/DBSA), poly(3,4-ethylenedioxythiophene)/poly(4-styrenesulfonate) (PEDOT/PSS), polyaniline/camphor sulfonicacid (Pani/CSA), and polyaniline)/poly(4-styrenesulfonate (PANI/PSS).

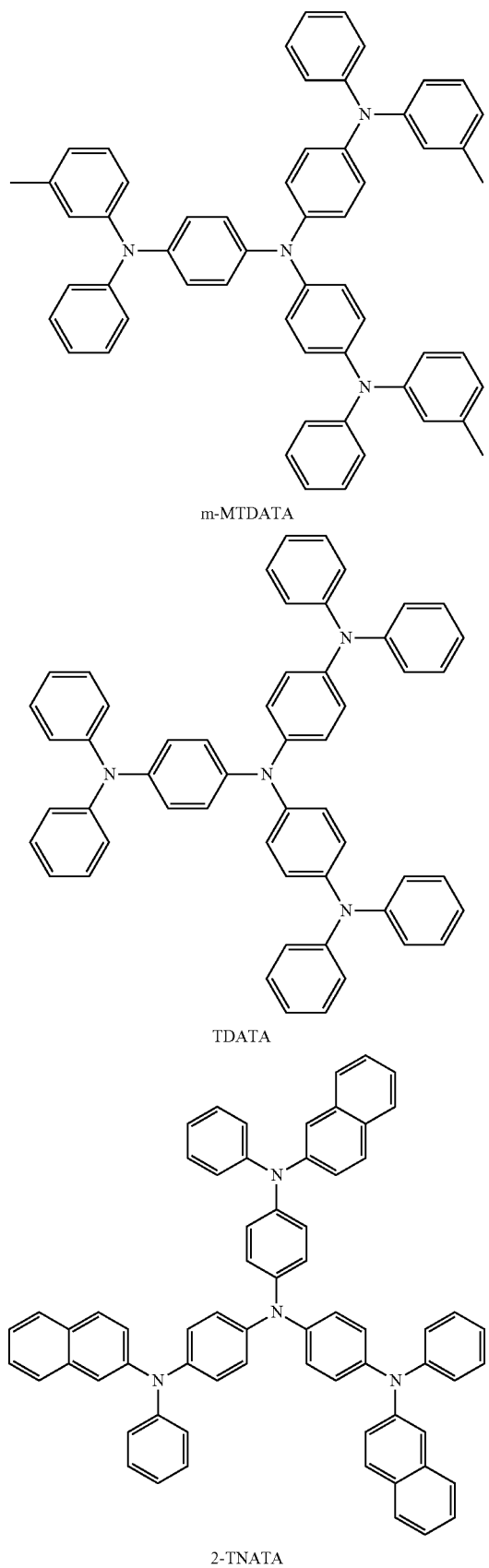

m-MTDATA

TDATA

2-TNATA

The thickness of the HIL may be about 100 Å to about 10000 Å, and in some embodiments, may be from about 100 Å to about 1000 Å. When the thickness of the HIL is within these ranges, the HIL may have good hole injecting ability without a substantial increase in driving voltage.

Then, a HTL may be formed on the HIL by using vacuum deposition, spin coating, casting, Langmuir-Blodgett (LB) deposition, or the like. When the HTL is formed using vacuum deposition or spin coating, the conditions for deposition and coating may be similar to those for the formation of the HIL, though the conditions for the deposition and coating may vary according to the material that is used to form the HTL.

A hole transporting material for the HTL may be any known hole transporting material. Non-limiting examples of suitable known HTL forming materials are carbazole derivatives, such as N-phenylcarbazole or polyvinylcarbazole, N,N'-bis(3-methylphenyl)-N,N'-diphenyl-[1,1-biphenyl]-4,4'-diamine (TPD), 4,4',4"-tris(N-carbazolyl)triphenylamine (TCTA), and N,N'-di(1-naphthyl)-N,N'-diphenylbenzidine (NPB).

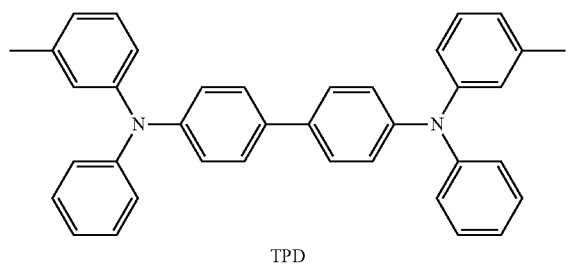

TPD

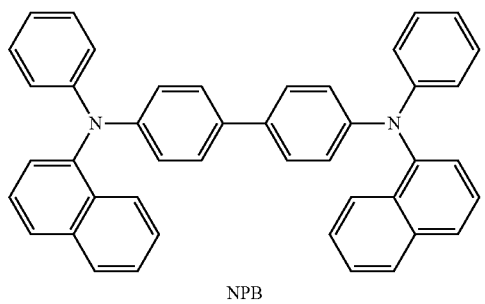

NPB

The thickness of the HTL may be from about 50 Å to about 2000 Å, and in some embodiments, may be from about 100 Å to about 1500 Å. When the thickness of the HTL is within these ranges, the HTL may have good hole transporting ability without a substantial increase in driving voltage.

The H-functional layer (having both hole injection and hole transport capabilities) may contain at least one material from each group of the hole injection layer materials and hole transport layer materials. The thickness of the H-functional layer may be from about 500 Å to about 10,000 Å, and in some embodiments, may be from about 100 Å to about 1,000 Å. When the thickness of the H-functional layer is within these ranges, the H-functional layer may have good hole injection and transport capabilities without a substantial increase in driving voltage.

In some embodiments, at least one of the HIL, HTL, and H-functional layer may include at least one of a compound of Formula 300 below and a compound of Formula 350 below:

Formula 300

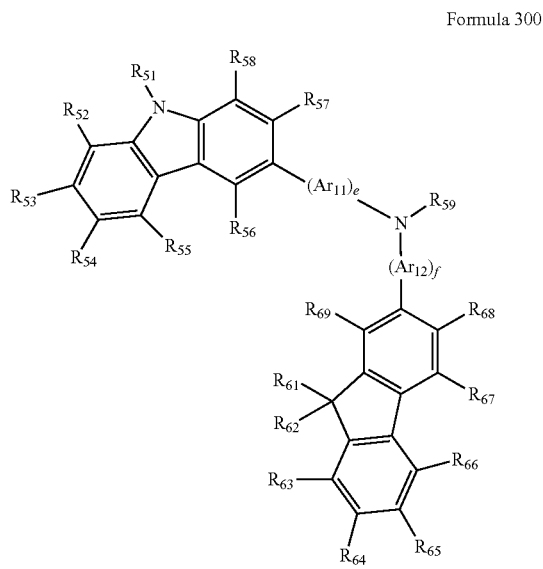

Formula 350

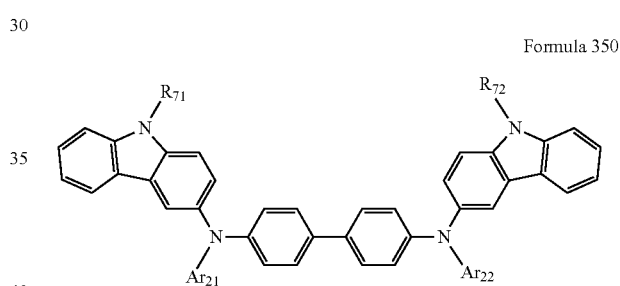

In Formulae 300 and 350, $Ar_{11}$, $Ar_{12}$, $Ar_2$, and $Ar_{22}$ may be each independently a substituted or unsubstituted $C_5$-$C_{60}$ arylene group.

In Formula 300, e and f may be each independently an integer from 0 to 5, for example, may be 0, 1, or 2. For example, e may be 1, and f may be 0, but not limited thereto.

In Formulae 300 and 350 above, $R_{51}$ to $R_{58}$, $R_{61}$ to $R_{69}$, and $R_{71}$ and $R_{72}$ may be each independently a hydrogen atom, a deuterium atom, a halogen atom, a hydroxyl group, a cyano group, a nitro group, an amino group, an amidino group, a hydrazine group, a hydrazone, a carboxyl group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{60}$ cycloalkyl group, a substituted or unsubstituted $C_5$-$C_{60}$ aryl group, a substituted or unsubstituted $C_5$-$C_{60}$ aryloxy group, or a substituted or unsubstituted $C_5$-$C_{60}$ arylthio group. In some embodiments, $R_{51}$ to $R_{58}$, $R_{61}$ to $R_{69}$, $R_{71}$, and $R_{72}$ may be each independently one of a hydrogen atom; a deuterium atom; a halogen atom; a hydroxyl group; a cyano group; a nitro group; an amino group; an amidino group; a hydrazine; a hydrazone; a carboxyl group or a salt thereof; a sulfonic acid group or a salt thereof; a phosphoric acid group or a salt thereof; a $C_1$-$C_{10}$ alkyl group (for example, a methyl group, an ethyl group, a propyl group, a butyl group, a pentyl group, a hexyl group, or the like); a $C_1$-$C_{10}$ alkoxy group (for example, a methoxy group, an ethoxy group, a propoxy group, a butoxy group, a pentoxy group, or the like); a $C_1$-$C_{10}$ alkyl group and a $C_1$-$C_{10}$ alkoxy group that are substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, and a phosphoric acid group or a salt thereof; a phenyl group; a naphthyl group; an anthryl group; a fluorenyl group; a pyrenyl group; and a phenyl group, a naphthyl group, an anthryl group, a fluorenyl group, and a pyrenyl group that are substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{10}$ alkyl group, and a $C_1$-$C_{10}$ alkoxy group.

In Formula 300, $R_{59}$ may be one of a phenyl group, a naphthyl group, an anthryl group, a biphenyl group, a pyridyl group; and a phenyl group, a naphthyl group, an anthryl group, a biphenyl group, and a pyridyl group that are substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a substituted or unsubstituted $C_1$-$C_{20}$ alkyl group, and a substituted or unsubstituted $C_1$-$C_{20}$ alkoxy group.

In an embodiment the compound of Formula 300 may be a compound represented by Formula 300A below:

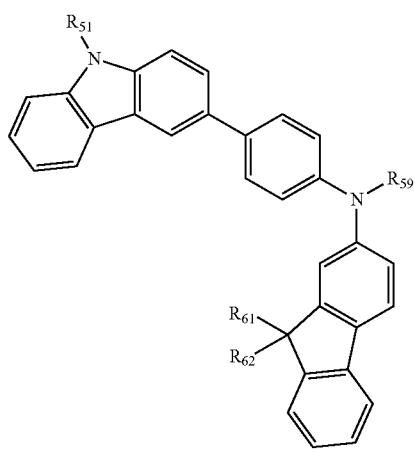

Formula 300A

In Formula 300A, $R_{51}$, $R_{61}$, $R_{62}$, and $R_{59}$ may be as defined above.

In some non-limiting embodiments, at least one of the HIL, HTL, and H-functional layer may include at least one of compounds represented by Formulae 301 to 320 below:

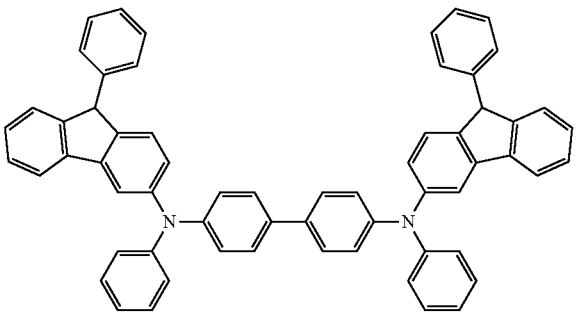

301

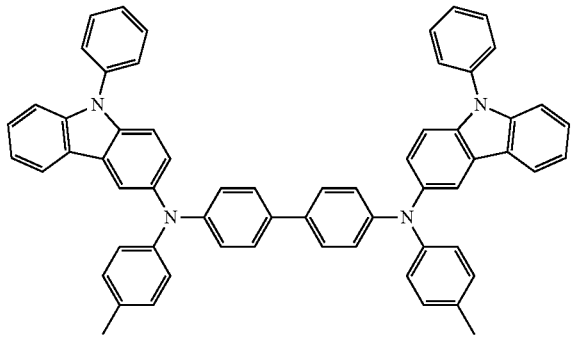

302

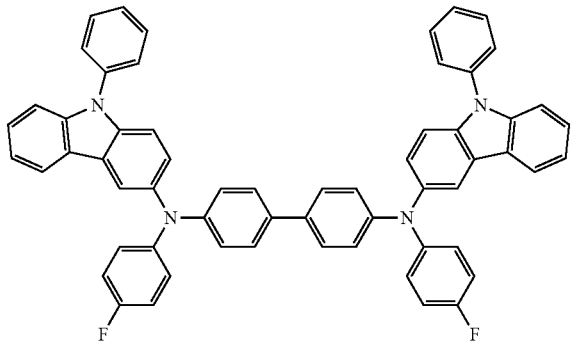

303

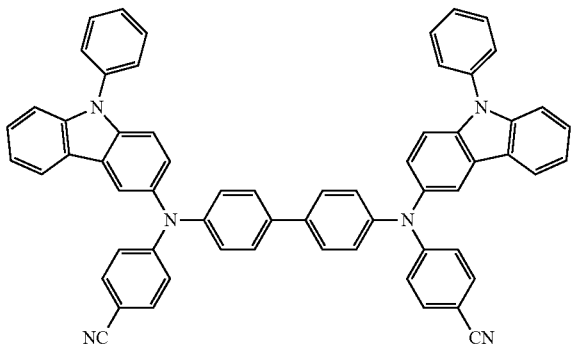

304

305
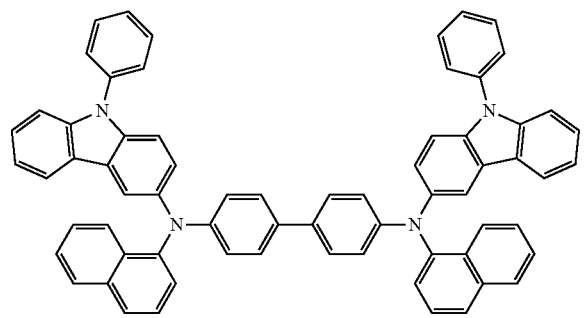
306
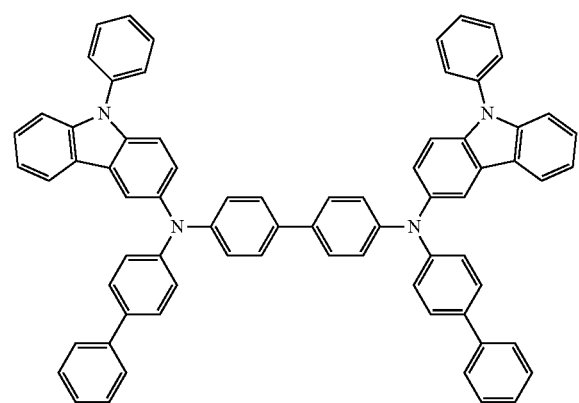
307
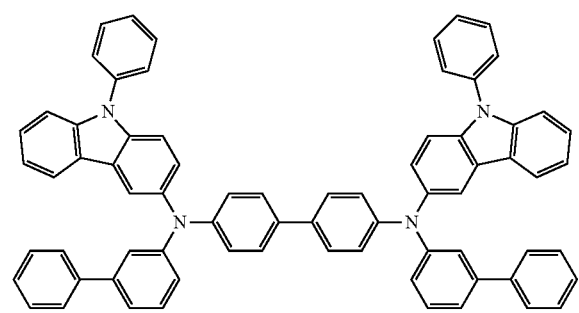
308
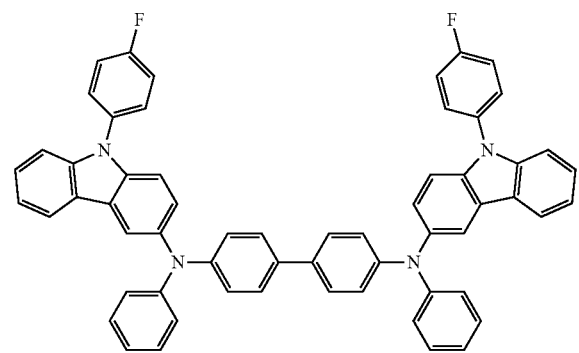
309
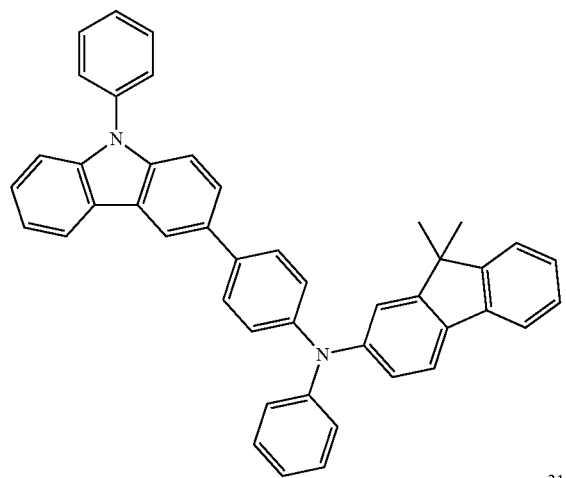
310
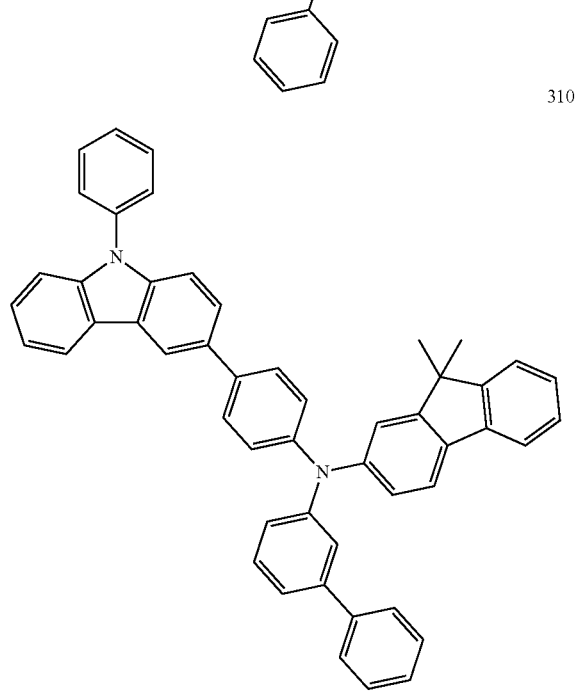
311
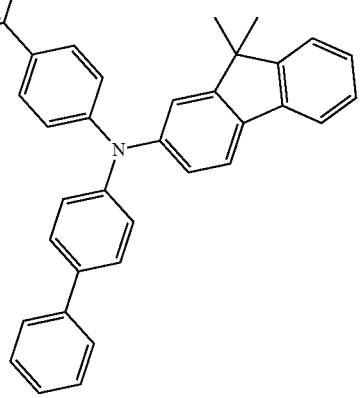

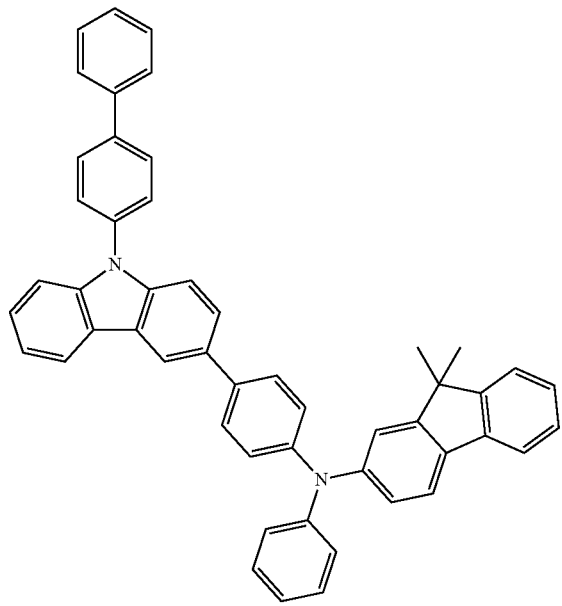
312
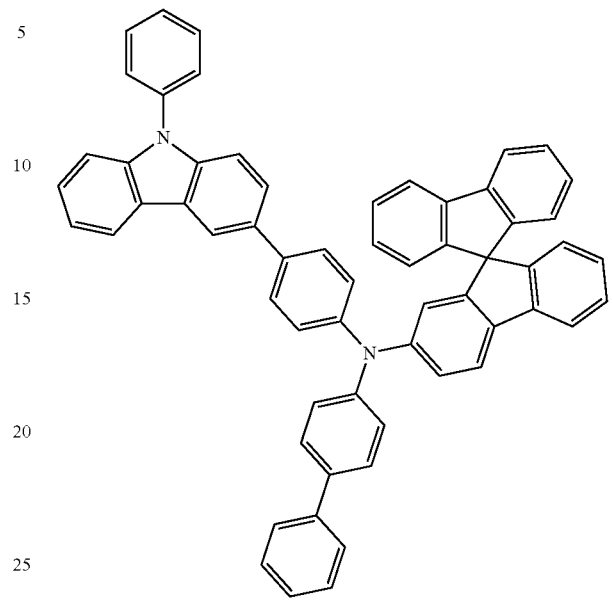
314
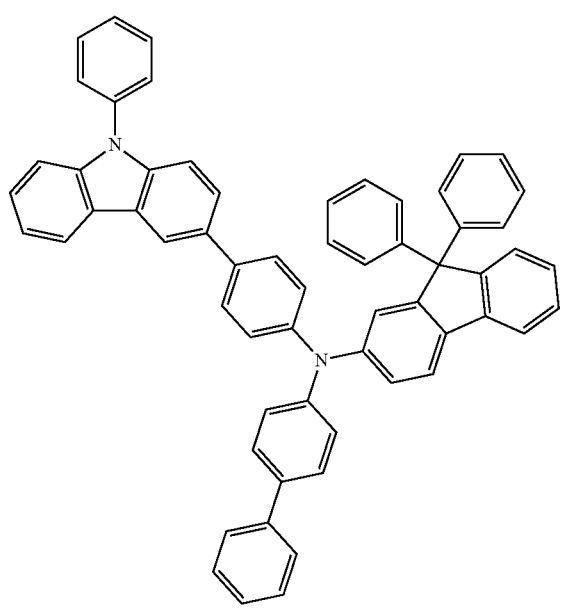
313
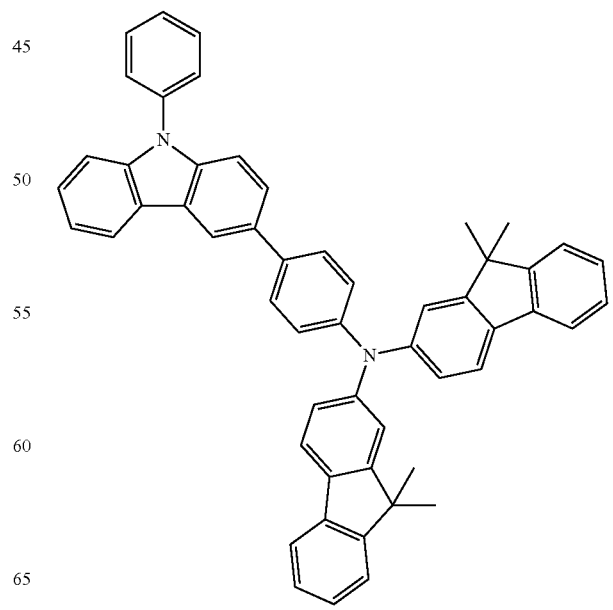
315

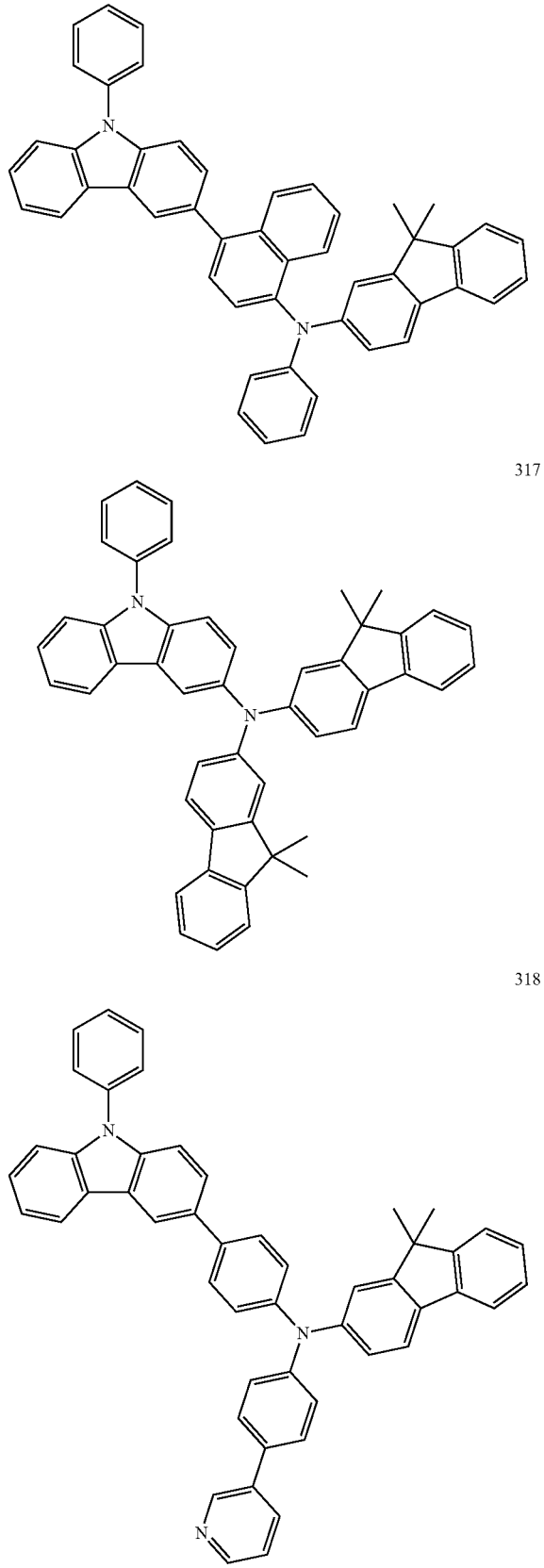

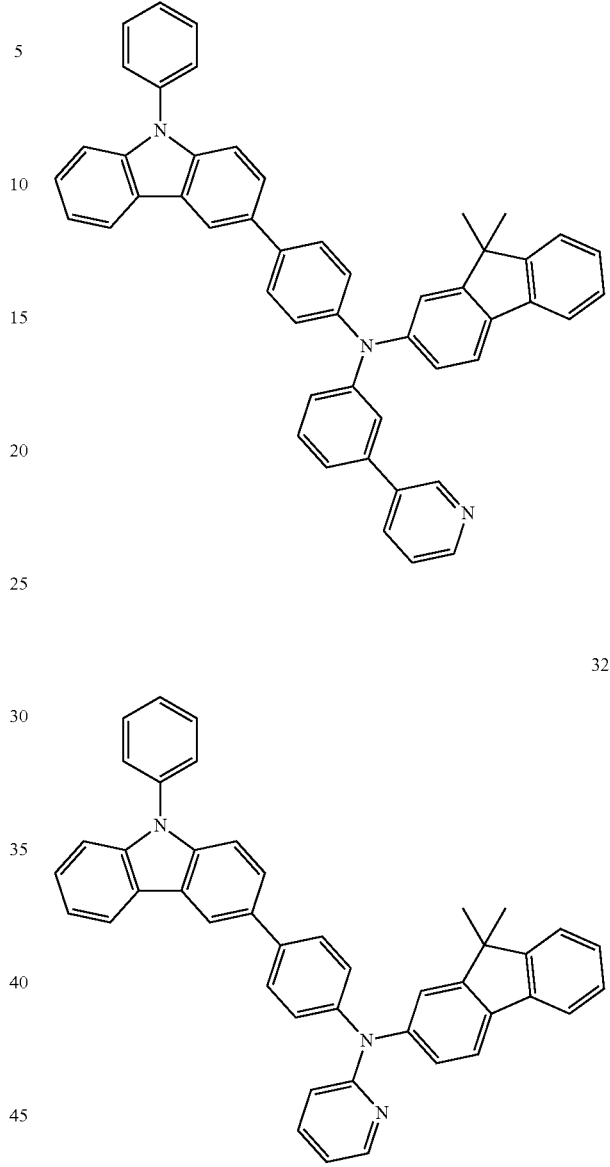

At least one of the HIL, HTL, and H-functional layer may further include a charge-generating material for improved layer conductivity, in addition to a known hole injecting material, hole transport material, and/or material having both hole injection and hole transport capabilities as described above.

The charge-generating material may be, for example, a p-dopant. The p-dopant may be one of quinine derivatives, metal oxides, and compounds with a cyano group, but are not limited thereto. Non-limiting examples of the p-dopant are quinone derivatives such as tetracyanoquinonedimethane (TCNQ), 2,3,5,6-tetrafluoro-tetracyano-1,4-benzoquinonedimethane (F4-TCNQ), and the like; metal oxides such as tungsten oxide, molybdenum oxide, and the like; and cyano-containing compounds such as Compound 200 below.

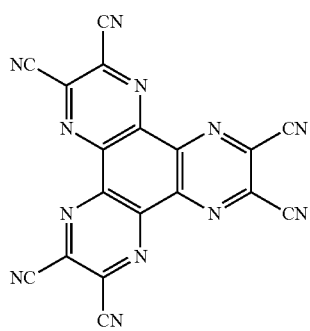

Compound 200

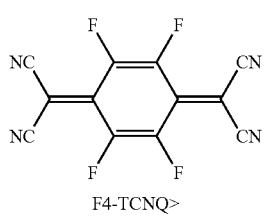

F4-TCNQ

When the hole injection layer, hole transport layer, or H-functional layer further includes a charge-generating material, the charge-generating material may be homogeneously dispersed or inhomogeneously distributed in the layer.

A buffer layer may be disposed between at least one of the HIL, HTL, and H-functional layer, and the EML. The buffer layer may compensate for an optical resonance distance of light according to a wavelength of the light emitted from the EML, and thus may increase efficiency. The butter layer may include any hole injecting material or hole transporting material that are widely known. In some other embodiments, the buffer layer may include the same material as one of the materials included in the HIL, HTL, and H-functional layer that underlie the buffer layer.

Then, an EML may be formed on the HTL, H-functional layer, or buffer layer by vacuum deposition, spin coating, casting, Langmuir-Blodget (LB) deposition, or the like. When the EML is formed using vacuum deposition or spin coating, the deposition and coating conditions may be similar to those for the formation of the HIL, though the conditions for deposition and coating may vary according to the material that is used to form the EML.

The emission layer may include a host.

Non-limiting example of the host are Alq$_3$, 4,4'-N,N'-dicarbazole-biphenyl (CBP), poly(n-vinylcarbazole) (PVK), 9,10-di(naphthalene-2-yl)anthracene (DNA), TCTA, 1,3,5-tris(N-phenylbenzimidazole-2-yl)benzene (TPBI), 3-tert-butyl-9,10-di-2-naphthylanthracene (TBADN), E3, distyrylarylene (DSA), dmCBP (see a formula below), and Compounds 501 to 509 below.

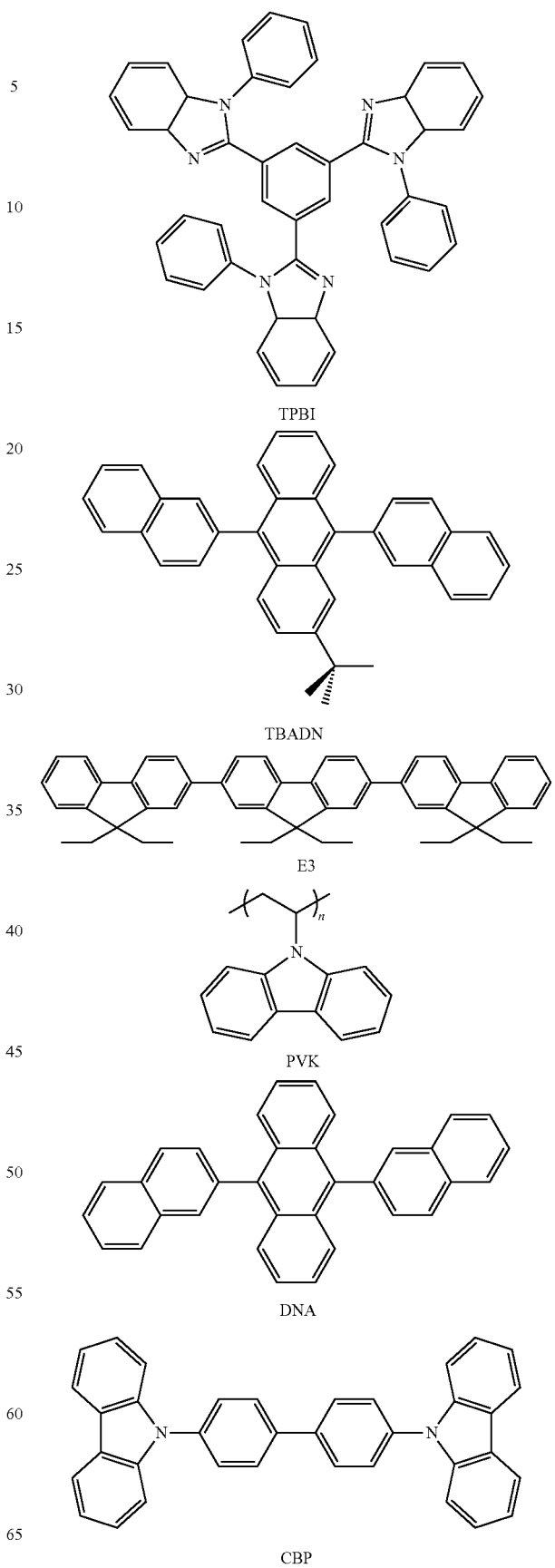

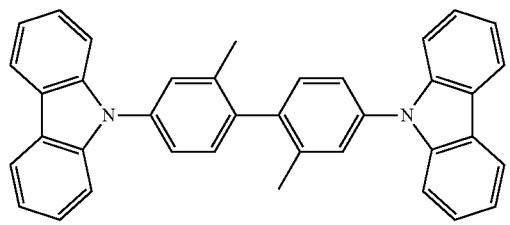
dmCBP
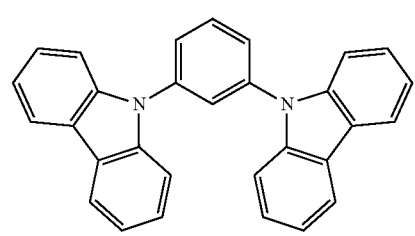
501
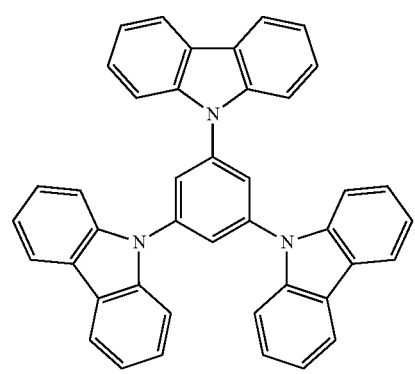
502
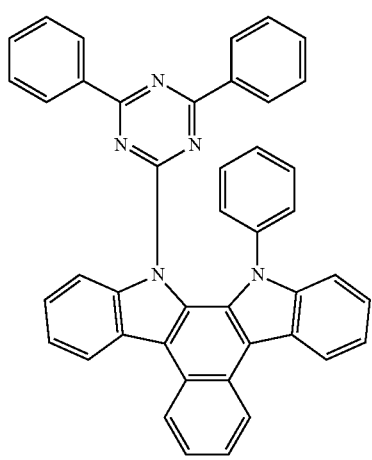
503
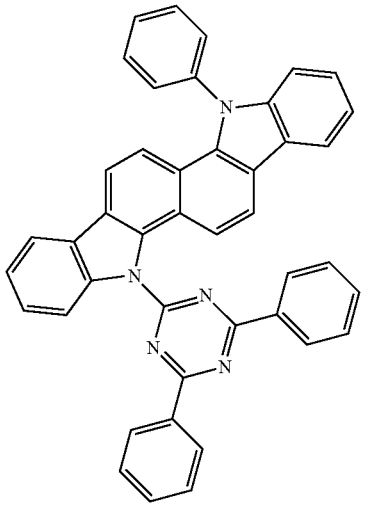
504
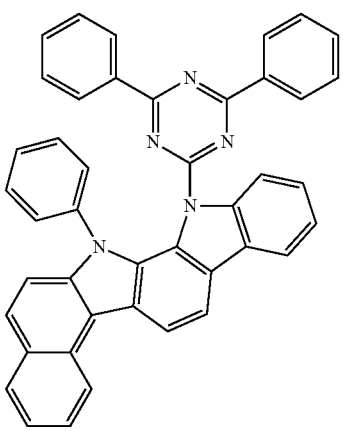
505
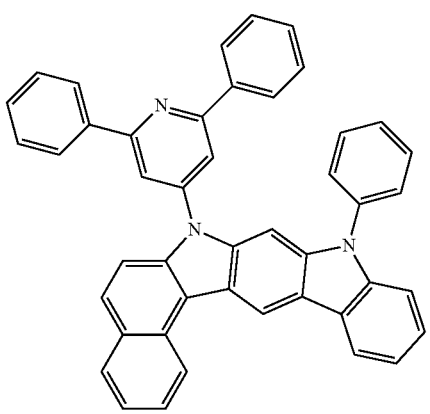
506

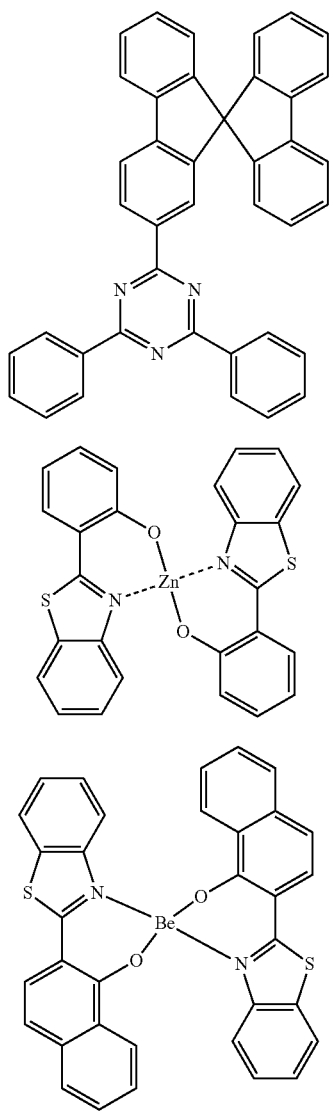

In some embodiments, an anthracene-based compound represented by Formula 400 below may be used as the host.

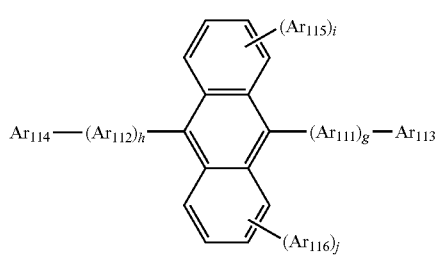

In Formula 400, $Ar_{111}$ and $Ar_{111}$ are each independently a substituted or unsubstituted $C_6$-$C_{60}$ arylene group; $Ar_{111}$ to $Ar_{116}$ are each independently a substituted or unsubstituted $C_1$-$C_{10}$ alkyl group, or a substituted or unsubstituted $C_5$-$C_{60}$ aryl group; and g, h, I, and j are each independently an integer from 0 to 4.

In some embodiments, $Ar_{111}$ and $Ar_{111}$ in Formula 400 may be each independently a phenylene group, a naphthylene group, a phenanthrenylene group, or a pyrenylene group; or a phenylene group, a naphthylene group, a phenanthrenylene group, a fluorenyl group, or a pyrenylene group that are substituted with at least one of a phenyl group, a naphthyl group, and an anthryl group.

In Formula 400 above, g, h, I, and j may be each independently 0, 1, or 2.

In some embodiments, $Ar_{111}$ to $Ar_{116}$ in Formula 400 may be each independently one of a $C_1$-$C_{10}$ alkyl group substituted with at least one of a phenyl group, a naphthyl group, and an anthryl group; a phenyl group; a naphthyl group; an anthryl group; a pyrenyl group; a phenanthrenyl group; a fluorenyl group; a phenyl group, a naphthyl group, an anthryl group, a pyrenyl group, a phenanthrenyl group, and a fluorenyl group that are substituted with at least one of a deuterium atom, a halogen atom, a hydroxyl group, a cyano group, a nitro group, an amino group, an amidino group, hydrazine, hydrazone, a carboxyl group or a salt thereof, a sulfonic acid group or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthryl group, a pyrenyl group, a phenanthrenyl group, and a fluorenyl group, but are not limited thereto.

In some embodiments, $Ar_{113}$ to $Ar_{116}$ in Formula 400 may be each independently one of a $C_1$-$C_{10}$ alkyl group substituted with at least one of a phenyl group, a naphthyl group, and an anthryl group; a phenyl group; a naphthyl group; an anthryl group; a pyrenyl group; a phenanthrenyl group; a fluorenyl group; a phenyl group, a naphthyl group, an anthryl group, a pyrenyl group, a phenanthrenyl group, and a fluorenyl group, each substituted with at least one of a deuterium atom, a halogen atom, a hydroxyl group, a cyano group, a nitro group, an amino group, an amidino group, hydrazine, hydrazone, a carboxyl group or a salt thereof, a sulfonic acid group or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthryl group, a pyrenyl group, a phenanthrenyl group, and a fluorenyl group; and

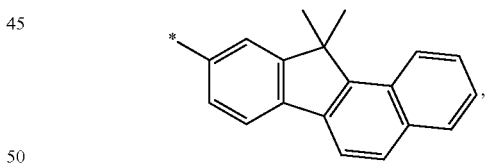

but are not limited thereto.

For example, the anthracene-based compound of Formula 400 above may be one of the compounds represented by the following formulae, but is not limited thereto:

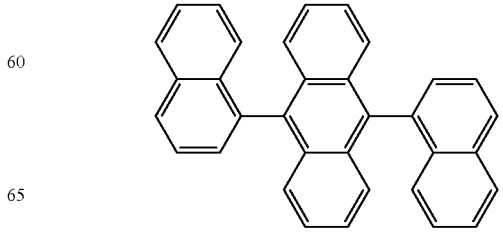

41
-continued
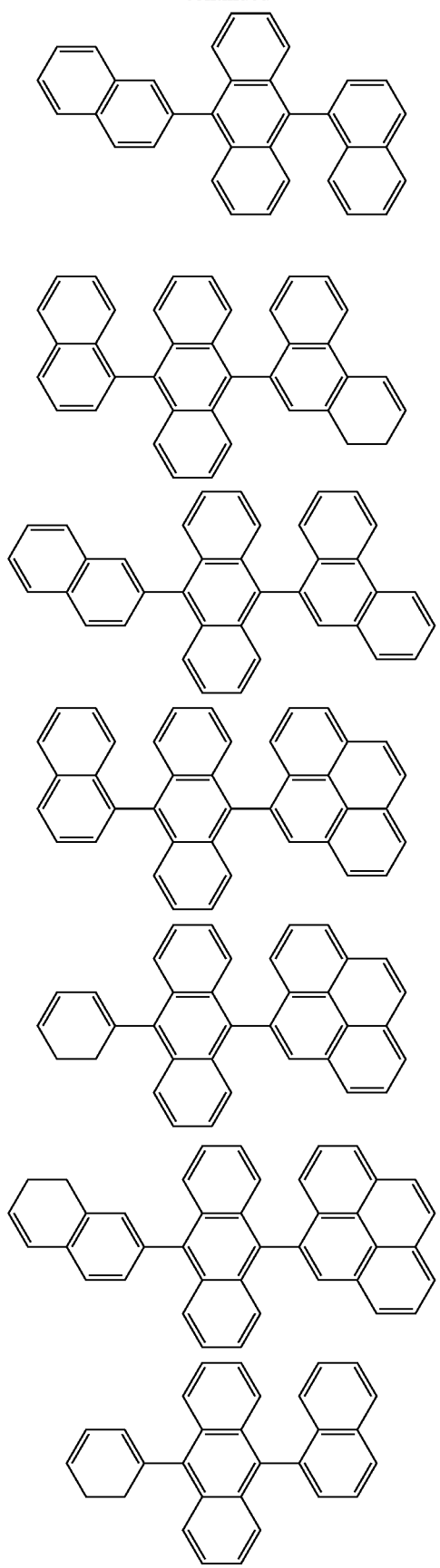
42
-continued
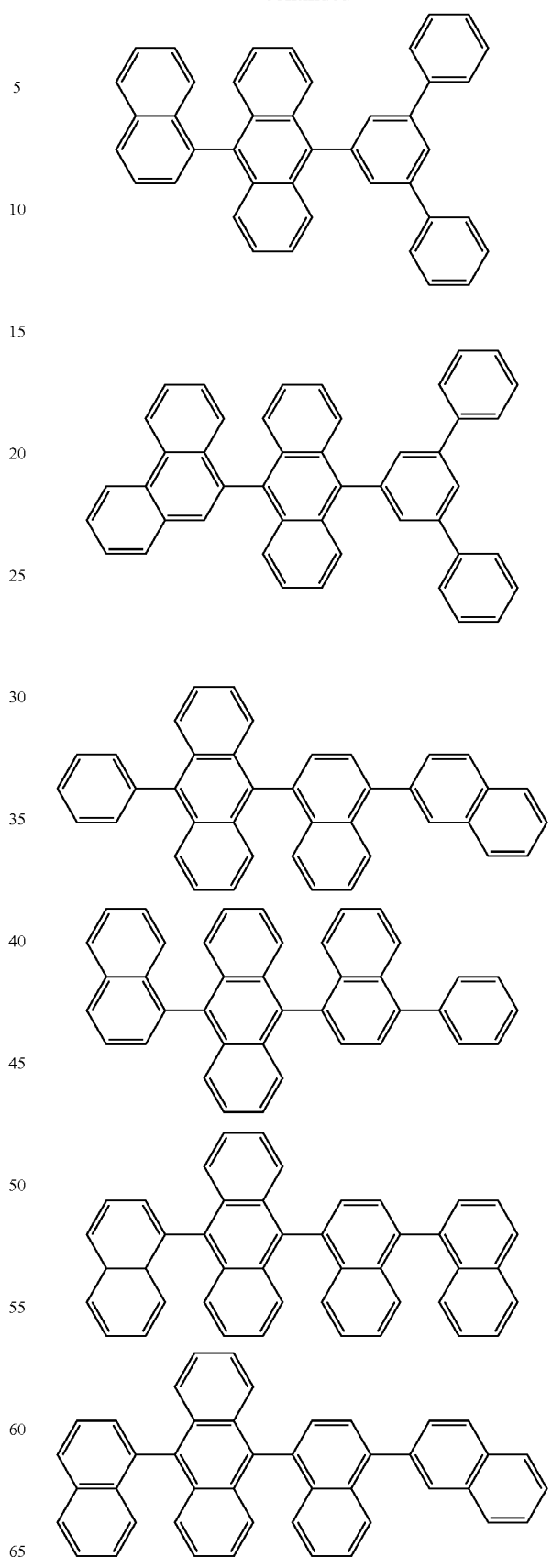

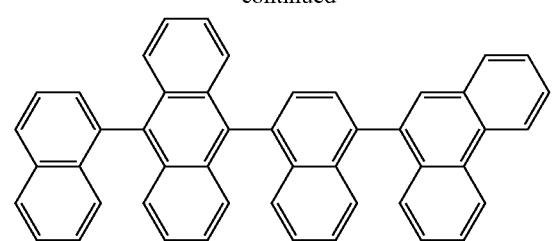
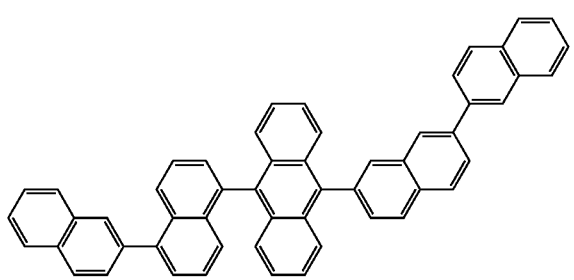
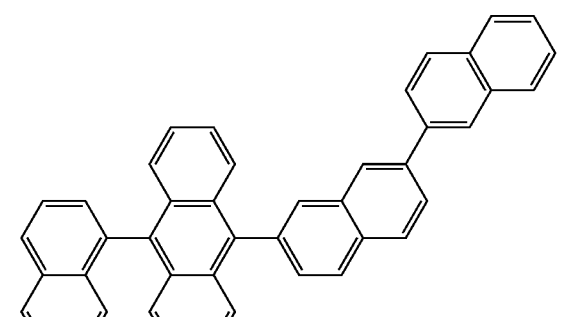
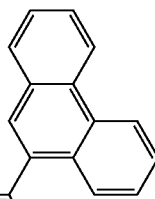
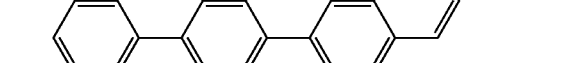

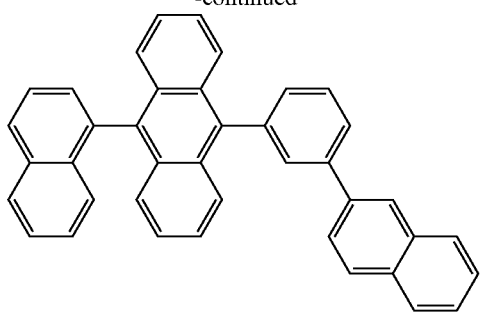
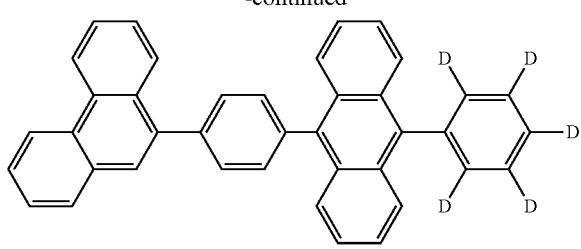
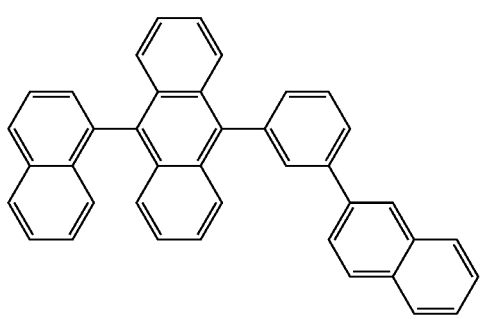
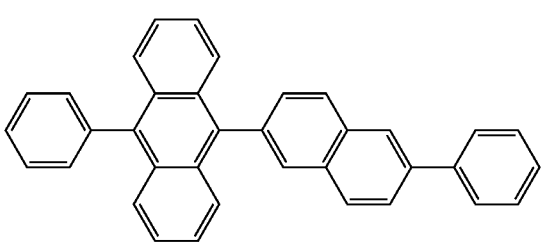
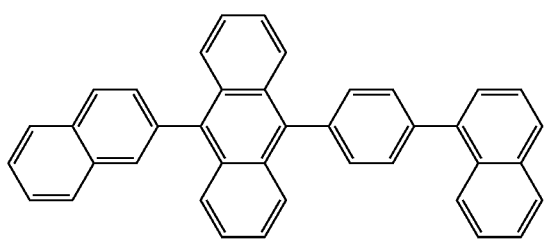
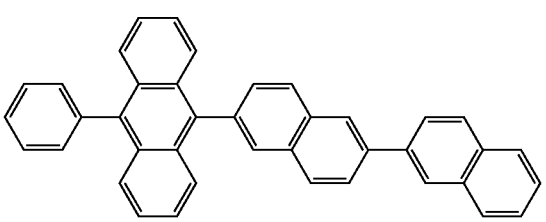
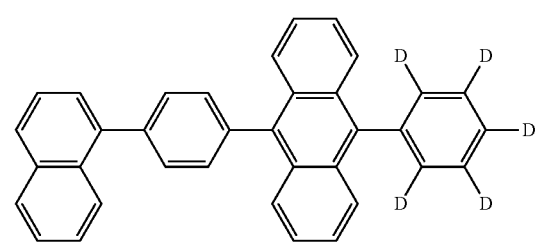
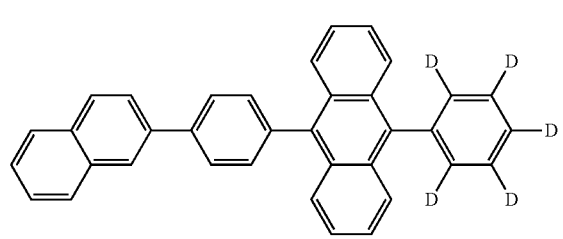
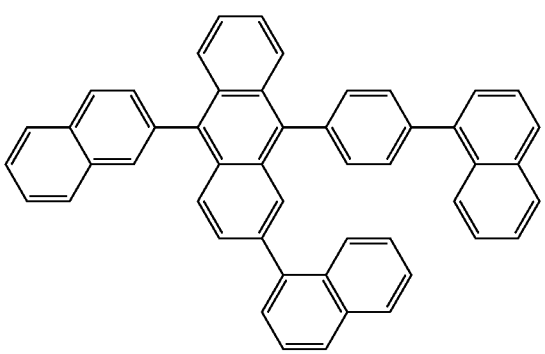

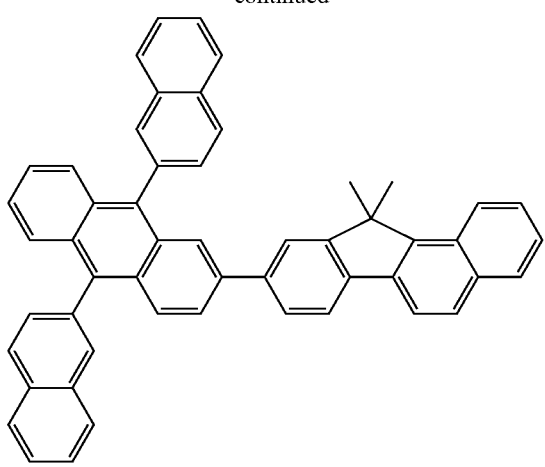

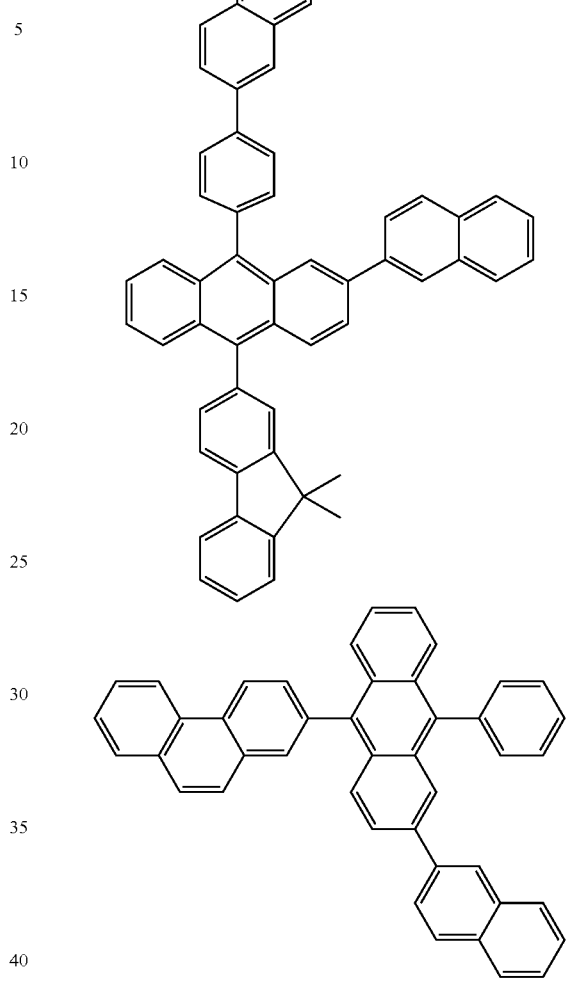

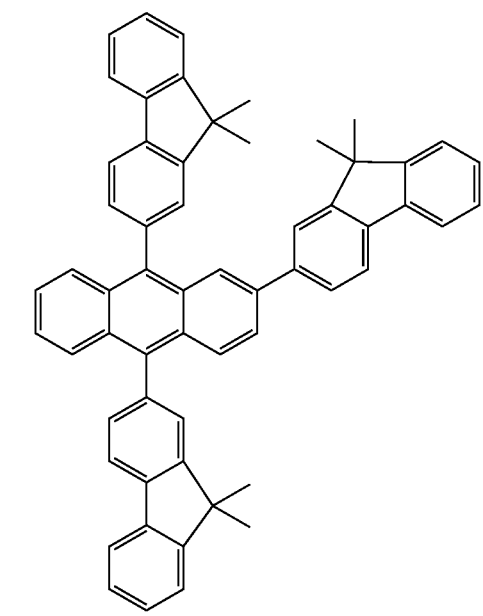

In some embodiments, an anthracene-based compound represented by Formula 401 below may be used as the host.

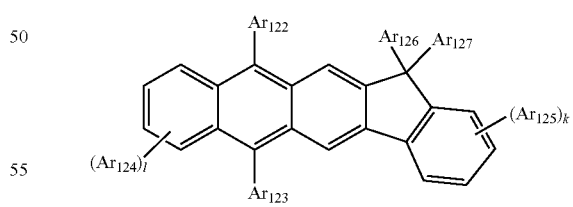

Formula 401

With regard to $Ar_{122}$ to $Ar_{125}$ in Formula 401, the above-detailed description of $Ar_{113}$ in Formula 400 may be referred to.

$Ar_{126}$ and $Ar_{111}$ in Formula 401 above may be each independently a $C_1$-$C_{10}$ alkyl group, for example, a methyl group, an ethyl group, or a propyl group.

In Formula 401, k and l may be each independently an integer from 0 to 4, for example, 0, 1, or 2.

For example, the anthracene compound of Formula 401 above may be one of the compounds represented by the following formulae, but is not limited thereto:

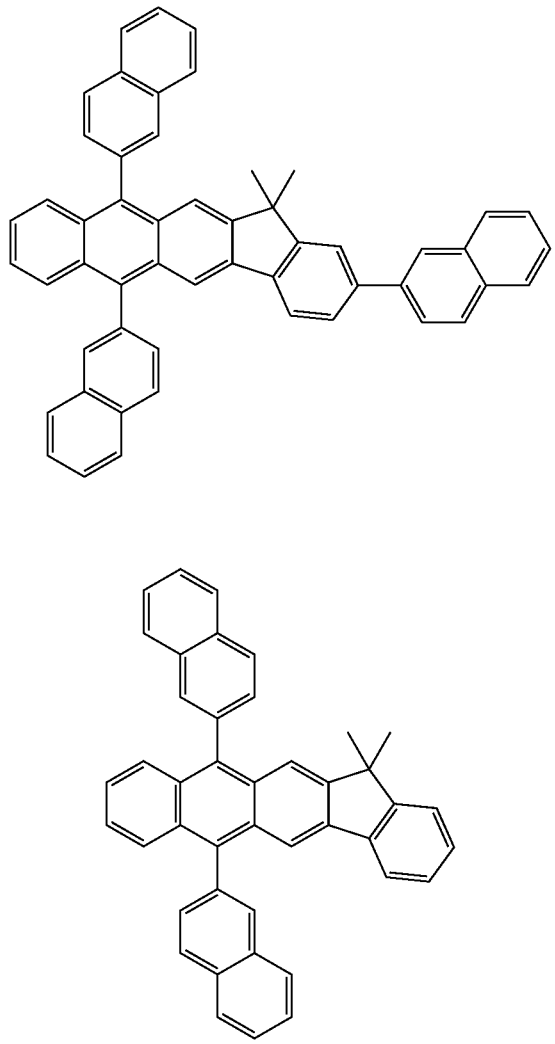

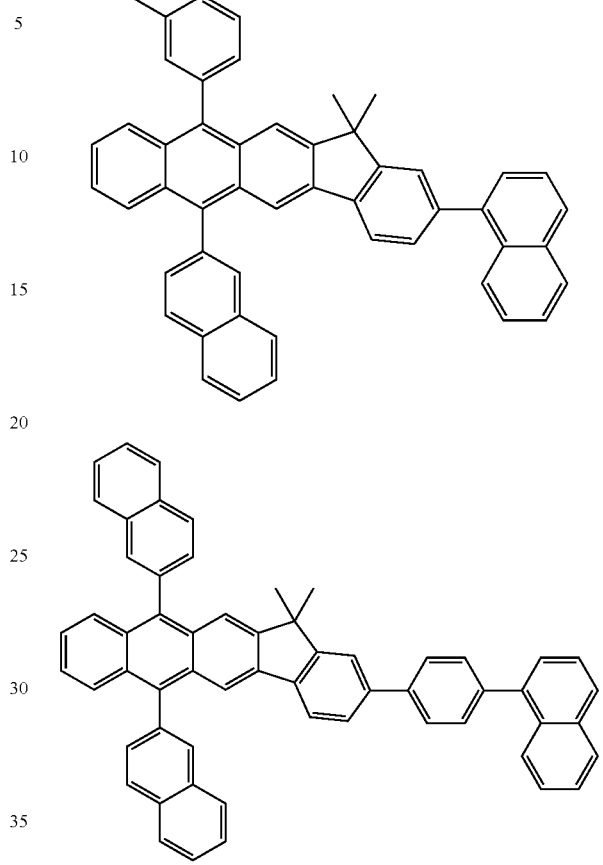

When the organic light-emitting device is a full color organic light-emitting device, the emission layer may be patterned into a red emission layer, a green emission layer, and a blue emission layer.

At least one of the red EML, the green EML, and the blue EML may include a dopant below (ppy=phenylpyridine).

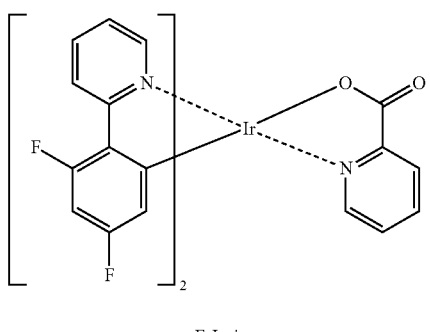

F₂Irpic

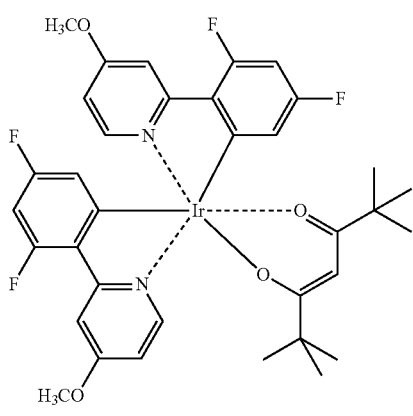

(F₂ppy)₂Ir(tmd)

51
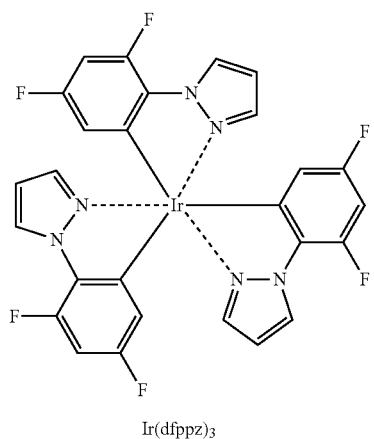
Ir(dfppz)₃
-continued
52
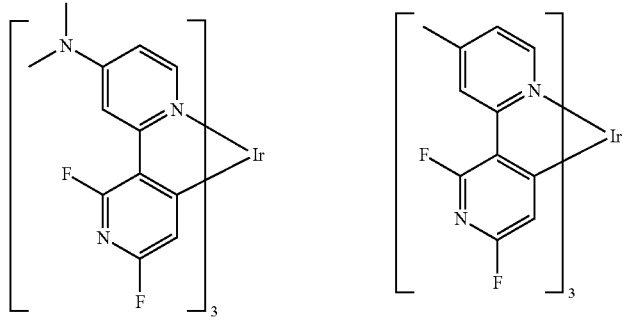
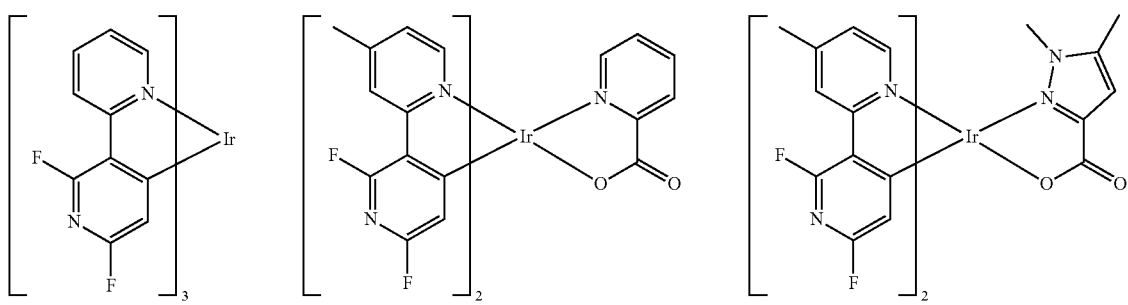
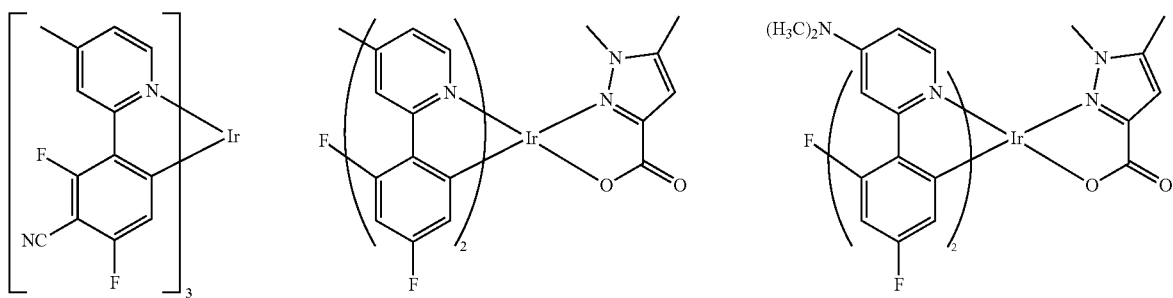
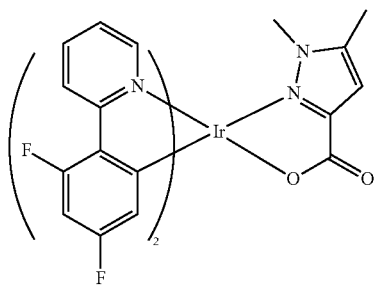
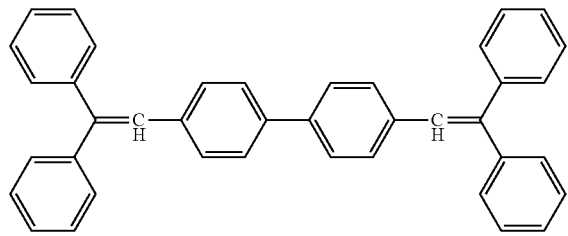
DPVBi

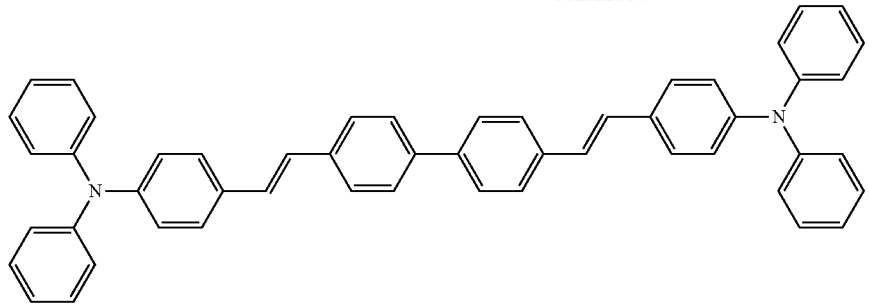
DPAVBi
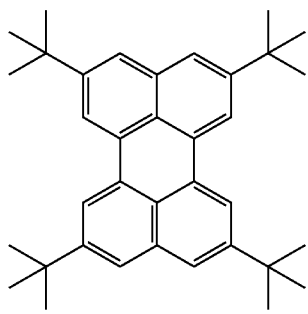
TBPe
Non-limiting examples of the red dopant are compounds represented by the following formulae.
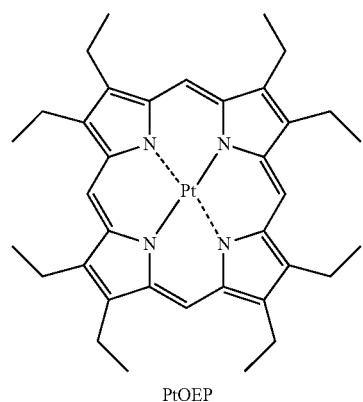
PtOEP
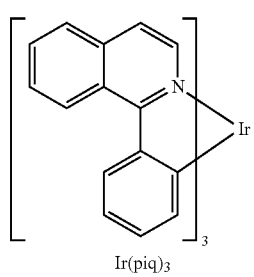
Ir(piq)₃
-continued
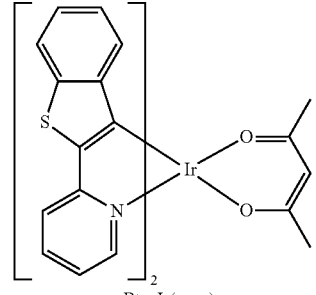
Btp₂Ir(acac)
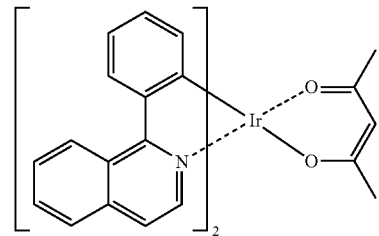
Ir(pq)₂(acac)

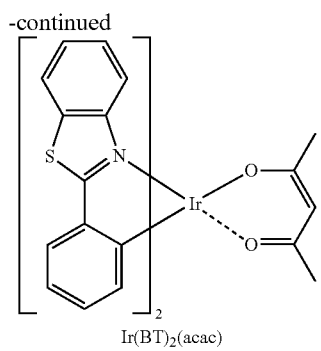
Ir(2-phq)₃
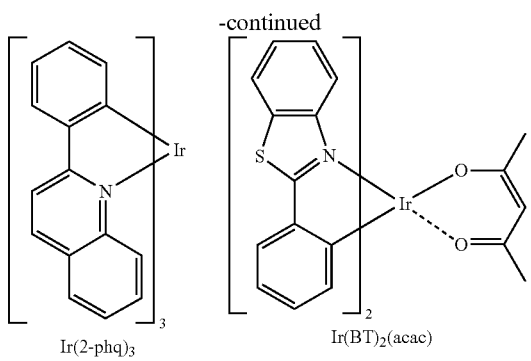
Ir(BT)₂(acac)
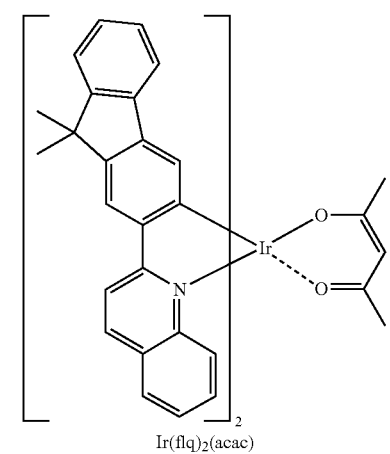
Ir(flq)₂(acac)
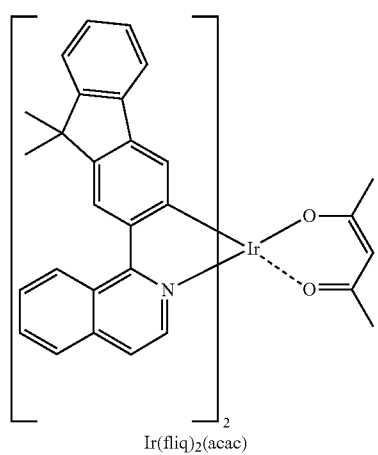
Ir(fliq)₂(acac)
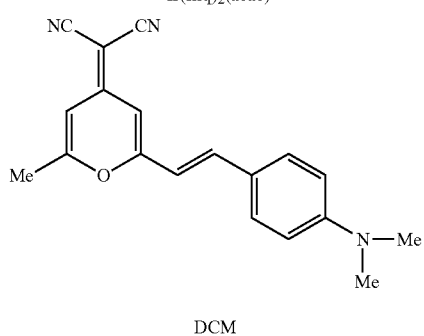
DCM
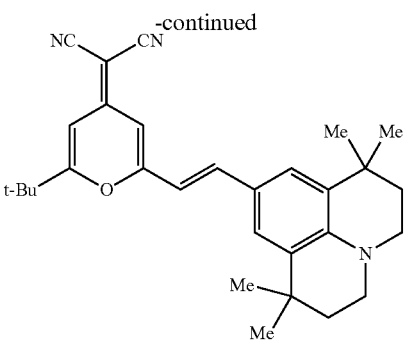
DCJTB
Non-limiting examples of the green dopant are compounds represented by the following formulae.
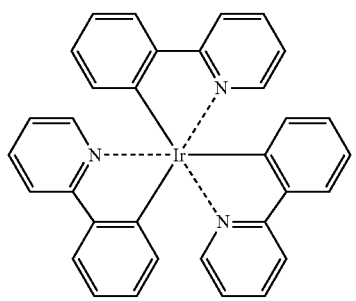
Ir(ppy)₃
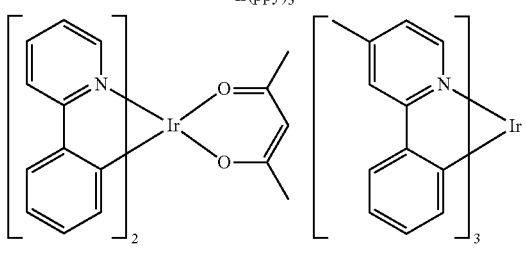
Ir(ppy)₂(acac)   Ir(mpyp)₃
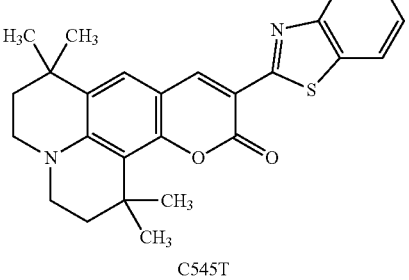
C545T
Non-limiting examples of the dopant that may be used in the EML are Pd-complexes or Pt complexes represented by the following formulae.
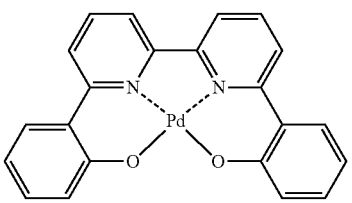
D1

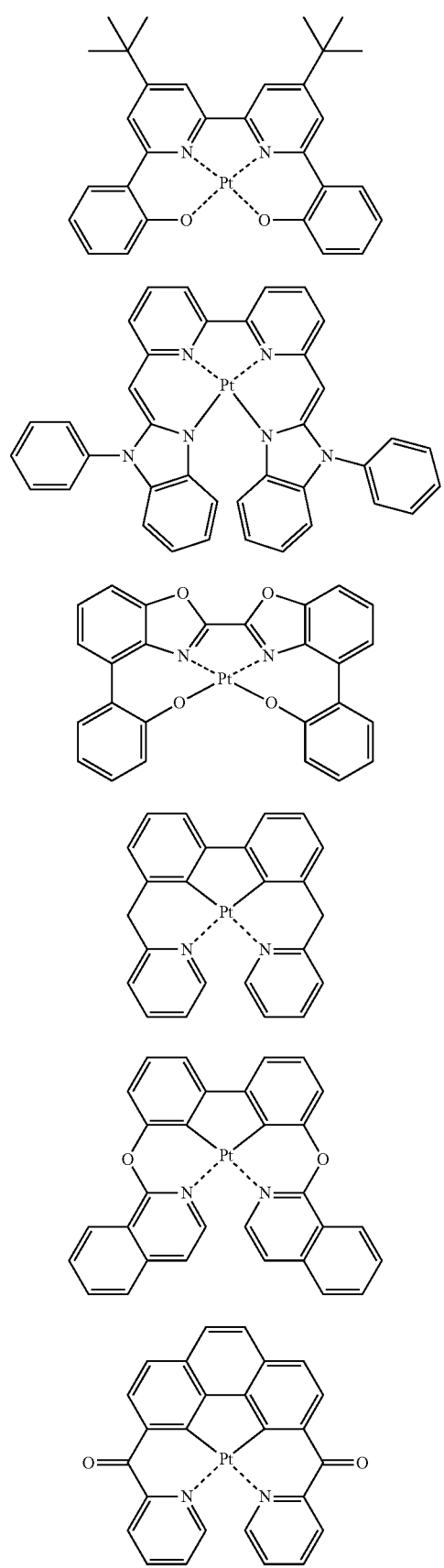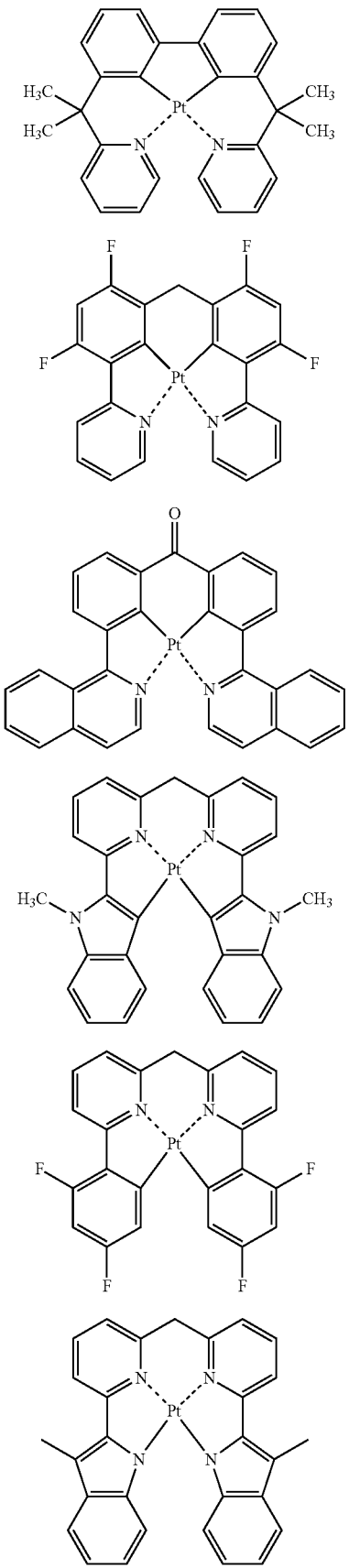

-continued
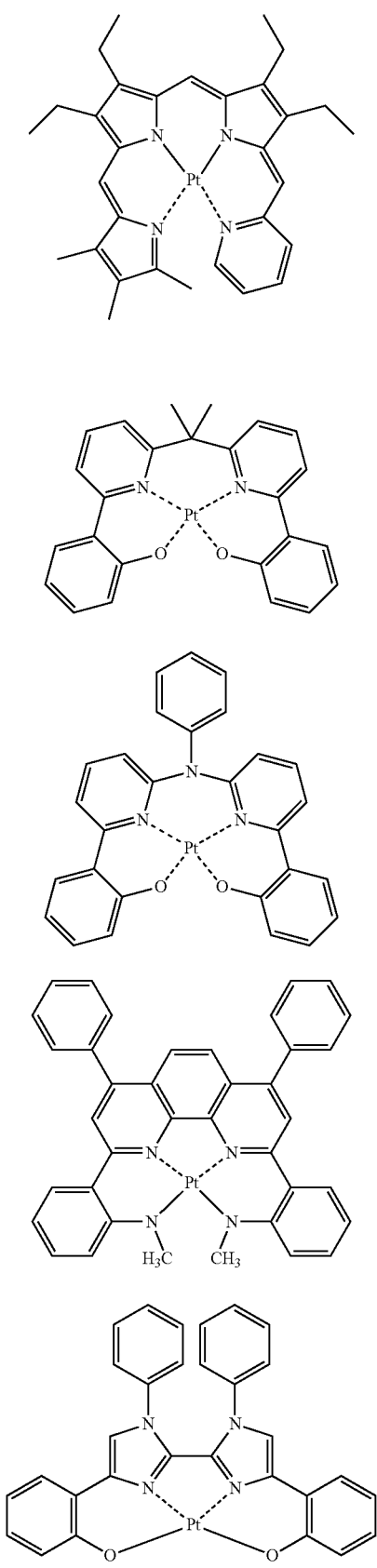
D14
D15
D16
D17
D18
-continued
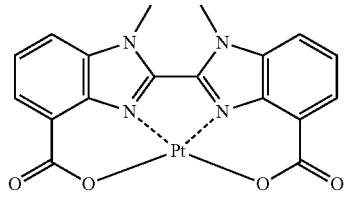
D19
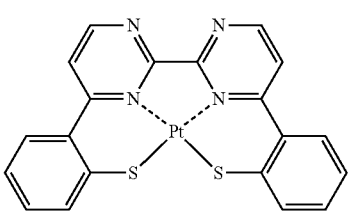
D20
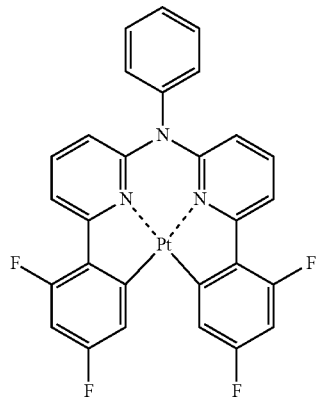
D21
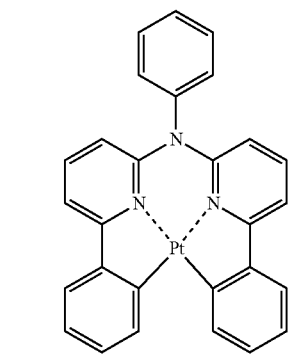
D22
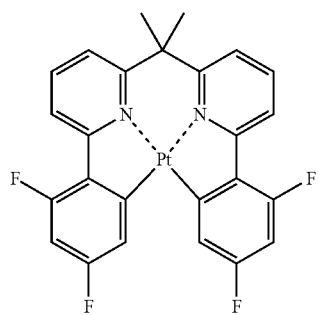
D23

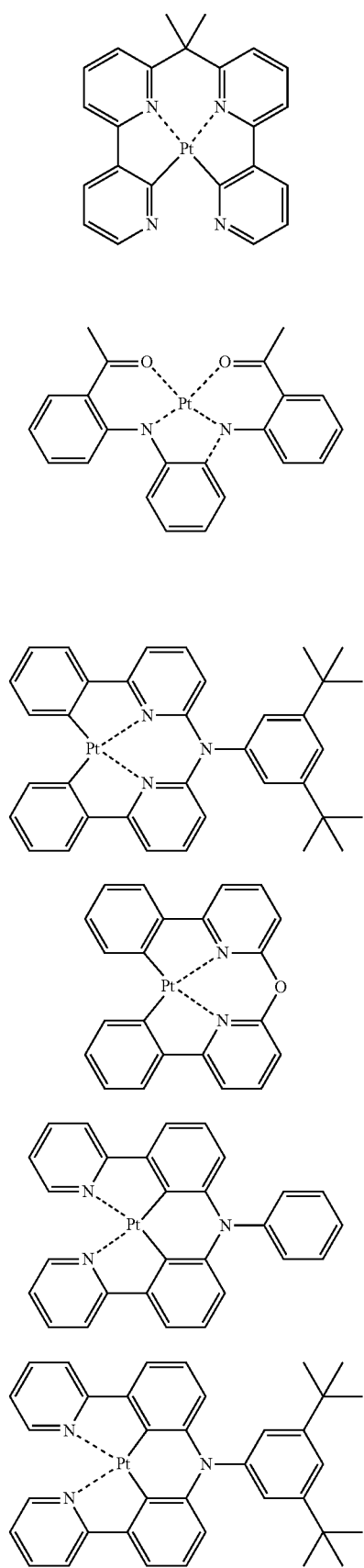
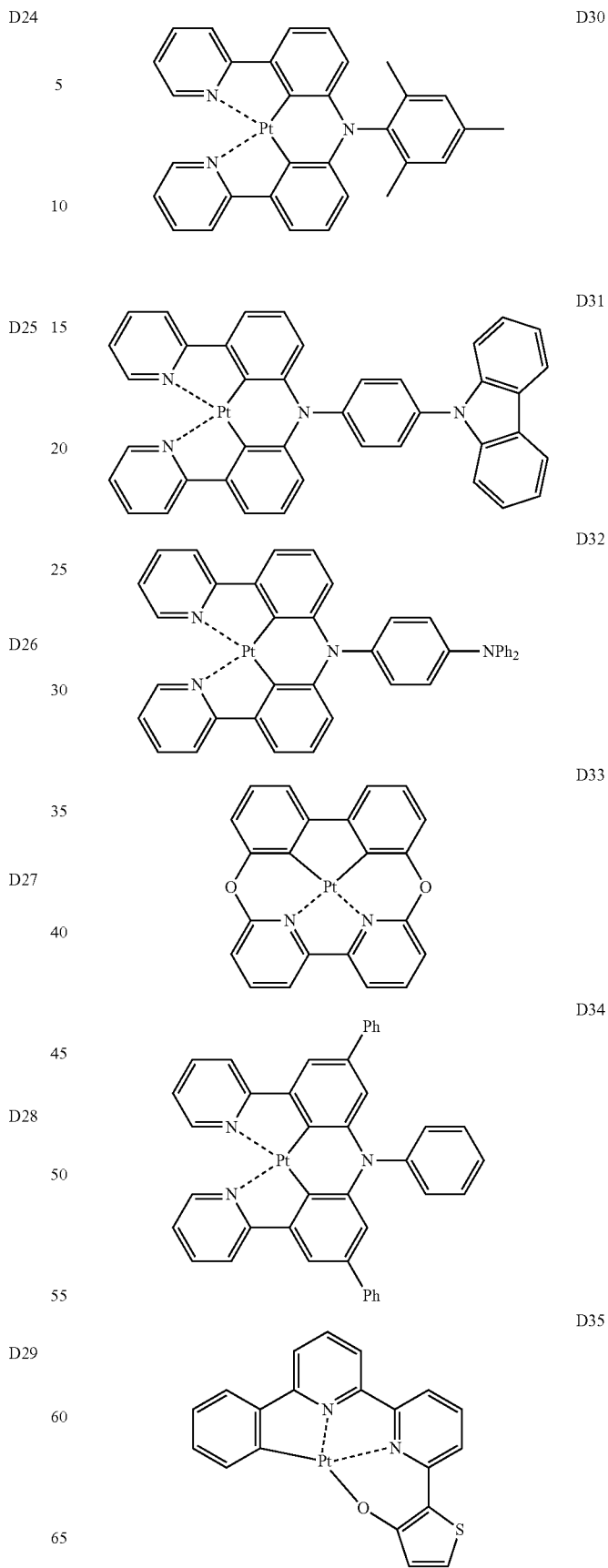

-continued
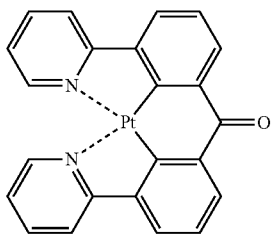
D36
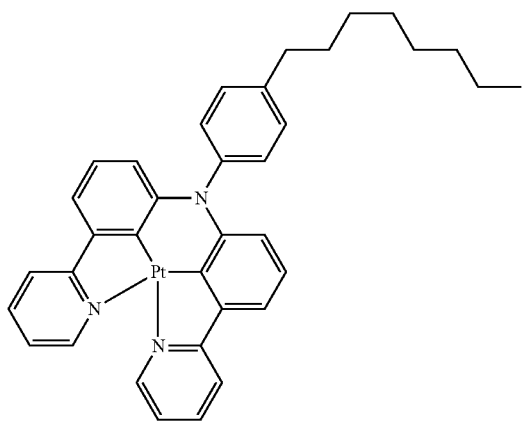
D37
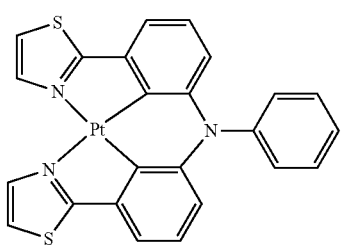
D38
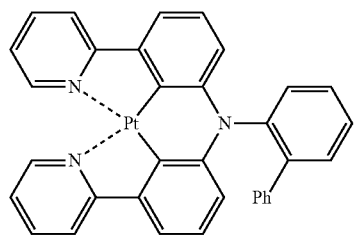
D39
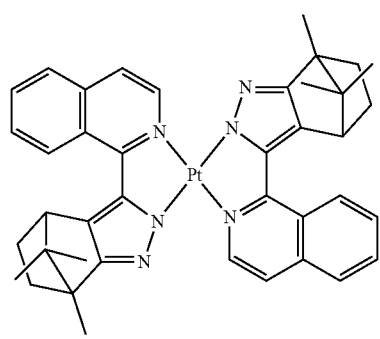
D40
-continued
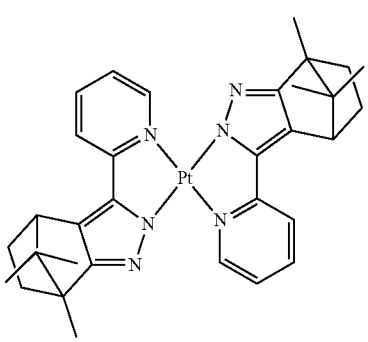
D41
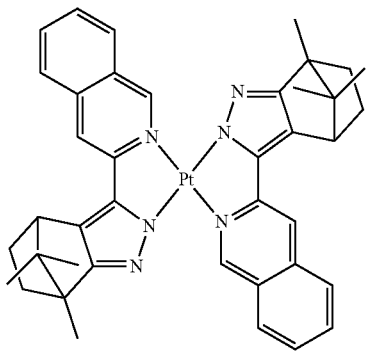
D42
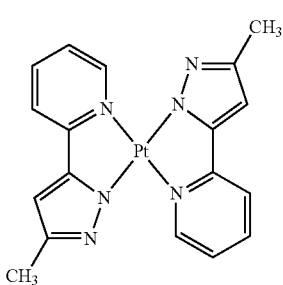
D43
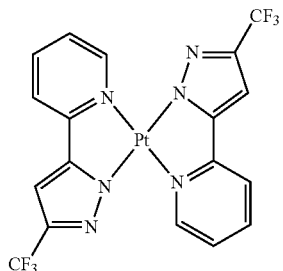
D44
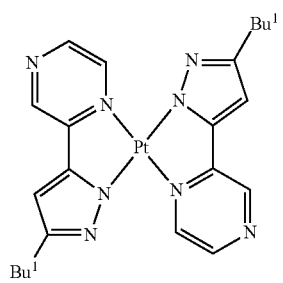
D45

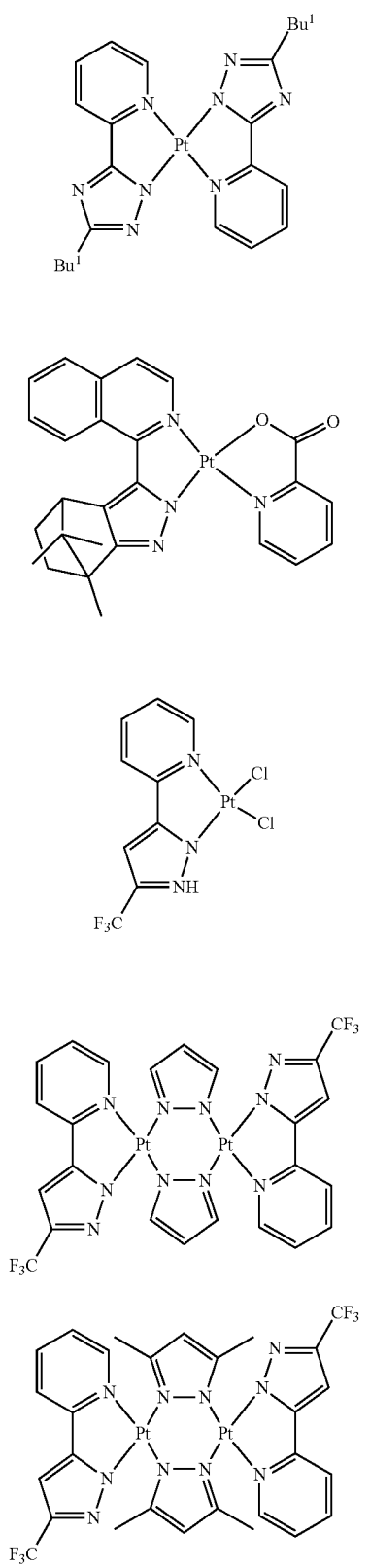

Os(fppz)₂(CO)₂

Os(fppz)₂(PPh₂Me)₂

Os(bppz)₂(PPh₃)₂

Os(fptz)₂(PPh₂Me)₂

Os(hptz)₂(PPh₂Me₂)₂

Non-limiting examples of the dopant that may be used in the EML are Os complexes represented by the following formulae.

When the EML includes both a host and a dopant, the amount of the dopant may be from about 0.01 to about 15 parts by weight based on 100 parts by weight of the host. However, the amount of the dopant is not limited to this range.

The thickness of the EML may be about 100 Å to about 1000 Å, and in some embodiments, may be from about 200 Å to about 600 Å. When the thickness of the EML is within these ranges, the EML may have good light emitting ability without a substantial increase in driving voltage.

Then, an ETL may be formed on the EML by vacuum deposition, spin coating, casting, or the like. When the ETL is formed using vacuum deposition or spin coating, the deposition and coating conditions may be similar to those for the formation of the HIL, though the deposition and coating conditions may vary according to a compound that is used to form the ETL. A material for forming the ETL may be the compound of Formula 1 above or any known material that can stably transport electrons injected from an electron injecting electrode (cathode). Non-limiting examples of materials for forming the ETL are a quinoline derivative, such as tris(8-quinolinorate)aluminum (Alq$_3$), TAZ, BAlq, beryllium bis(benzoquinolin-10-olate (Bebq$_2$), 9,10-di(naphthalene-2-yl)anthracene (DNA), Compound 201, and Compound 202.

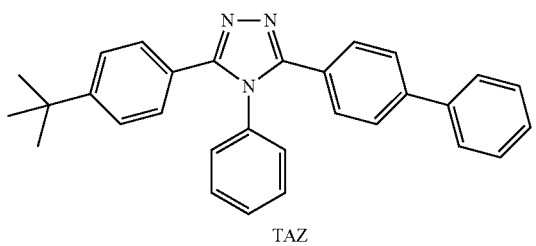

TAZ

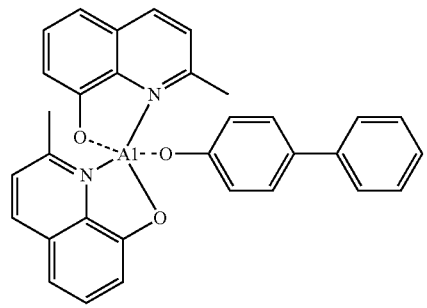

BAlq

<Compound 201>

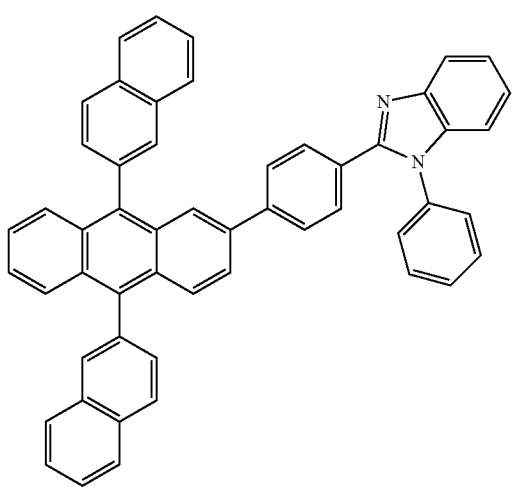

<Compound 202>

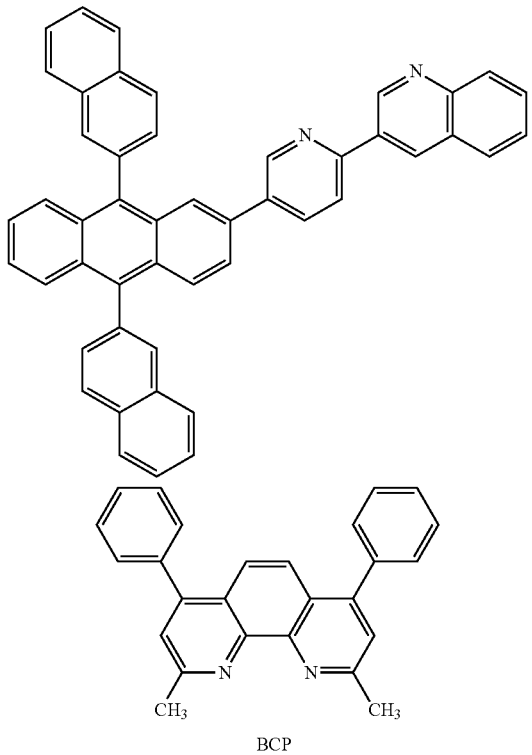

BCP

The thickness of the ETL may be from about 100 Å to about 1,000 Å, and in some embodiments, may be from about 150 Å to about 500 Å. When the thickness of the ETL is within these ranges, the ETL may have satisfactory electron transporting ability without a substantial increase in driving voltage.

In some embodiments the ETL may further include a metal-containing material, in addition to any known electron-transporting organic compound.

The metal-containing material may include a lithium (Li) complex. Non-limiting examples of the Li complex are lithium quinolate (LiQ) and Compound 203 below:

Compound 203

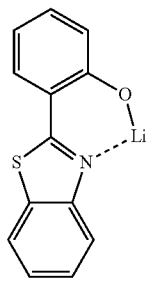

Then, an EIL, which facilitates injection of electrons from the cathode, may be formed on the ETL. The compound of Formula 1 above according to the embodiments may be used as a material for the EIL. Any suitable electron-injecting material may be used to form the EIL.

Non-limiting examples of materials for forming the EIL are LiF, NaCl, CsF, Li$_2$O, and BaO, which are known in the art. The deposition and coating conditions for forming the EIL 18 may be similar to those for the formation of the HIL, though the deposition and coating conditions may vary according to the material that is used to form the EIL 18.

The thickness of the EIL may be from about 1 Å to about 100 Å, and in some embodiments, may be from about 3 Å to about 90 Å. When the thickness of the EIL is within these ranges, the EIL may have satisfactory electron injection ability without a substantial increase in driving voltage.

Finally, the second electrode is disposed on the organic layer. The second electrode may be a cathode that is an electron injection electrode. A material for forming the second electrode may be a metal, an alloy, an electroconductive compound, which have a low work function, or a mixture thereof. In this regard, the second electrode 9 may comprise lithium (Li), magnesium (Mg), aluminum (Al), aluminum (Al)-lithium (Li), calcium (Ca), magnesium (Mg)-indium (In), magnesium (Mg)-silver (Ag), or the like, and may be formed as a thin film type transmission electrode. In some embodiments, to manufacture a top-emission light-emitting device, the transmission electrode may comprise indium tin oxide (ITO) or indium zinc oxide (IZO).

Although the organic light-emitting device of FIG. 1 is described above, the present embodiments are not limited thereto.

When a phosphorescent dopant is used in the EML, a HBL may be formed between the ETL and the EML or between the E-functional layer and the EML by using vacuum deposition, spin coating, casting, Langmuir-Blodgett (LB) deposition, or the like, in order to prevent diffusion of triplet excitons or holes into the ETL. When the HBL is formed using vacuum deposition or spin coating, the conditions for deposition and coating may be similar to those for the formation of the HIL, although the conditions for deposition and coating may vary according to the material that is used to form the HBL. Any known hole-blocking material may be used. Non-limiting examples of hole-blocking materials are oxadiazole derivatives, triazole derivatives, and phenanthroline derivatives. For example, bathocuproine (BCP) represented by the following formula may be used as a material for forming the HBL.

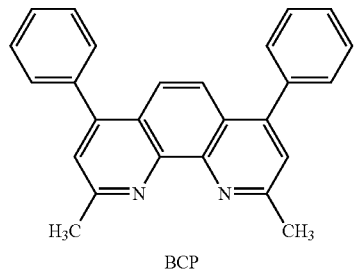

BCP

The thickness of the HBL may be from about 20 Å to about 1000 Å, and in some embodiments, may be from about 30 Å to about 300 Å. When the thickness of the HBL is within these ranges, the HBL may have improved hole blocking ability without a substantial increase in driving voltage.

According to embodiments, the organic light-emitting device may be included in various types of flat panel display devices, such as in a passive matrix organic light-emitting display device or in an active matrix organic light-emitting display device. In particular, when the organic light-emitting device is included in an active matrix organic light-emitting display device including a thin-film transistor, the first electrode on the substrate may function as a pixel electrode, electrically connected to a source electrode or a drain electrode of the thin-film transistor. Moreover, the organic light-emitting device may also be included in flat panel display devices having double-sided screens.

In some embodiments the organic layer of the organic light-emitting device may comprise the compound of Formula 1 by using a deposition method or may be formed using a wet method of coating a solution of the compound of Formula 1.

Hereinafter, the present embodiments will be described in detail with reference to the following synthesis examples and other examples. However, these examples are for illustrative purposes only and are not intended to limit the scope of the present embodiments.

EXAMPLES

Synthesis Example 1

Figure 2:
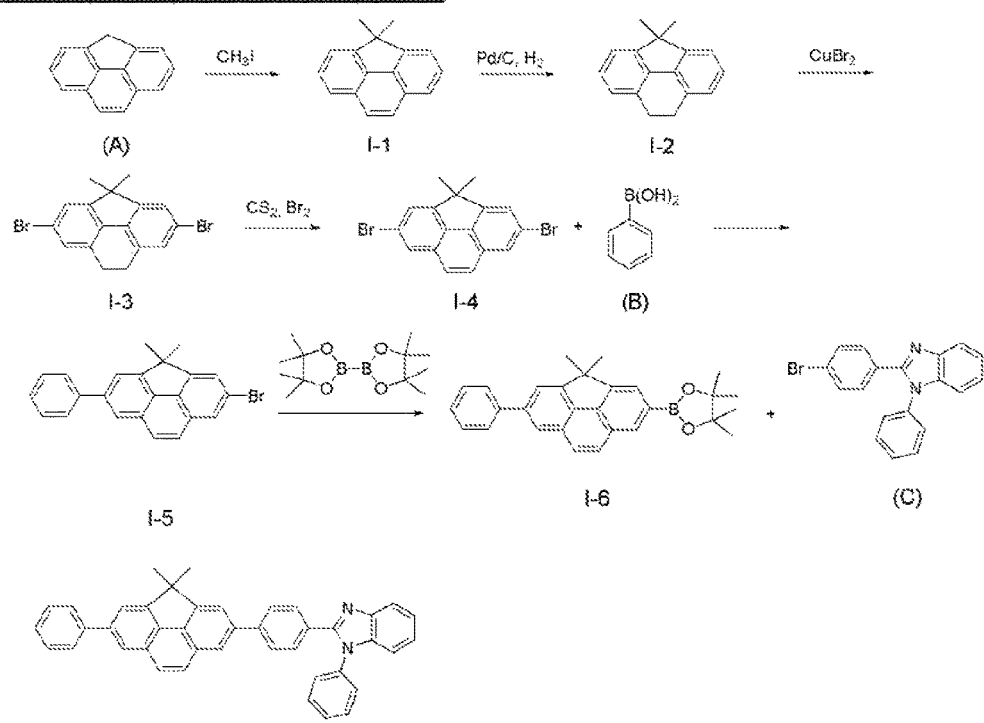
FIG. 2 illustrates a synthesis example of a compound, according to an embodiment.

Synthesis of Compound 5 (FIG. 2)

Synthesis of Intermediate I-1

After 3.80 g (20 mmol) of 4H-cyclopenta[def]phenanthrene (Compound A) was added with 20 mL of DMSO and 20 mL of a 50% sodium hydroxide solution, 2.96 g (21 mmol) of iodo methane was slowly added thereto. The mixed solution was reacted at room temperature for about 24 hours, and then extracted three times with 50 mL of water and 50 mL of diethylether. An organic layer was collected and was dried using magnesium sulfate to evaporate the solvent. The residue was separated and purified using silica gel column chromatography to obtain 3.70 g of Intermediate I-1 (Yield: 85%). This compound was identified using mass spectroscopy/fast atom bombardment (MS/FAB). $C_{17}H_{14}$: calc. 218.10. found 218.32.

Synthesis of Intermediate I-2

3.70 g (17.0 mmol) of Intermediate I-1 and 600 mg of a 10% palladium charcoal were dissolved in 100 mL of a mixed solution of methanol/methylene chloride (1:1 by volume), and then stirred in a hydrogen atmosphere at about 60 psi for about 15 hours. After the resulting product was filtered to remove the catalyst, the solvent was removed. The residue was separated and purified using silica gel column chromatography to obtain 3.52 g of Intermediate I-2 (Yield: 94%). This compound was identified using MS/FAB. $C_{15}H_{16}$: calc. 220.12. found 220.33.

Synthesis of Intermediate I-3

20 g of $CuBr_2$ was dissolved in 60 ml of distilled water to obtain an aqueous solution, and 40 g of neutralized alumina was added into the aqueous solution. After evaporating the solvent, the residue was kept at about 100° C. at a pressure of about 4 Torr for about 15 hours to obtain $CuBr_2$ adsorbed into the alumina. After 4.40 g (7.00 mmol) of Intermediate I-2 was dissolved in 140 mL of carbon tetrachloride, 62 g of $CuBr_2$ adsorbed in alumina was added into the solution at room temperature, stirred at about 60° C. for about 12 hours, and then filtered to obtain a solid content, which was then rinsed with 60 mL of carbon tetrachloride. The residue was separated and purified using silica gel column chromatography to obtain 2.14 g of Intermediate I-3 (Yield: 81%). This compound was identified using MS/FAB. [Representative Synthesis Example 17: Synthesis of Compound 14-H] 375.94. found 376.11

Synthesis of Intermediate I-4

2.14 g (5.66 mmol) of Intermediate I-3 was dissolved in 700 mL of $CS_2$, and 0.32 mL (6.22 mmol) of bromine ($Br_2$) dissolved in $CS_2$ was slowly dropwise added into the solution over about 3 hours. The resulting solution was stirred for about 1 hours and then concentrated in a vacuum to obtain a residue, which was then separated and purified using silica gel column chromatography to obtain 1.92 g of Intermediate I-4 (Yield: 90%). This compound was identified using MS/FAB. $C_{17}H_{12}Br_2$: calc. 373.93. found 374.14.

Synthesis of Intermediate I-5

1.92 g (5.09 mmol) of Intermediate I-4, 0.34 g (2.99 mmol) of phenyl boronic acid (Compound B), 0.29 g (0.25 mmol) of tetrakis(triphenylphosphine)palladium (Pd($PPh_3$)$_4$), and 0.62 g (4.48 mmol) of $K_2CO_3$ were dissolved in 60 mL of a mixed tetrahydrofuran (THF) and $H_2O$ (2:1 by volume) solution to obtain a solution, which was then stirred at about 70° C. for about 5 hours. The reaction solution was cooled down to room temperature, and 40 mL of water was added thereto, followed by three times of extraction with 50 mL of ethylether. An organic layer was collected and was dried using magnesium sulfate to evaporate the solvent. The residue was separated and purified using silica gel column chromatography to obtain 0.82 g of Intermediate I-5 (Yield: 74%). This compound was identified using MS/FAB. $C_{23}H_{17}Br$: calc. 372.05. found 372.19.

Synthesis of Intermediate I-6

3.72 g (10.0 mmol) of Intermediate I-5, 2.54 g (10.0 mmol) of bis(pinacolato)diborane, 0.36 g (0.5 mmol) of [1,1'-bis(diphenylphosphino)ferrocene]dichloro palladium (II) ($PdCl_2$(dppO$_2$)), and 2.94 g (30.0 mmol) of KOAc were dissolved in 40 mL of DMSO to obtain a solution, which was then stirred at about 80° C. for about 6 hours. The reaction solution was cooled down to room temperature, and then extracted three times with 50 mL of water and 50 mL of diethylether. An organic layer was collected and was dried using magnesium sulfate to evaporate the solvent. The residue was separated and purified using silica gel column chromatography to obtain 3.48 g of Intermediate I-6 (Yield: 80%). This compound was identified using MS/FAB. $C_{29}H_{29}BO_2$: calc. 420.22. found 420.45.

Synthesis of Compound 5

0.92 g (2.20 mmol) of Intermediate I-6, 0.69 g (2.20 mmol) of 2-(4-bromophenyl)-1-phenyl-1-benzoimidazole, 0.127 g (0.11 mmol) of tetrakis(triphenylphosphine)palladium (Pd($PPh_3$)$_4$), and 0.45 g (3.3 mmol) of $K_2CO_3$ were dissolved in 40 mL of a mixed tetrahydrofuran (THF) and $H_2O$ (2:1 by volume) solution to obtain a solution, which was then stirred at about 70° C. for about 5 hours. The reaction solution was cooled down to room temperature, and 30 mL of water was added thereto, followed by three times of extraction with 30 mL of ethylether. An organic layer was collected, and was dried using magnesium sulfate to evaporate the solvent. The residue was separated and purified using silica gel column chromatography to obtain 0.94 g of Compound 5 (Yield: 76%) This compound was identified using MS/FAB. $C_{42}H_{30}N_2$: calc. 562.24. found 563.33.

Synthesis Example 2

Synthesis of Compound 14

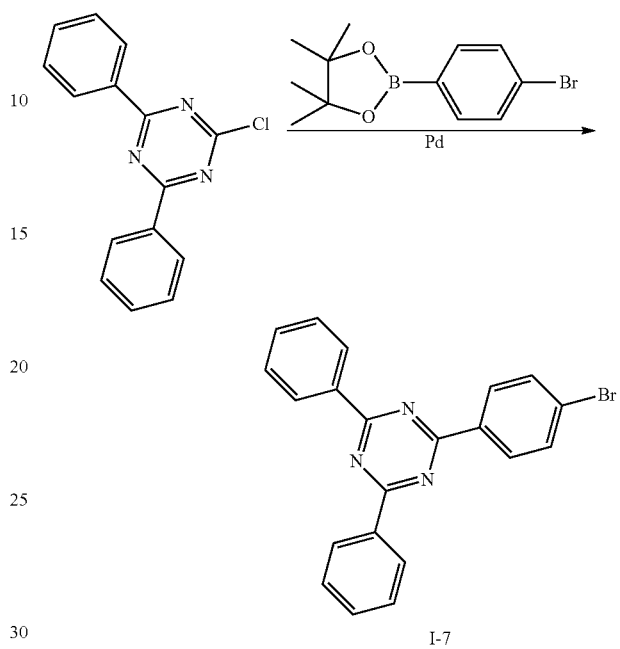

I-7

Synthesis of Intermediate I-7

2.68 g (10 mmol) of 2-chloro-4,6-diphenyl-[1,3,5]-triazine, 2.82 g (10.0 mmol) of 4-bromo-phenylboronic acid, 0.58 g (0.5 mmol) of Pd($PPh_3$)$_4$, and 4.14 g (30.0 mmol) of $K_2CO_3$ were dissolved in 60 mL of a mixed solution of THF and $H_2O$ (2:1 by volume) to obtain a solution, which was then stirred at about 70° C. for about 5 hours. The reaction solution was cooled down to room temperature, followed by three times of extraction with 60 mL of water and 60 mL of diethylether. An organic layer was collected, and was dried using magnesium sulfate to evaporate the solvent. The residue was separated and purified using silica gel column chromatography to obtain 2.56 g of Intermediate I-6 (Yield: 66%). This compound was identified using MS/FAB. $C_{22}H_{18}BrN_3$: calc. $403.06 \leq x \leq 403.22$

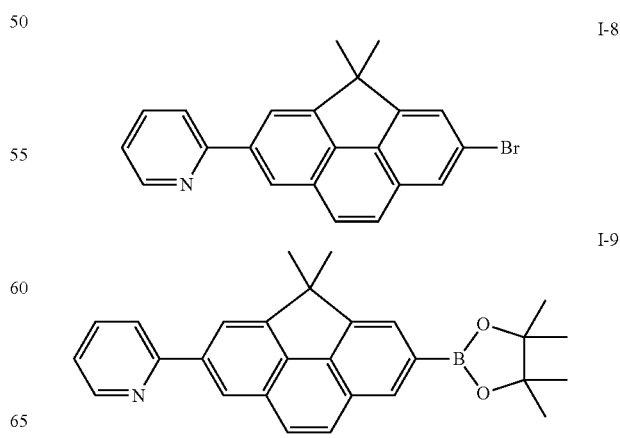

I-8

I-9

Synthesis of Intermediate I-8

Intermediate I-8 was synthesized in the same manner as in the synthesis of Intermediate I-5, except that 4-pyridineboronic acid instead of phenyl boronic acid was used. This compound was identified using MS/FAB. $C_{22}H_{16}BrN$: calc. 373.04. found 373.16.

Synthesis of Intermediate I-9

Intermediate I-9 was synthesized in the same manner as in the synthesis of Intermediate I-6, except that Intermediate I-8 instead of Intermediate I-5 was used. This compound was identified using MS/FAB. $C_{28}H_{28}BNO_2$: calc. 421.22. found 421.41.

Synthesis of Compound 14

Compound 14 was synthesized in the same manner as in the synthesis of Compound 5, except that Intermediate I-9 and Intermediate I-7 instead of Intermediate I-6 and 2-(4-bromophenyl)-1-phenyl-1-benzoimidazole, respectively, were used. This compound was identified using MS/FAB. $C_{44}H_{34}N_4$: calc. 618.27. found 619.36.

Synthesis Example 3

Synthesis of Compound 32

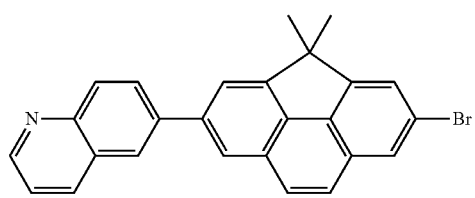
I-10

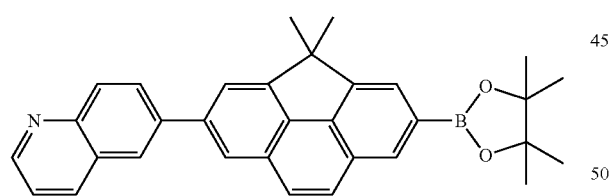
I-11

Synthesis of Intermediate I-10

Intermediate I-10 was synthesized in the same manner as in the synthesis of Intermediate I-5, except that 6-quinoline boronic acid instead of phenyl boronic acid was used. This compound was identified using MS/FAB. $C_{26}H_{18}BrN$: calc. 423.06. found 423.23.

Synthesis of Intermediate I-11

Intermediate I-11 was synthesized in the same manner as in the synthesis of Intermediate I-6, except that Intermediate I-10 instead of Intermediate I-5 was used. This compound was identified using MS/FAB. $C_{32}H_{30}BNO_2$: calc. 471.23. found 471.41.

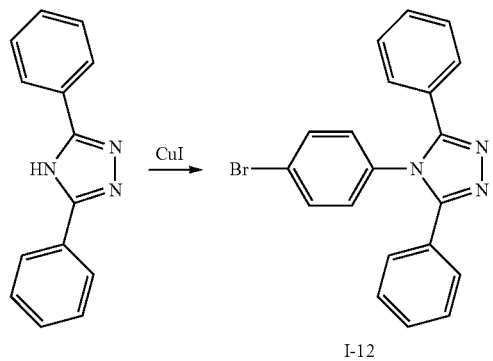
I-12

Synthesis of Intermediate I-12

2.21 g (10 mmol) of 3,5-diphenyl-[1,2,4]-triazole, 4.24 g (15.0 mmol) of 1-bromo-4-iodobenzene, 0.10 g (0.5 mmol) of CuI, 0.13 g (0.5 mmol) of 18-crown-6-ether, and 4.14 g (30.0 mmol) of $K_2CO_3$ were dissolved in 50 mL of 1,3-dimethyl-3,4,5,6-tetrahydro-2(1H)-pyrimidinone (DMPU) to obtain a solution, which was then stirred at about 170° C. for about 24 hours. The reaction solution was cooled to room temperature, followed by three times of extraction with 60 mL of water and 60 mL of dichloromethane. An organic layer was collected and was dried using magnesium sulfate to evaporate the solvent. The residue was separated and purified using silica gel column chromatography to obtain 2.56 g of Intermediate I-10 (Yield: 68%). This compound was identified using MS/FAB. $C_{20}H_{14}BrN_3$: calc. 375.03. found 375.16.

Synthesis of Compound 32

Compound 32 was synthesized in the same manner as in the synthesis of Compound 5, except that Intermediate I-11 and Intermediate I-12 instead of Intermediate I-6 and 2-(4-bromophenyl)-1-phenyl-1-benzoimidazole, respectively, were used. This compound was identified using MS/FAB. $C_{46}H_{32}N_4$: calc. 613.25. found 614.36.

Synthesis Example 4

Synthesis of Compound 45

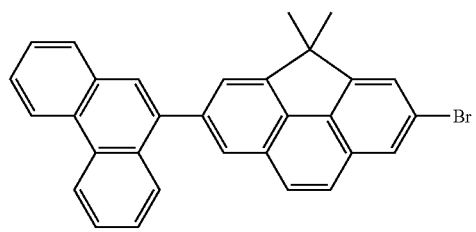
I-13

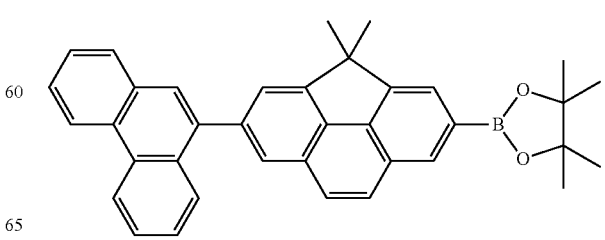
I-14

Synthesis of Intermediate I-13

Intermediate I-13 was synthesized in the same manner as in the synthesis of Intermediate I-5, except that 2-phenanthrene boronic acid instead of phenyl boronic acid was used. This compound was identified using MS/FAB. $C_{31}H_{21}BrN$: calc. 472.08. found 472.23.

Synthesis of Intermediate I-14

Intermediate I-14 was synthesized in the same manner as in the synthesis of Intermediate I-6, except that Intermediate I-13 instead of Intermediate I-5 was used. This compound was identified using MS/FAB. $C_{33}H_{33}BO_2$: calc. 520.25. found 520.36.

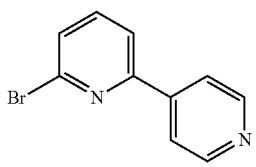

I-15

Synthesis of Intermediate I-15

Intermediate I-15 was synthesized in the same manner as in the synthesis of intermediate 1-5, except that 2,6-dibromopyridine and 4-pyridine boronic acid instead of Intermediate I-4 and 4-bromo-phenyl boronic acid, respectively, were used. This compound was identified using MS/FAB. $C_{10}H_{7}BrN_2$: calc. 233.97. found 234.06.

Synthesis of Compound 45

Compound 45 was synthesized in the same manner as in the synthesis of Compound 5, except that Intermediate I-14 and Intermediate I-15 instead of Intermediate I-6 and 2-(4-bromophenyl)-1-phenyl-1-benzoimidazole, respectively, were used. This compound was identified using MS/FAB. $C_{41}H_{18}N_2$: calc. 624.25. found 625.39.

Synthesis Example 5

Synthesis of Compound 55

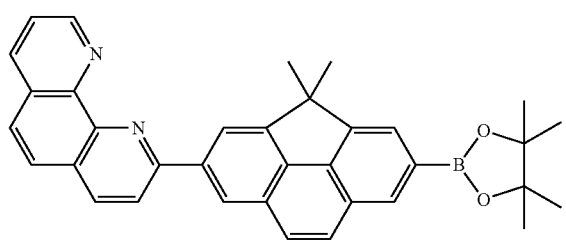

Synthesis of Intermediate I-6

Intermediate I-16 was synthesized in the same manner as in the synthesis of Intermediate I-5, except that 2-(9,10-phenanthroline)-boronic acid instead of phenyl boronic acid was used. This compound was identified using MS/FAB. $C_{12}H_{7}BrN_2$: calc. 257.97. found 258.03.

Synthesis of Intermediate I-17

Intermediate I-17 was synthesized in the same manner as in the synthesis of Intermediate I-6, except that Intermediate I-16 instead of Intermediate I-5 was used. This compound was identified using MS/FAB. $C_{35}H_{31}BN_2O_2$: calc. 522.24. found 522.38.

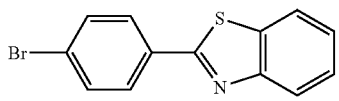

I-18

Synthesis of Intermediate I-18

Intermediate I-18 was synthesized in the same manner as in the synthesis of Intermediate I-5, except that 2-bromo-benzothiazole instead of Intermediate I-4 was used. This compound was identified using MS/FAB. $C_{13}H_{8}BrNS$: calc. 288.95. found 289.21.

Synthesis of Compound 55

Compound 55 was synthesized in the same manner as in the synthesis of Compound 5, except that Intermediate I-17 and Intermediate I-18 instead of Intermediate I-6 and 2-(4-bromophenyl)-1-phenyl-1-benzoimidazole, respectively, were used. This compound was identified using MS/FAB. $C_{42}H_{27}N_3S$: calc. 625.23. found 626.34.

Synthesis Example 6

Synthesis of Compound 60

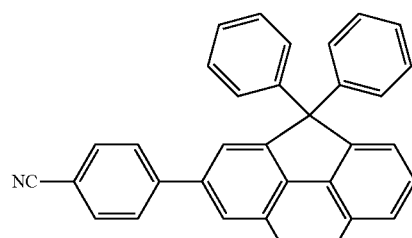

I-19

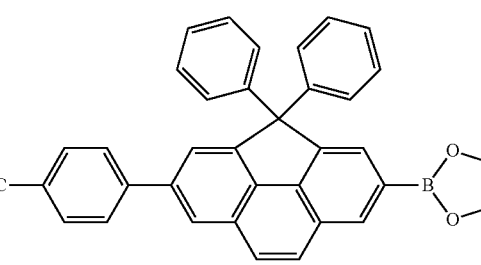

I-20

Synthesis of Intermediate I-19

Intermediate I-19 was synthesized in the same manner as in the synthesis of Intermediate I-5, except that 4-cyanophenyl boronic acid instead of phenyl boronic acid was used. This compound was identified using MS/FAB. $C_{34}H_{20}BrN$: calc. 522.43. found 522.65.

Synthesis of Intermediate I-20

Intermediate I-20 was synthesized in the same manner as in the synthesis of Intermediate I-6, except that Intermediate I-19 instead of Intermediate I-5 was used. This compound was identified using MS/FAB. $C_{40}H_{32}BNO_2$: calc. 569.25. found 569.42.

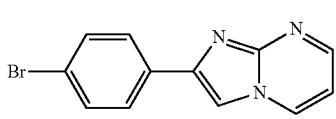

I-21

Synthesis of Intermediate I-21

Intermediate I-21 was synthesized in the same manner as in the synthesis of Intermediate I-5, except that 2-bromo-imidazo[1,2-a]pyrazine instead of Intermediate I-4 was used. This compound was identified using MS/FAB. $C_{12}H_8BrN_3$: calc. 272.99. found 273.31.

Synthesis of Compound 60

Compound 60 was synthesized in the same manner as in the synthesis of Compound 5, except that Intermediate I-20 and Intermediate I-21 instead of Intermediate I-6 and 2-(4-bromophenyl)-1-phenyl-1-benzoimidazole, respectively, were used. This compound was identified using MS/FAB. $C_{46}H_{28}N_4$: calc. 605.19. found 606.30.

Additional compounds were synthesized from suitable materials via the above-described synthetic pathways. Analysis data of these compounds obtained by $^1$H NMR and MS/FAB are shown in Table 1.

Synthetic pathways and source materials for the other compounds of Table 1 are obvious to one of ordinary skill in the art based on the synthetic pathways and source materials described above.

TABLE 1

| Compound | $^1$H NMR (CDCl$_3$, 400 MHz) | MS/FAB found | MS/FAB calc. |
|---|---|---|---|
| 3 | δ = 9.26-9.23 (m, 1H), 8.83-8.76 (m, 5H), 8.20-8.18 (m, 1H), 8.13 (d, 1H), 7.89 (d, 1H), 7.71-7.66 (m, 2H), 7.64-7.59 (m, 4H), 7.51-7.38 (m, 6H), 1.94 (d, 6H) | 526.33 | 525.22 |
| 5 | δ = 8.24-8.18 (m, 2H), 8.08-8.05 (m, 2H), 7.80-7.78 (m, 1H), 7.70-7.62 (m, 7H), 7.58-7.55 (m, 2H), 7.56-7.35 (m, 8H), 7.32-7.18 (m, 1H), 7.25-7.21 (m, 1H), 1.83(s, 6H) | 563.33 | 562.24 |
| 7 | δ = 8.80-8.78 (m, 1H), 8.87-8.70 (m, 1H), 8.20-8.18 (m, 1H), 7.97-7.95 (m, 1H), 7.87 (d, 1H), 7.79-7.68 (m, 3H), 7.65-7.58 (m, 5H), 7.30-7.27 (m, 1H), 1.90 (s, 6H) | 397.25 | 396.16 |
| 10 | δ = 8.80-8.78 (m, 1H), 8.71-8.69 (m, 1H), 8.50-8.48 (m, 1H), 8.43-8.41 (m, 1H), 8.22-8.20 (m, 1H), 8.16-8.13 (m, 2H), 7.98-7.96 (m, 1H), 7.90-7.87 (m, 2H), 7.83-7.68 (m, 5H), 7.54-7.52 (m, 1H), 7.30-7.27 (m, 2H), 1.90(s, 6H) | 489.35 | 488.20 |
| 11 | δ = 8.80-8.78 (m, 1H), 8.71-8.69 (m, 1H), 8.62-8.60 (m, 1H), 8.23-8.41 (m, 1H), 8.06-8.02 (m, 2H), 7.98-7.97 (m, 1H), 7.90-7.87 (m, 1H), 7.90-7.64 (m, 8H), 7.53-7.45 (m, 3H), 7.30-7.24 (m, 2H), 6.91-6.87 (m, 2H), 1.90(s, 6H) | 564.37 | 563.23 |
| 12 | δ = 8.80-8.78 (m, 1H), 8.71-8.67 (m, 1H), 8.16-8.14 (m, 1H), 8.08-8.06 (m, 2H), 7.98-7.96 (m, 1H), 7.90-7.87 (m, 1H), 7.81-7.76 (m, 2H), 7.74-7.64 (m, 5H), 7.58-7.54 (m, 2H), 7.49-7.48 (m, 1H), 7.41-7.20 (m, 6H), 1.90(s, 6H) | 564.38 | 563.23 |
| 14 | δ = 8.83-8.78 (m, 5H), 8.73-8.70 (m, 1H), 8.63-8.58(m, 2H), 8.23-8.21 (m, 1H), 7.97-7.96 (m, 1H), 7.94-7.87 (m, 3H), 7.79-7.68 (m, 3H), 7.63-7.59 (m, 4H), 7.53-7.52 (m, 1H), 7.42-7.35 (m, 2H), 7.30-7.28 (m, 1H), 1.91 (s, 6H). | 619.36 | 618.27 |
| 17 | δ = 9.17-9.15 (m, 1H), 9.08-9.07 (m, 1H), 8.80-8.78 (m, 1H), 8.71-8.69 (m, 1H), 8.66-8.64 (m, 1H), 8.49-8.48 (m, 1H), 8.17-8.16 (m, 1H), 8.12-8.08 (m, 2H), 8.06-8.03 (m, 2H), 7.98-7.97 (m, 1H), 7.89-7.87 (m, 2H), 7.80-7.70 (m, 2H), 7.55-7.52 (m, 1H), 7.42-7.41 (m, 1H), 7.30-7.27 (m, 1H), 1.94 (s, 6H) | 516.32 | 515.23 |
| 19 | δ = 8.93-8.91 (m, 1H), 8.89-8.87 (m, 1H), 8.49-8.47 (m, 2H), 8.45-8.43 (m, 1H), 8.04 (d, 1H), 7.95-7.93 (m, 1H), 7.85-7.83 (m, 2H), 7.79-7.75 (m, 6H), 7.70-7.67 (m, 4H), 7.55-7.53 (m, 1H), 1.90 (s, 6H) | 575.32 | 574.21 |
| 22 | δ = 8.94-8.88 (m, 3H), 8.48-8.47 (m, 2H), 8.08-8.05 (m, 2H), 7.98-7.96 (m, 2H), 7.91-7.88 (m, 2H), 7.85-7.84 (m, 1H), 7.82-7.77 (m, 2H), 7.72-7.70 (m, 1H), 7.44-7.43 (m, 1H), 7.35-7.30 (m, 1H), 7.16-7.10 (m, 2H), 1.90 (s, 6H), 1.63 (s, 6H) | 566.33 | 565.25 |
| 23 | δ = 8.92-8.90 (m, 2H), 8.49-8.48 (m, 1H), 8.49-8.46 (m, 2H), 8.16-8.14 (m, 2H), 8.08-8.07 (m, 1H), 8.04 (d, 1H), 7.94 (dd, 1H), 7.90-7.81 (m, 4H), 7.76-7.70 (m, 4H), 7.49-7.40 (m, 7H), 1.90 (s, 6H) | 602.35 | 601.25 |
| 25 | δ = 8.94-8.88 (m, 2H), 8.49-8.44 (m, 2H), 8.34-8.29 (m, 2H), 8.23-8.21 (m, 1H), 8.05-8.02 (m, 2H), 7.89-7.85 (m, 2H), 7.77-7.68 (m, 3H), 7.56-7.54 (m, 1H), 7.47-7.43 (m, 1H), 7.37-7.33 (m, 1H), 1.92 (s, 6H) | 506.25 | 505.16 |
| 26 | δ = 8.92-8.88 (m, 2H), 8.49-8.46 (m, 2H), 8.27-8.21 (m, 3H), 8.04 (d, 1H), 7.91-7.85 (m, 3H), 7.72-7.68 (m, 2H), 7.53-7.52 (m, 1H), 7.45-7.39 (m, 2H), 7.29-7.23 (m, 1H), 1.91 (s, 6H) | 490.23. | 489.18 |

TABLE 1-continued

| Compound | ¹H NMR (CDCl₃, 400 MHz) | MS/FAB found | MS/FAB calc. |
|---|---|---|---|
| 27 | δ = 8.94-8.88 (m, 2H), 8.49-8.46 (m, 2H), 8.16-8.10 (m, 3H), 8.04 (d, 1H), 7.85-7.83 (m, 1H), 7.69 (d, 1H), 7.49-7.43 (m, 3H), 7.37-7.25 (m, 8H), 1.94 (s, 6H) | 538.33 | 537.22 |
| 32 | δ = 8.73 (dd, 1H), 8.24-8.13 (m, 5H), 8.08-8.01 (m, 3H), 7.80-7.78 (m, 1H), 7.68-7.61 (m, 5H), 7.57-7.53 (m, 3H), 7.45-7.20 (m, 7H), 1.83 (s, 6H) | 614.36 | 613.25 |
| 34 | δ = 8.74 (dd, 1H), 8.25-8.13 (m, 5H), 8.03-8.01 (m, 1H), 7.68-7.61 (m, 4H), 7.48 (d, 1H), 7.44 (d, 1H), 7.42-7.40 (m, 4H), 7.35-7.28 (m, 9H), 1.83 (s, 6H) | 641.38 | 640.26 |
| 36 | δ = 8.88-8.86 (m, 1H), 8.74 (dd, 1H), 8.45 (td, 2H), 8.24-8.13 (m, 4H), 8.07-7.99 (m, 4H), 7.84 (dd, 1H), 7.75-7.72 (m 1H), 7.68-7.66 (m, 3H), 7.55 (d, 1H), 7.44 (td, 1H), 7.34-7.31 (m, 1H), 1.83 (s, 6H), 1.61 (s, 6H) | 616.37 | 615.26 |
| 37 | δ = 8.74-8.73 (m, 1H), 8.24-8.13 (m, 4H), 8.08-7.98 (m, 4H), 7.92 (d, 1H), 7.85-7.83 (m, 2H), 7.75-7.73 (m, 2H), 7.70-7.69 (m 1H), 7.45-7.31 (m, 3H), 6.49-6.47 (m, 1H), 7.44 (td, 1H), 7.34-7.31 (m, 1H), 1.84 (s, 6H), 1.64 (s, 6H) | 604.39 | 603.26 |
| 40 | δ = 8.84-8.82 (m, 1H), 8.73 (dd, 1H), 8.61 (dd, 1H), 8.25-8.10 (m, 5H), 8.03-7.90 (m, 5H), 7.79-7.75 (m 2H), 7.71-7.65 (m, 4H), 7.54-7.51 (m, 1H), 7.45-7.41 (m, 2H), 7.34-7.31 (m, 1H), 1.89 (s, 6H) | 605.22 | 604.19 |
| 41 | δ = 8.83-8.81 (m, 1H), 8.73 (dd, 1H), 8.46-8.43 (m, 2H), 8.29-8.08 (m, 6H), 8.03-7.98 (m, 2H), 7.91 (d 1H), 7.80-7.75 (m, 3H), 7.71-7.65 (m, 2H), 7.46-7.42 (m, 2H), 7.38-7.31 (m, 2H), 1.88 (s, 6H) | 588.33 | 588.22 |
| 42 | δ = 9.05-9.03 (m, 1H), 8.82-8.81 (m, 1H), 7.74 (dd, 1H), 8.24-8.13 (m, 6H), 8.09-8.00 (m, 4H), 7.90-7.76 (m, 4H), 7.63 (dd, 1H), 7.51-7.45 (m, 4H), 7.39-7.31 (m, 4H), 7.21-7.19 (m, 1H), 1.91 (s, 6H) | 664.39 | 663.26 |
| 44 | δ = 9.23-9.22 (m, 1H), 8.82-8.79 (m, 5H), 8.64 (td, 1H), 8.55-8.53 (m, 1H), 8.35-8.34 (m, 1H), 8.23-8.20 (m, 1H), 8.11 (d, 1H), 7.81-7.79 (m, 1H), 7.69-7.59 (m, 8H), 7.54-7.50 (m, 2H), 7.42-7.38 (m, 2H), 7.18-7.14 (m, 1H), 1.93 (s, 6H) | 626.37 | 625.25 |
| 45 | δ = 8.83-8.81 (m, 1H), 8.73 (dd, 1H), 8.46-8.43 (m, 2H), 8.29-8.08 (m, 6H), 8.03-7.98 (m, 2H), 7.91 (d 1H), 7.80-7.75 (m, 3H), 7.71-7.65 (m, 2H), 7.46-7.42 (m, 2H), 7.38-7.31 (m, 2H), 1.88 (s, 6H) | 625.39 | 624.25 |
| 47 | δ = 8.65-8.63 (m, 1H), 8.55-8.53 (m, 1H), 8.35-8.33 (m, 1H), 8.16-8.14 (m, 1H), 8.08-7.04 (m, 2H), 7.83-7.78 (m, 2H), 7.71-7.61 (m, 7H), 7.57-7.48 (m, 5H), 7.41-7.28 (m, 6H), 7.25-7.14 (m, 2H), 1.90 (s, 6H) | 663.31 | 662.27 |
| 48 | δ = 8.65-8.63 (m, 1H), 8.55-8.53 (m, 1H), 8.48 (dd, 1H), 8.43-8.41 (m, 1H), 8.35-8.34 (m, 1H), 8.22-8.21 (m, 1H), 8.17-8.13 (m, 2H), 7.89 (s, 1H), 7.82-7.78 (m, 3H), 7.71-7.61 (m, 6H), 7.54-7.51 (m, 3H), 7.18-7.14 (m, 1H), 6.81 (dd, 1H), 1.90 (s, 6H) | 588.34 | 587.23 |
| 51 | δ = 9.23-9.22 (m, 1H), 8.81-8.78 (m, 5H), 8.20-8.19 (m, 1H), 8.13 (d 1H), 7.89 (d, 1H), 7.64-7.58 (m, 9H), 7.42-7.39 (m, 2H), 1.94 (s, 6H) | 551.23 | 550.21 |
| 53 | δ = 8.80-8.78(m, 4H), 8.50-8.45 (m, 2H), 7.99-7.97 (m, 1H), 7.81 (s, 2H), 7.71 (s, 2H), 7.64-7.63 (m, 1H), 7.55-7.50 (m, 5H), 7.07-7.00 (m, 2H), 6.69-6.65 (m, 1H), 1.83 (s, 6H) | 561.21 | 560.20 |
| 55 | δ = 8.51-8.50(m, 1H), 8.16-8.14 (m, 1H), 7.72-7.61 (m, 5H), 7.49-7.48 (m, 1H), 7.42-7.29 (m, 12H), 7.07-7.01 (m, 2H), 6.69-6.64 (m, 1H), 1.85 (s, 6H) | 626.34 | 625.23 |
| 56 | δ = 9.20 (dd, 1H), 9.05-9.03 (m, 1H), 8.96-8.95 (m, 1H), 8.82-8.21 (m, 1H), 8.67-8.64 (m, 2H), 8.27-8.16 (m, 3H), 8.14-8.03 (m, 4H), 7.98 (dd, 2H), 7.88-7.86 (m, 1H), 7.75 (td, 2H), 7.59 (dd, 1H), 7.43-7.41 (m, 1H), 1.94 (s, 6H) | 551.20 | 550.21 |
| 57 | δ = 9.18 (dd, 1H), 8.96-8.95 (m, 1H), 8.46-8.44 (m, 1H), 8.27-8.18 (m, 3H), 7.96-7.90 (m, 2H), 7.86-7.75 (m, 3H), 7.72-7.66 (m, 7H), 7.60-7.55 (m, 2H), 7.49-7.39 (m, 6H), 1.90 (s, 6H) | 625.29 | 624.25 |
| 58 | δ = 9.18 (dd, 1H), 8.96-8.95 (m, 1H), 8.27-8.25 (m, 2H), 8.21-8.16 (m, 2H), 8.11-8.08 (m, 2H), 7.99-7.90 (m, 3H), 7.81-7.76 (m, 4H), 7.71 (d, 1H), 7.65-7.64 (m, 1H), 7.58 (dd, 1H), 7.46-7.35 (m, 2H), 1.92 (s, 6H) | 579.19 | 578.18 |
| 60 | δ = 9.18 (dd, 1H), 8.96-8.95 (m, 1H), 8.32-8.25 (m, 3H), 8.21-8.18 (m, 3H), 8.04-8.01 (m, 3H), 7.96-7.94 (m, 1H), 7.92-7.87 (m, 2H), 7.81-7.68 (m, 5H), 7.59 (dd, 1H), 7.53-7.51 (m, 1H), 7.45-7.33 (m, 2H), 1.89 (s, 6H) | 606.30 | 605.19 |
| 61 | δ = 9.18 (dd, 1H), 8.96-8.95 (m, 1H), 8.27-8.24 (m, 6H), 7.96-7.94 (m, 1H), 7.91-7.87 (m, 3H), 7.81-7.78 (m, 1H), 7.72-7.68 (m, 3H), 7.59 (dd, 1H), 7.53-7.51 (m, 1H), 7.45-7.41 (m, 2H), 7.29-7.23 (m, 1H), 1.90 (s, 6H) | 590.32 | 589.21 |

TABLE 1-continued

| Compound | $^1$H NMR (CDCl$_3$, 400 MHz) | MS/FAB found | MS/FAB calc. |
|---|---|---|---|
| 63 | δ = 8.22-8.18 (m, 2H), 8.08-8.05 (m, 2H), 7.80-7.78 (m, 2H), 7.70-7.63 (m, 8H), 7.58-7.55 (m, 2H), 7.53-7.35 (m, 8H), 7.32-7.28 (m, 2H), 7.25-7.21 (m, 2H), 1.83 (s, 6H) | 687.35 | 686.27 |
| 65 | δ = 8.80-8.78 (m, 1H), 8.72-8.70 (m, 1H), 8.50-8.48 (m, 1H), 8.43-8.41 (m, 1H), 8.22-8.21 (m, 1H), 8.17-8.13 (m, 4H), 7.98-7.97 (m, 1H), 7.90-7.78 (m, 3H), 7.83-7.68 (m, 7H), 7.53-7.51 (m, 1H), 7.30-7.27 (m, 1H), 6.82-6.79 (m, 1H), 1.90 (s, 6H) | 612.33 | 611.23 |
| 67 | δ = 8.85-8.83 (m, 1H), 8.71-8.69 (m, 1H), 8.23-8.20 (m, 2H), 8.15-8.11 (m, 3H), 7.95-7.90 (m, 4H), 7.80 (d, 1H), 7.72-7.66 (m, 3H), 7.59-7.52 (m, 3H), 7.45-7.42 (m, 2H), 7.31-7.18 (m, 4H), 6.94 (d, 1H), 6.69 (dd, 2H) | 638.23 | 637.21 |
| 69 | δ = 8.85-8.83 (m, 1H), 8.71-8.69 (m, 1H), 8.10-8.05 (m, 3H), 7.94 (dd, 2H), 7.81-7.79 (m, 2H), 7.75-7.64 (m, 4H), 7.57-7.53 (m, 2H), 7.45-7.18 (m, 13H), 7.06-7.04 (m, 1H), 6.68 (dd, 2H) | 686.31 | 685.25 |
| 72 | δ = 8.16-8.14 (m, 2H), 8.08-8.05 (m, 2H), 7.79 (dd, 1H), 7.69-7.61 (m, 7H), 7.58-7.55 (m, 4H), 7.50-7.35 (m, 6H), 7.33-7.16 (m, 7H), 3.89 (dd, 2H), 0.78 (t, 3H) | 639.38 | 638.27 |
| 73 | δ = 8.80-8.76 (m, 4H), 8.53-8.51 (m, 1H), 8.34-8.33 (m, 1H), 8.05-8.04 (m, 1H), 7.99 (t, 1H), 7.81-7.79 (m, 2H), 7.71-7.60 (m, 4H), 7.54-7.41 (m, 8H), 7.33-7.31 (m, 2H), 7.06 (dd, 1H), 6.90 (dt, 1H), 2.05 (t, 3H), | 588.35 | 587.23 |

Example 1

To manufacture an anode, a corning 15 Ω/cm$^2$ (1200 Å) ITO glass substrate was cut to a size of 50 mm×50 mm×0.7 mm and then sonicated in isopropyl alcohol and pure water each for five minutes, and then cleaned by irradiation of ultraviolet rays for 30 minutes and exposure to ozone. The resulting glass substrate was loaded into a vacuum deposition device.

Then, 2-TNATA, which is a HIL material, was vacuum-deposited on the glass substrate to form a HIL having a thickness of about 600 Å. Then, 4,4'-bis[N-(1-naphthyl)-N-phenylamino]biphenyl (NPB), which is a hole transporting compound, was vacuum-deposited on the HIL to form a HTL having a thickness of about 300 Å.

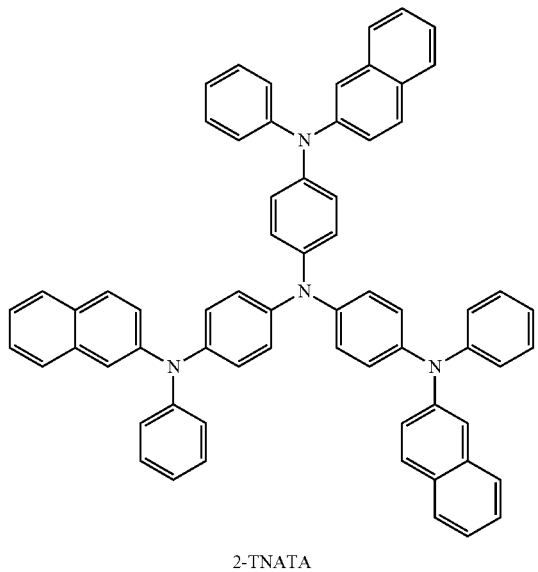

2-TNATA

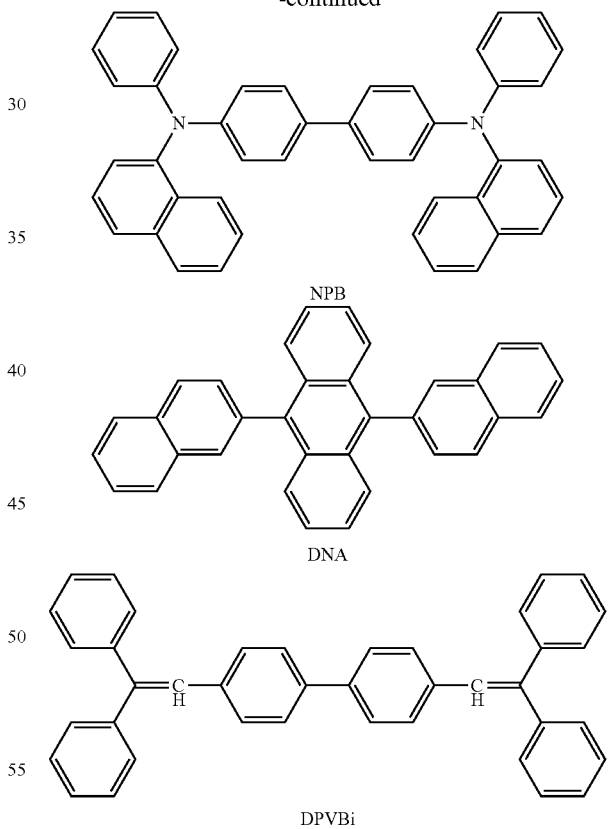

NPB

DNA

DPVBi

A blue fluorescent host 9,10-di-naphthalene-2-yl-anthracene (DNA) and a blue fluorescent dopant 1,4-bis-(2,2-diphenylvinyl)biphenyl (DPVBi), which are both widely known compounds, were co-deposited on the HTL in a weight ratio of 98:2 to form an EML having a thickness of 300 Å.

Then, Compound 5 was deposited on the EML to form an ETL having a thickness of 300 Å, and then LiF, which is a halogenated alkali metal, was deposited on the ETL to form an EIL having a thickness of 10 Å. Then, Al was vacuum-deposited on the EIL to form a cathode having a thickness of 3000 Å, thereby forming an LiF/Al electrode and completing the manufacture of an organic light-emitting device.

The organic light-emitting device had a driving voltage of about 5.25V at a current density of 50 mA/cm², a luminosity of 2,050 cd/m², a luminescent efficiency of 4.10 cd/A, and a half life-span (hr @100 mA/cm²) of about 291 hours.

Example 2

An organic light-emitting device was manufactured in the same manner as in Example 1, except that Compound 14 instead of Compound 5 was used to form the ETL.

The organic light-emitting device had a driving voltage of about 5.31V at a current density of 50 mA/cm², a luminosity of 2,355 cd/m², a luminescent efficiency of 4.71 cd/A, and a half life-span (hr @100 mA/cm²) of about 257 hours.

Example 3

An organic light-emitting device was manufactured in the same manner as in Example 1, except that Compound 32 instead of Compound 5 was used to form the ETL.

The organic light-emitting device had a driving voltage of about 5.42V at a current density of 50 mA/cm², a luminosity of 2,240 cd/m², a luminescent efficiency of 4.48 cd/A, and a half life-span (hr @100 mA/cm²) of about 245 hours.

Example 4

An organic light-emitting device was manufactured in the same manner as in Example 1, except that Compound 45 instead of Compound 5 was used to form the ETL.

The organic light-emitting device had a driving voltage of about 5.20V at a current density of 50 mA/cm², a luminosity of 2,258 cd/m², a luminescent efficiency of 4.51 cd/A, and a half life-span (hr @100 mA/cm²) of about 283 hours.

Example 5

An organic light-emitting device was manufactured in the same manner as in Example 1, except that Compound 55 instead of Compound 5 was used to form the ETL.

The organic light-emitting device had a driving voltage of about 5.49V at a current density of 50 mA/cm², a luminosity of 2,140 cd/m², a luminescent efficiency of 4.28 cd/A, and a half life-span (hr @100 mA/cm²) of about 203 hours.

Example 6

An organic light-emitting device was manufactured in the same manner as in Example 1, except that Compound 60 instead of Compound 5 was used to form the ETL.

The organic light-emitting device had a driving voltage of about 5.44V at a current density of 50 mA/cm², a luminosity of 2,211 cd/m², a luminescent efficiency of 4.42 cd/A, and a half life-span (hr @100 mA/cm²) of about 234 hours.

Comparative Example 1

An organic light-emitting device was manufactured in the same manner as in Example 1, except that widely known Alq₃ instead of Compound 5 was used to form the ETL.

The organic light-emitting device had a driving voltage of about 7.85V at a current density of 50 mA/cm², a luminosity of 1,560 cd/m², a luminescent efficiency of 3.12 cd/A, and a half life-span (hr @ 100 mA/cm²) of about 113 hours.

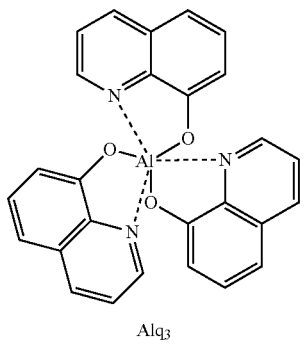

Alq₃

An organic light-emitting device was manufactured in the same manner as in Example 1, except that Compound 55, which is a widely known material, instead of Compound 5 was used to form the ETL.

The organic light-emitting device had a driving voltage of about 6.05V at a current density of 50 mA/cm², a luminosity of 1,960 cd/m², a luminescent efficiency of 3.92 cd/A, and a half life-span (hr @100 mA/cm²) of about 201 hours.

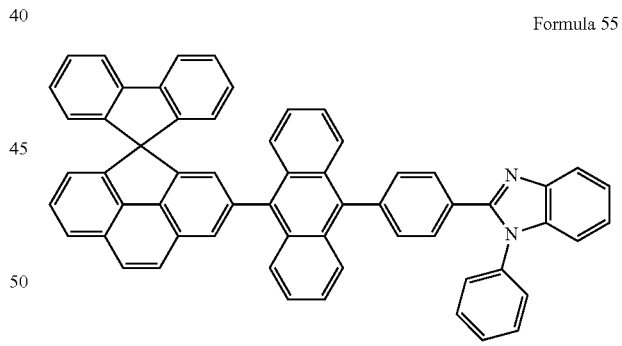

Formula 55

The characteristics ad lifetimes of the organic light-emitting devices of Examples 1 to 6 and Comparative Examples 1 and 2 are shown in Table 2 below.

TABLE 2

|  | ETL material | Driving voltage (V) | Current density (mA/cm²) | Luminance (cd/m²) | Efficiency (cd/A) | Emission color | Half-life span (hr @100 mA/cm²) |
|---|---|---|---|---|---|---|---|
| Example 1 | Compound 5 | 5.25 | 50 | 2,050 | 4.10 | Blue | 291 hr |
| Example 2 | Compound 14 | 5.31 | 50 | 2,355 | 4.71 | Blue | 257 hr |
| Example 3 | Compound 32 | 5.42 | 50 | 2,240 | 4.48 | Blue | 245 hr |
| Example 4 | Compound 45 | 5.20 | 50 | 2,258 | 4.51 | Blue | 283 hr |

TABLE 2-continued

| | ETL material | Driving voltage (V) | Current density (mA/cm$^2$) | Luminance (cd/m$^2$) | Efficiency (cd/A) | Emission color | Half-life span (hr @100 mA/cm$^2$) |
|---|---|---|---|---|---|---|---|
| Example 5 | Compound 55 | 5.49 | 50 | 2,140 | 4.28 | Blue | 203 hr |
| Example 6 | Compound 60 | 5.44 | 50 | 2,211 | 4.42 | Blue | 234 hr |
| Comparative Example 1 | Alq$_3$ | 7.85 | 50 | 1,560 | 3.12 | Blue | 113 hr |
| Comparative Example 2 | Formula 55 | 6.05 | 50 | 1,960 | 3.92 | Blue | 201 hr |

The organic light-emitting devices including the compounds of Formula 1 as ETL materials had a driving voltage that was lower by 1V or greater than the devices manufactured using Alq$_3$, or the compound of Formula 55 and thus had higher efficiency and good I-V-L characteristics. In particular, lifetime characteristics were markedly improved by 100% or greater in the organic light-emitting devices of Examples 1 to 6, as compared with the organic light-emitting devices of Comparative Examples 1 and 2.

As described above, according to the one or more of the above embodiments, a novel compound represented by Formula 1 above may have improved electrical characteristics and improved charge transporting capability, and thus may be used as a hole injecting material or hole transporting material suitable for fluorescent or phosphorescent devices emitting light in any color of red, green, blue, and white. Therefore, an organic light-emitting device having high efficiency, low driving voltages, high luminance, and long lifetime may be manufactured using the compound of Formula 1 above.

It should be understood that the example embodiments described therein should be considered in a descriptive sense only and not for purposes of limitation. Descriptions of features or aspects within each embodiment should typically be considered as available for other similar features or aspects in other embodiments.

What is claimed is:

1. A compound with electron injection and/or electron transport capabilities, the compound being corresponding to Formula 1 below:

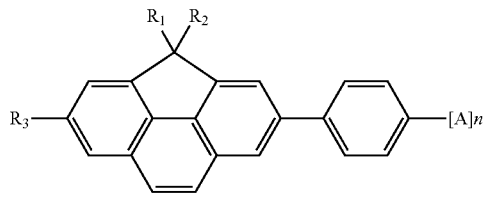

Formula 1 wherein, in Formula 1, R$_1$ and R$_2$ are each independently a halogen group, a cyano group, a C$_1$-C$_{60}$ alkyl group, C$_6$-C$_{60}$ aryl group, or a C$_3$-C$_{60}$ heteroaryl group,
wherein at least one of R$_1$ or R$_2$ in Formula 1 is a methyl group, a phenyl group, or a pyridyl group;
R$_3$ is a C$_6$-C$_{60}$ aryl group, or a C$_3$-C$_{60}$ heteroaryl group;
A is a C$_3$-C$_{60}$ heteroaryl group, or a C$_6$-C$_{60}$ condensed polycyclic group comprising an element selected from the group consisting of N, O, and S; and
n is an integer from 1 to 7.

2. The compound of claim 1, wherein R$_1$ and R$_2$ in Formula 1 are linked to form a spiro-type group.

3. The compound of claim 1, wherein R$_1$ and R$_2$ in Formula 1 are each independently a methyl group, a phenyl group, or a pyridyl group.

4. The compound of claim 1, wherein R$_3$ in Formula 1 is one of the groups corresponding to Formulae 2a to 2f below:

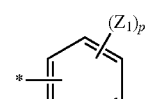

2a

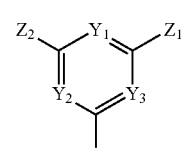

2b

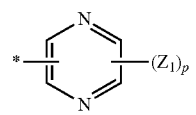

2c

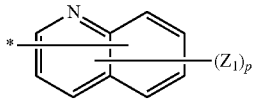

2d

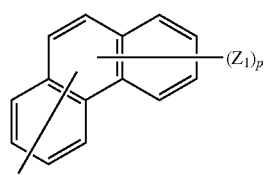

2e

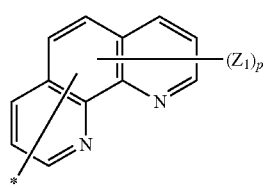

2f wherein, in Formulae 2a to 2f,
Y$_1$, Y$_2$, and Y$_3$ are each independently a linker corresponding to —N= or —C(R$_{20}$)=;
Z$_1$, Z$_2$, and R$_{20}$ are each independently a hydrogen atom, a deuterium atom, a substituted or unsubstituted C$_1$-C$_{20}$ alkyl group, a substituted or unsubstituted C$_6$-C$_{20}$ aryl group, a substituted or unsubstituted C$_3$-C$_{20}$ heteroaryl group, a substituted or unsubstituted C$_6$-C$_{20}$ condensed polycyclic group, a halogen group, a cyano group, a nitro group, a hydroxy group, or a carboxy group;

p is an integer from 1 to 9; and

* indicates a binding site.

5. The compound of claim 1, wherein A in Formula 1 is one of the groups corresponding to Formulae 3a to 3l:

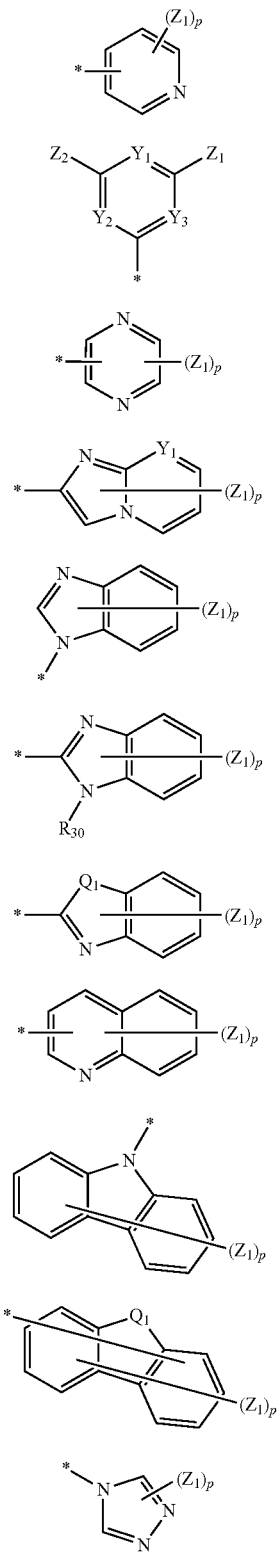

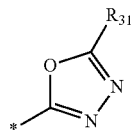

wherein, in Formulae 3a to 3l, $Y_1$, $Y_2$, and $Y_3$ are each independently a linker corresponding to —N= or —C($R_{20}$)=, $Z_1$, $Z_2$, $R_{20}$, $R_{30}$, and $R_{31}$ are each independently, a hydrogen atom, a deuterium atom, a substituted or unsubstituted $C_1$-$C_{20}$ alkyl group, a substituted or unsubstituted $C_6$-$C_{20}$ aryl group, a substituted or unsubstituted $C_3$-$C_{20}$ heteroaryl group, a substituted or unsubstituted $C_6$-$C_{20}$ condensed polycyclic group, a halogen group, a cyano group, a nitro group, a hydroxy group, or a carboxy group;

$Q_1$ is S or O;

p is an integer from 1 to 7; and

* indicates a binding site.

6. A compound corresponding to one of the following formulae:

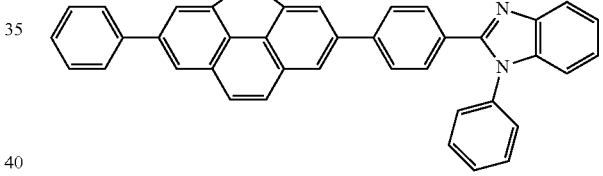

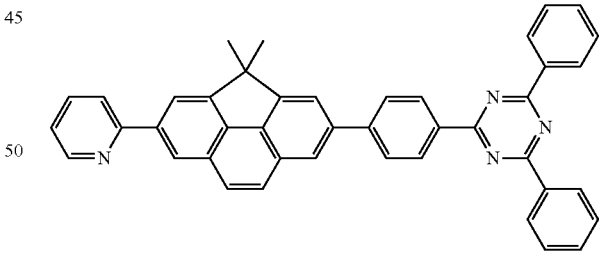

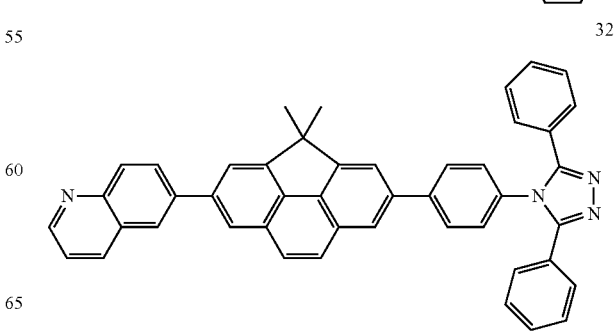

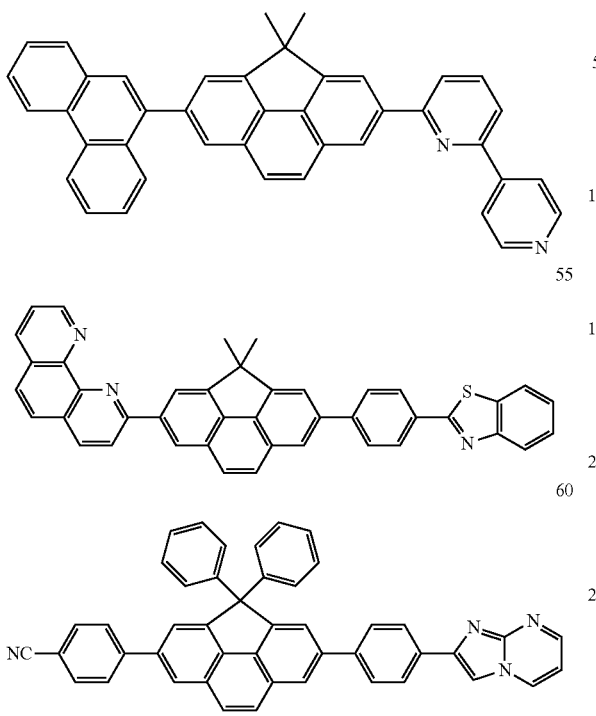

7. An organic light-emitting device comprising:
a first electrode;
a second electrode; and
an organic layer disposed between the first electrode and the second electrode, the organic layer comprising the compound of claim 1.

8. The organic light-emitting device of claim 7, wherein the organic layer comprises an electron injection layer, an electron transport layer, or a functional layer having both electron injection and electron transport capabilities.

9. The organic light-emitting device of claim 7, wherein the organic layer is an electron transport layer (ETL).

10. The organic light-emitting device of claim 7, wherein the organic layer comprises an emission layer, an electron injection layer, an electron transport layer, or a functional layer having both electron injection and electron transport capabilities;
at least one of the electron injection layer, the electron transport layer, and the functional layer having both electron injection and electron transport capabilities comprises the compound having the electron injection and/or electron transport capabilities corresponding to Formula 1 below:

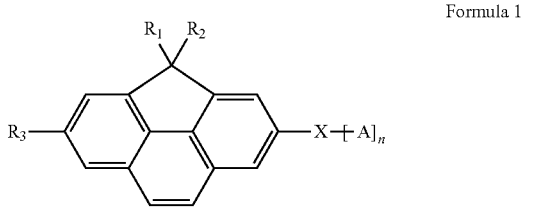

Formula 1 wherein, in Formula 1, $R_1$ and $R_2$ are each independently a halogen group, a cyano group, a substituted or unsubstituted $C_1$-$C_{60}$ alkyl group, a substituted or unsubstituted $C_6$-$C_{60}$ aryl group, or a substituted or unsubstituted $C_3$-$C_{60}$ heteroaryl group;
$R_3$ is a substituted or unsubstituted $C_6$-$C_{60}$ aryl group, or a substituted or unsubstituted $C_3$-$C_{60}$ heteroaryl group;
X is a single bond or a substituted or unsubstituted $C_3$-$C_{10}$ arylene group; and
A is a substituted or unsubstituted $C_3$-$C_{60}$ heteroaryl group, or a substituted or unsubstituted $C_6$-$C_{60}$ condensed polycyclic group including N, O, or S; and
n is an integer from 1 to 7, and
the emission layer comprises an anthracene-based compound, an arylamine-based compound, or a styryl-based compound.

11. The organic light-emitting device of claim 7, wherein the organic layer comprises an emission layer, a hole injection layer, a hole transport layer, or a functional layer having both hole injection and hole transport capabilities, and
the emission layer comprises red, green, blue, and white emission layers one of which comprises a phosphorescent compound.

12. The organic light-emitting device of claim 11, wherein at least one of the hole injection layer, the hole transport layer, and the functional layer having both hole injection and hole transport capabilities comprises a charge-generating material.

13. The organic light-emitting device of claim 12, wherein the charge-generating material is a p-type dopant.

14. The organic light-emitting device of claim 13, wherein the p-dopant is a quinone derivative, a metal oxide, or a cyano group-containing compound.

15. The organic light-emitting device of claim 7, wherein the organic layer further comprises an electron transport layer, and the electron transport layer comprises an electron transporting organic compound and a metal complex.

16. The organic light-emitting device of claim 15, wherein the metal complex is a lithium (Li) complex.

17. The organic light-emitting device of claim 15, wherein the metal complex is lithium quinolate (LiQ), or Compound 203 below:

Compound 203

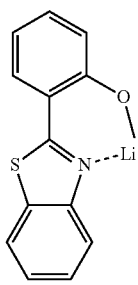

18. The organic light-emitting device of claim 7, wherein the organic layer is formed from the compound having the electron injection and/or electron transport capabilities of claim 1 by a wet process.

19. A flat panel display device comprising the organic light-emitting device of claim 7, wherein the first electrode of the organic light-emitting device is electrically connected to a source electrode or a drain electrode of a thin-film transistor.

20. The compound of claim 1, wherein, in Formula 1:
A is one of the groups corresponding to Formulae 3a, 3b, 3b', 3h and 3j:

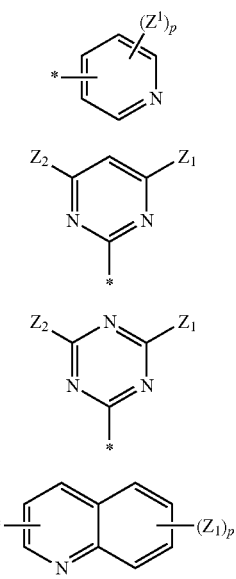
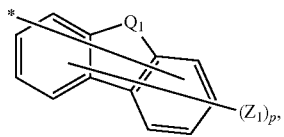

wherein, in Formulae 3a, 3b, 3b, 3h and 3j:

$Z_1$ and $Z_2$ are each independently a hydrogen atom, a deuterium atom, a substituted or unsubstituted $C_1$-$C_{20}$ alkyl group, a substituted or unsubstituted $C_6$-$C_{20}$ aryl group, a substituted or unsubstituted $C_3$-$C_{20}$ heteroaryl group, a substituted or unsubstituted $C_6$-$C_{20}$ condensed polycyclic group, a halogen group, a cyano group, a nitro group, a hydroxy group, or a carboxy group;

$Q_1$ is S or O;

p is an integer from 1 to 7; and

* is a binding site.

\* \* \* \* \*